(12) United States Patent
Iwato et al.

(10) Patent No.: US 7,687,219 B2
(45) Date of Patent: *Mar. 30, 2010

(54) POSITIVE RESIST COMPOSITION AND PATTERN FORMATION METHOD USING THE POSITIVE RESIST COMPOSITION

(75) Inventors: Kaoru Iwato, Shizuoka (JP); Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,085

(22) Filed: Nov. 8, 2006

(65) Prior Publication Data

US 2007/0105045 A1 May 10, 2007

(30) Foreign Application Priority Data

Nov. 8, 2005 (JP) ............................. P2005-323470

(51) Int. Cl.
- G03F 7/039 (2006.01)
- G03F 7/20 (2006.01)
- G03F 7/30 (2006.01)

(52) U.S. Cl. .................. 430/270.1; 430/326; 430/905; 430/910

(58) Field of Classification Search ................. 430/171, 430/270.1

See application file for complete search history.

(56) References Cited

U.S. PATENT DOCUMENTS

| 2003/0108809 A1* | 6/2003 | Sato ........................... 430/171 |
| 2003/0224291 A1* | 12/2003 | Hatakeyama et al. .... 430/270.1 |
| 2004/0191676 A1* | 9/2004 | Nakao et al. ............. 430/270.1 |
| 2006/0216635 A1* | 9/2006 | Hirano et al. ............ 430/270.1 |

FOREIGN PATENT DOCUMENTS

| EP | 1 515 186 A2 | 3/2005 |
| EP | 1 701 214 A1 | 9/2006 |
| JP | 2004-53822 A | 2/2004 |
| JP | 2005-48128 | * 2/2005 |
| JP | 2005048128 A | * 2/2005 |
| WO | WO 2004/067592 A1 | 8/2004 |

OTHER PUBLICATIONS

Extended European Search Report dated Mar. 27, 2007.
Database WPI Week, 200577, Derwent Publications Ltd., GB; AN 2005-752210, XP002424298 & JP 2005 272807, Oct. 6, 2005.

* cited by examiner

Primary Examiner—Sin J. Lee
(74) Attorney, Agent, or Firm—Sughrue Mion, PLLC

(57) ABSTRACT

A positive resist composition comprises: (A) a resin that contains a repeating unit (A1) having a lactone structure and a cyano group, and increases its solubility to an alkali developer by action of an acid; (B) a compound that generates an acid by irradiation with actinic ray or radiation; and (C) a solvent.

12 Claims, 1 Drawing Sheet

POSITIVE RESIST COMPOSITION AND PATTERN FORMATION METHOD USING THE POSITIVE RESIST COMPOSITION

BACKGROUND OF THE INVENTION

1. Field of the Invention

The present invention relates to a positive resist composition that undergoes reaction by irradiation with actinic ray or radiation to change properties, and a pattern formation method using the positive resist composition. More particularly, it relates to a positive resist composition used in production steps of semiconductors such as IC, production of circuit substrates such as a liquid crystal or a thermal head, other photofabrication steps, lithographic printing plates, and acid-curing compositions, and a pattern formation method using the positive resist composition.

2. Description of the Related Art

Chemically amplified resist compositions are a pattern forming material that forms an acid on an exposed area by irradiation with actinic ray such as far ultraviolet ray, or radiation, changing solubility to a developer between the exposed area by actinic ray or radiation and a non-exposed area by a reaction using the acid as a catalyst, and forming a pattern on a substrate.

Where KrF excimer laser is used as an exposure light source, a resin comprising a poly(hydroxystyrene) showing small absorption at 248 nm region as a basic skeleton is mainly used. Therefore, a pattern having high sensitivity and high resolution and being good is formed, and a good system is obtained as compared with the conventional naphthoquinone diazide/novolac resin system.

On the other hand, where light source having further short wavelength, for example, ArF excimer laser (193 nm) is used as an exposure light source, a compound having an aromatic group substantially shows large absorption at 193 nm region, and thus even the above chemically amplified system was not yet sufficient.

For this reason, a resist for ArF excimer laser containing a resin having an alicyclic hydrocarbon structure has been developing.

Various improvements are being made on an acid-decomposable resin that is a main constituent of a chemically amplified resin composition. For example, JP-A-2004-53822 discloses an acid-decomposable resin having a specific methacrylic repeating unit.

However, additionally, it is desired to enable line edge roughness (LER), exposure latitude (EL), PEB temperature dependency and pattern collapse to achieve together in high dimension.

SUMMARY OF THE INVENTION

Accordingly, objects of the present invention are to provide a positive resist composition that enables line edge roughness (LER), exposure latitude (EL), PEB temperature dependency and pattern collapse to achieve together in high dimension, and a pattern formation method using the positive resist composition.

The present invention is as follows.

(1) A positive-resist composition comprising:

(A) a resin that contains a repeating unit (A1) having a lactone structure and a cyano group, and increases its solubility to an alkali developer by action of an acid;

(B) a compound that generates an acid by irradiation with actinic ray or radiation; and (C) a solvent.

(2) The positive resist composition as described in (1) above, wherein the repeating unit (A1) is a repeating unit having a structure represented by the following general formula (A2).

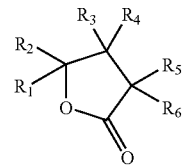

(A2)

In the general formula (A2), $R_1$ to $R_6$ each independently represent a hydrogen atom or a substituent, provided that at least one of $R_1$ to $R_6$ represents a cyano group or a substituent having a cyano group. At least two of $R_1$ to $R_6$ may be bonded with each other to form a ring structure.

(3) The positive resist composition as described in (1) above, wherein the repeating unit (A1) is a repeating unit having a structure represented by the following general formula (A6).

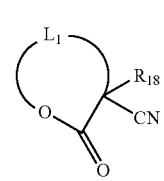

(A6)

In the general formula (A6), $R_{18}$ represents a hydrogen atom or a substituent.

$L_1$ represents a linking group that connects a carbon atom at a 2-position of the lactone ring and an oxygen atom of the lactone ring to form a lactone ring structure.

$R_{18}$ and $L_1$ may be bonded with each other to form a ring structure.

(4) A pattern formation method comprising forming a resist film by the positive resist composition as described in any one of the above (1) to (3), exposing and developing the resist film.

(5) The positive resist composition as described in (1), wherein the resin further comprises an acid decomposable repeating unit having a mono- or polyalicyclic hydrocarbon structure.

(6) The positive resist composition as described in (1), wherein the resin further comprises a repeating unit having an alicyclic hydrocarbon structure substituted with a polar group.

(7) The positive resist composition as described in (1), wherein the solvent is a mixed solvent comprising two or more solvents having different functional groups.

DETAILED DESCRIPTION OF THE INVENTION

Figure 1:
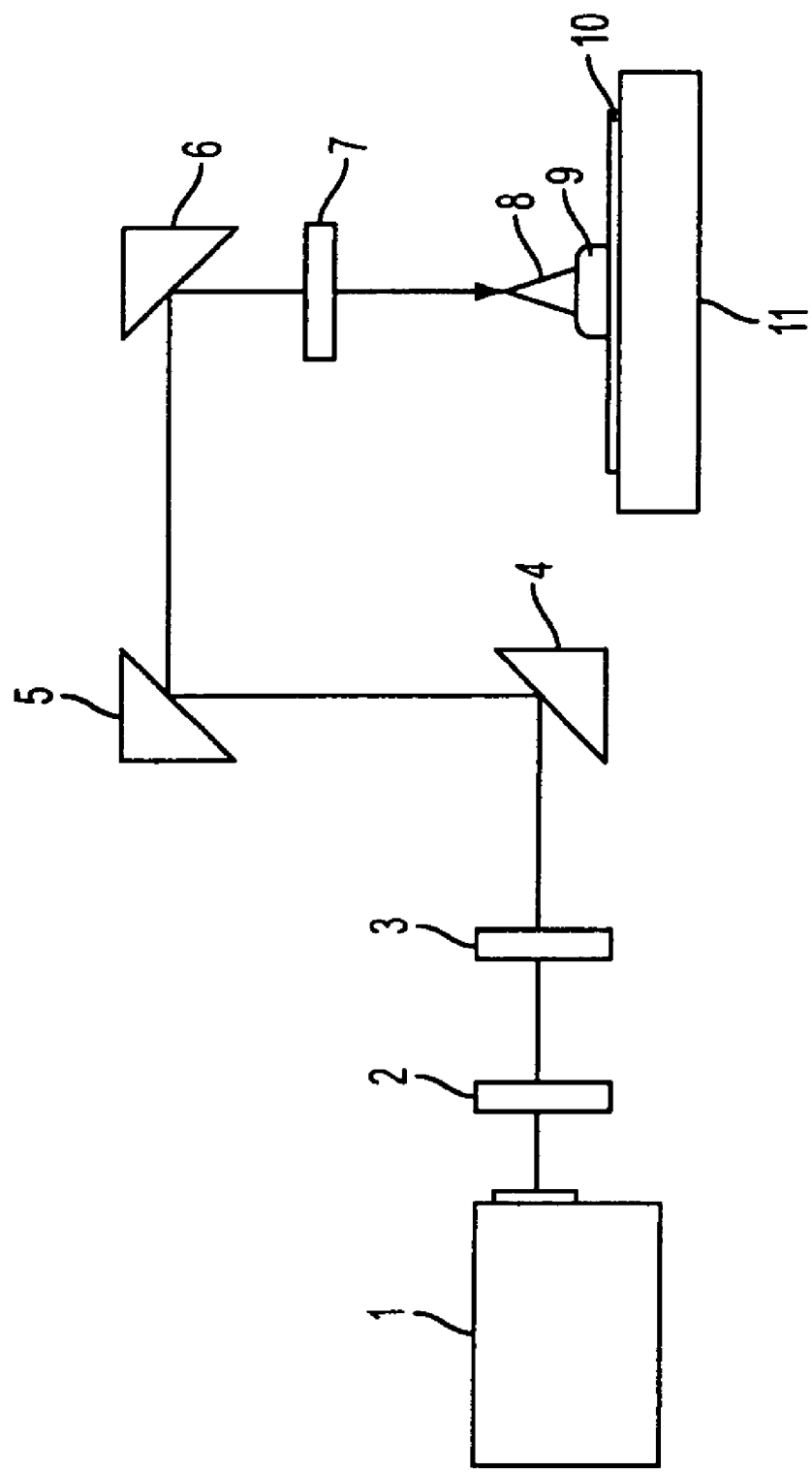
FIG. 1 is a schematic view of a two-beam interference exposure experiment device. 1 denotes a laser; 2 denotes an aperture; 3 denotes a shutter; 4, 5 and 6 denote reflection mirrors; 7 denotes a condensing lens; 8 denotes a prism; 9 denotes an immersion liquid; 10 denotes a wafer having an antireflective film and a resist film; and 11 denotes a wafer stage.

The present invention is described in detail below.

In the notation of a group (an atomic group) in the present specification, the notation that does not express substitution and unsubstitution includes a group not having a substituent and also a group having a substituent. For example, an "alkyl group" includes not only an alkyl group not having a substituent (an unsubstituted alkyl group), but an alkyl group having a substituent (a substituted alkyl group).

[1] (A) A Resin that Contains a Repeating Unit (A1) having a Lactone Structure and a Cyano Group, and Increases Solubility to an Alkali Developer by the Action of an Acid The positive resist composition of the present invention contains a resin that contains a repeating unit (A1) having a lactone structure and a cyano group, and increases solubility to an alkali developer by the action of an acid (hereinafter referred to as an "acid-decomposable resin (A)" or a "resin (A)").

The lactone structure in the repeating unit (A1) can include, for example, 4 to 15-membered ring lactone structures. From the standpoint of polarity and stability, 4 to 8-membered ring lactones are preferable, 5 to 6-membered ring lactones are more preferable, and 5-membered ring lactone is particularly preferable.

Specific examples of the lactone structure are shown below, but the invention is not limited thereto.

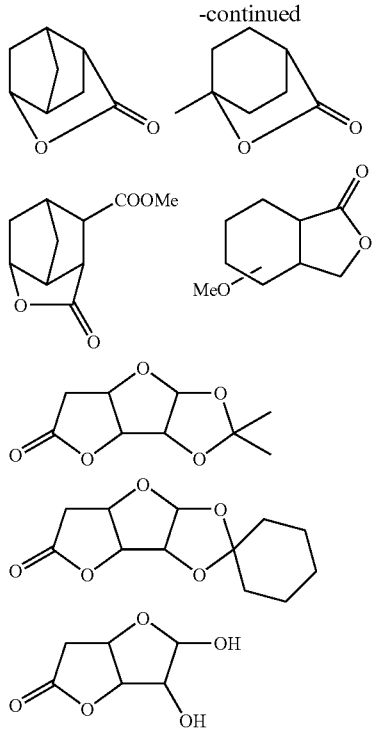

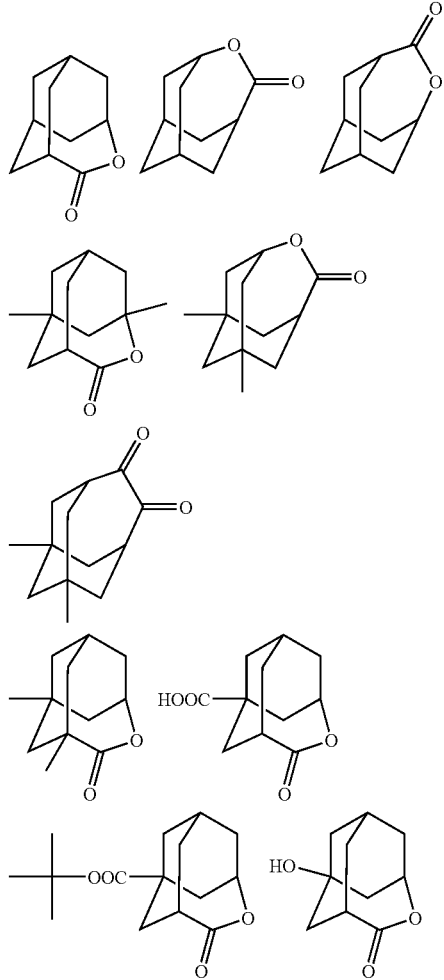

-continued

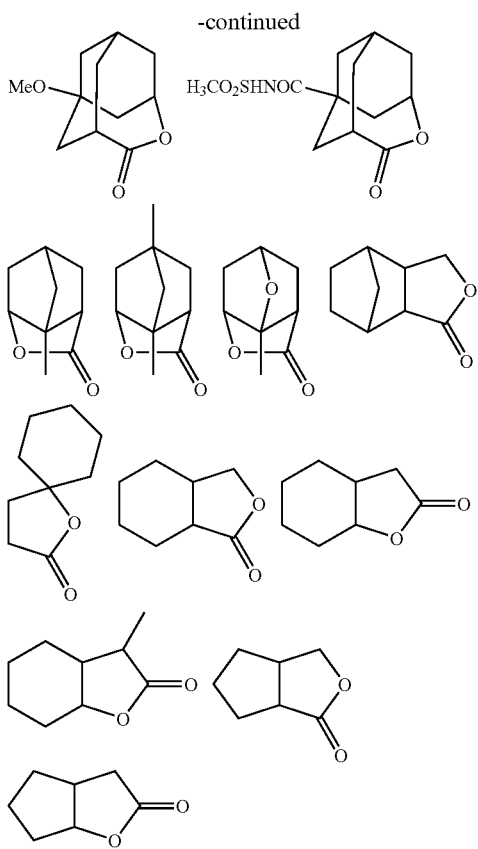

The repeating unit (A1) has preferably from 1 to 4 cyano groups, and more preferably from 1 to 2 cyano groups.

Further, it is preferable that the cyano group is directly connected to the lactone ring.

Suitable embodiment of the repeating unit (A1) can include a repeating unit having a structure represented by the following general formula (A2).

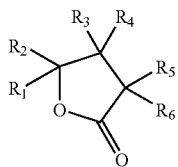
(A2)

In the general formula (A2), $R_1$ to $R_6$ each independently represent a hydrogen atom or a substituent, provided that at least one of $R_1$ to $R_6$ represents a cyano group or a substituent having a cyano group. At least two of $R_1$ to $R_6$ may be bonded with each other to form a ring structure.

The repeating unit having a structure represented by the general formula (A2) may have the structure represented by the general formula (A2) in any of a main chain and a side chain of the repeating unit using at least one of positions that can be a hydrogen atom in $R_1$ to $R_6$ (that is, hydrogen atoms as $R_1$ to $R_6$ and hydrogen atoms in substituents as $R_1$ to $R_6$) as a bond.

The substituent as $R_1$ to $R_6$ is not particularly limited. For example, other than a cyano group, the examples can include an alkyl group, an alkenyl group, an alkyl group, a cycloalkyl group, an aryl group, an amino group, an amide group, an ureido group, an urethane group, a hydroxyl group, a carboxyl group, a halogen atom, an alkoxy group, an aryloxy group, an alkylthio group, an arylthio group, an acyl group, an acyloxy group, an alkoxycarbonyl group and a nitro group. The substituent may further have a substituent. $R_1$ and $R_2$, $R_3$ and $R_4$, and $R_5$ and $R_6$ on the same carbon atom show a bond with the same atom (for example, a carbon atom, an oxygen atom, a sulfur atom and a nitrogen atom), and may form a double bond represented by C=C, C=O, C=S, C=N and the like. Further, optional two of $R_1$ to $R_6$ may bond with the same atom to form a 3-membered ring structure or a crosslinked ring structure.

The substituent having a cyano group as $R_1$ to $R_6$ is not particularly limited, and can include ones having a cyano group as a substituent as described before. Excluding a carbon atom of a cyano group, the carbon atom number is preferably 12 or less, and more preferably 6 or more.

It is particularly preferable that the cyano group is directly bonded to the lactone ring.

Other suitable embodiment of the repeating unit (A1) can include a repeating unit having a structure represented by the following general formula (A3).

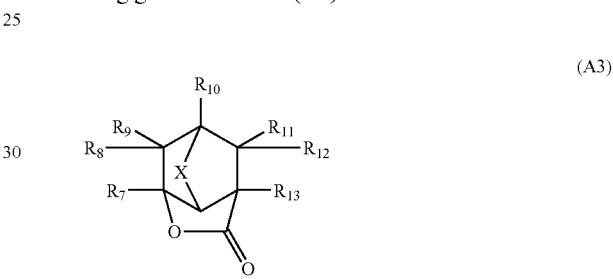
(A3)

In the general formula (A3), $R_7$ to $R_{13}$ each independently represent a hydrogen atom or a substituent. At least two of $R_7$ to $R_{13}$ may be bonded with each other to form a ring structure.

X represents —O—, —S—, —N($R^N$)$_2$— or —(CH$_2$)$_n$—, wherein $R^N$ represents a hydrogen atom or a substituent. n is 1 or 2.

However, at least one of $R_7$ to $R_{13}$ represents a cyano group or a substituent having a cyano group. $R_{13}$ is preferably a cyano group.

The repeating unit having a structure represented by the general formula (A3) may have the structure represented by the general formula (A3) in any of a main chain and a side chain of the repeating unit using at least one of positions that can be a hydrogen atom in $R_7$ to $R_{13}$ and X (that is, hydrogen atoms as $R_7$ to $R_{13}$ and hydrogen atoms in substituents as X) as a bond.

Suitable embodiment of the repeating unit (A2) can include a repeating unit having a structure represented by the following general formula (A4).

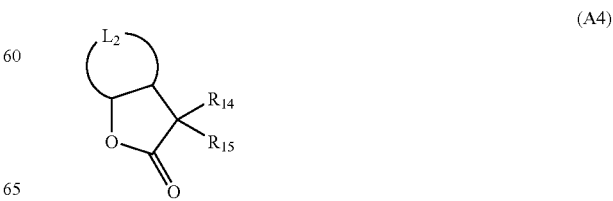
(A4)

In the general formula (A4), $L_{14}$ and $L_{15}$ each independently represent a hydrogen atom or a substituent.

$L_2$ represents a linking group that forms a ring structure.

At least two of $R_{14}$, $R_{15}$ and $L_2$ may be bonded with each other to form a ring structure.

However, at least one of $R_{14}$, $R_{15}$ and $L_2$ represents a cyano group or a substituent having a cyano group.

The repeating unit having a structure represented by the general formula (A4) may have the structure represented by the general formula (A4) in any of a main chain and a side chain of the repeating unit using at least one of positions that can be a hydrogen atom in $R_{14}$ to $R_{15}$ and $L_2$ (that is, hydrogen atoms as $R_{14}$ to $R_{15}$ and hydrogen atoms in substituents as $L_2$) as a bond.

Other suitable embodiment of the repeating unit (A2) can include a repeating unit having a structure represented by the following general formula (A5).

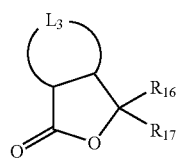

(A5)

In the general formula (A5), $L_{16}$ and $L_{17}$ each independently represent a hydrogen atom or a substituent.

$L_3$ represents a linking group that forms a ring structure.

At least two of $R_{16}$, $R_{17}$ and $L_3$ may be bonded with each other to form a ring structure.

However, at least one of $R_{16}$, $R_{17}$ and $L_3$ represents a cyano group or a substituent having a cyano group.

The repeating unit having a structure represented by the general formula (A5) may have the structure represented by the general formula (A5) in any of a main chain and a side chain of the repeating unit using at least one of positions that can be a hydrogen atom in $R_{16}$ to $R_{17}$ and $L_3$ (that is, hydrogen atoms as $R_{16}$ to $R_{17}$ and hydrogen atoms in substituents as $L_3$) as a bond.

Other suitable embodiment of the repeating unit (A1) can include a repeating unit having a structure represented by the following general formula (A6).

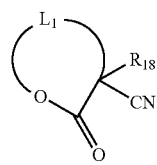

(A6)

In the general formula (A6), $R_{18}$ represents a hydrogen atom or a substituent.

$L_1$ represents a linking group that connects a carbon atom at a 2-position of the lactone ring and an oxygen atom of the lactone ring to form a lactone ring structure;

$R_{18}$ and $L_1$ may be bonded with each other to form a ring structure.

The repeating unit having a structure represented by the general formula (A6) may have the structure represented by the general formula (A6) in any of a main chain and a side chain of the repeating unit using at least one of positions that can be a hydrogen atom in $R_{18}$ and $L_1$ (that is, hydrogen atoms as $R_{18}$ and hydrogen atoms in substituents as $L_1$) as a bond.

Suitable embodiment of the repeating unit (A6) can include a repeating unit having a structure represented by the following general formula (A7).

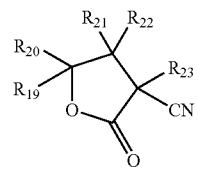

(A7)

In the general formula (A7), $R_{19}$ to $R_{23}$ each independently represent a hydrogen atom or a substituent. At least two of $R_{19}$ to $R_{23}$ may be bonded with each other to form a ring structure.

The repeating unit having a structure represented by the general formula (A7) may have the structure represented by the general formula (A7) in any of a main chain and a side chain of the repeating unit using at least one of positions that can be a hydrogen atom in $R_{19}$ to $R_{23}$ (that is, hydrogen atoms as $R_{19}$ to $R_{23}$ and hydrogen atoms in substituents as $R_{19}$ to $R_{23}$) as a bond.

Examples of the repeating unit having the structure represented by the general formulae (A2) to (A7) can include repeating unit comprising the following repeating unit skeleton having the structure represented by the general formulae (A2) to (A7) bonded to optional positions thereof. That is, optional hydrogen atoms in the following repeating unit are substituted using at least one of positions that can be a hydrogen atom as a bond.

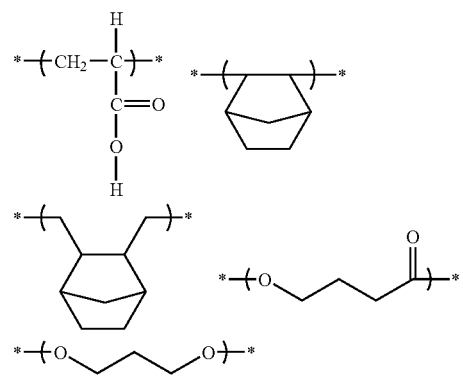

The repeating unit (A1) is preferably a repeating unit derived from an ethylenically double bond, and more preferably a repeating unit derived from a (meth)acrylic acid derivative.

Further suitable embodiment of the repeating unit represented by the general formulae (A2) to (A7) can include a repeating unit having a structure represented by the following general formula (A8).

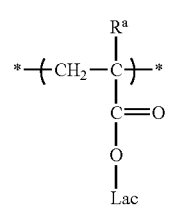

(A8)

In the general formula (A8), $R^a$ represents a hydrogen atom or an alkyl group having from 1 to 4 carbon atoms that may have a substituent.

Lac represents a structure represented by any of the general formulae (A2) to (A7).

The substituent in the general formulae (A3) to (A8) is the same as in the general formula (A2).

The substituent having a cyano group in the general formulae (A3) to (A7) is the same as in the general formula (A2).

The ring structure formed by bonding at least two substituents with each other in the general formulae (A2) to (A7) can include 5 to 6-membered rings. The ring structure may have a substituent such as a cyano group.

The ring structure formed by $L_2$ and $L_3$ in the general formulae (A4) to (A5) can include a norbornane structure. The ring structure may have a substituent such as a cyano group.

The most preferable repeating unit (A1) is a repeating unit represented by (A9).

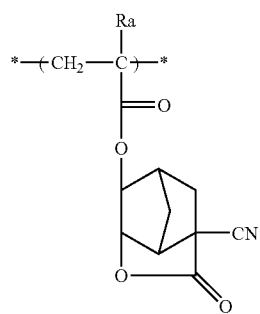

(A9)

Specific examples of the repeating unit (A1) are described below, but the invention is not limited thereto. Methyl group in the specific examples may be a hydrogen atom.

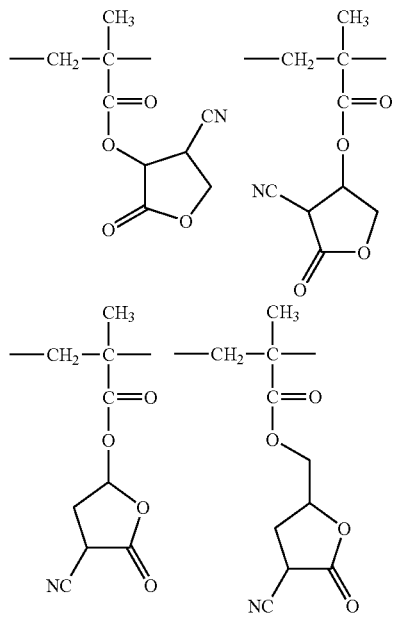

-continued

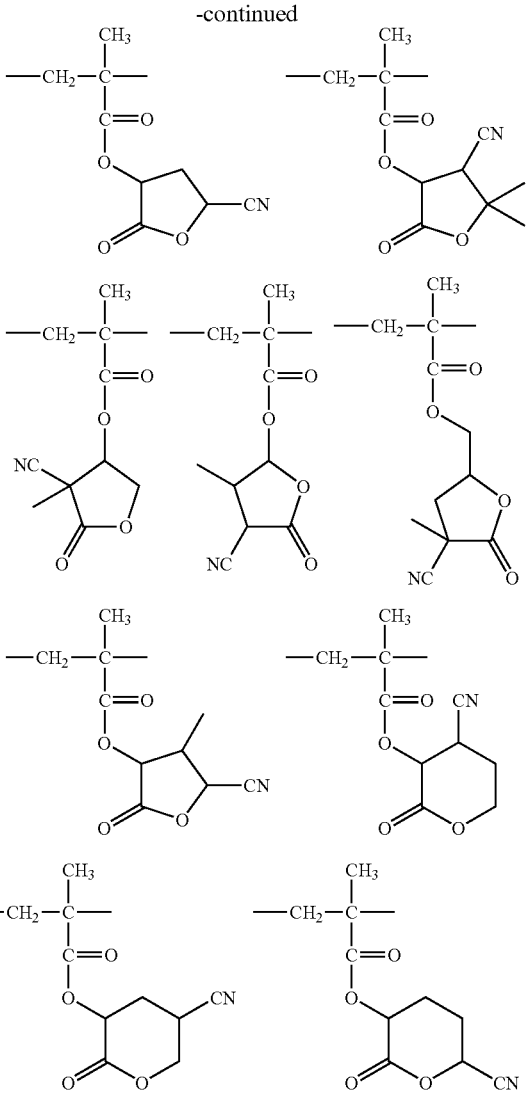

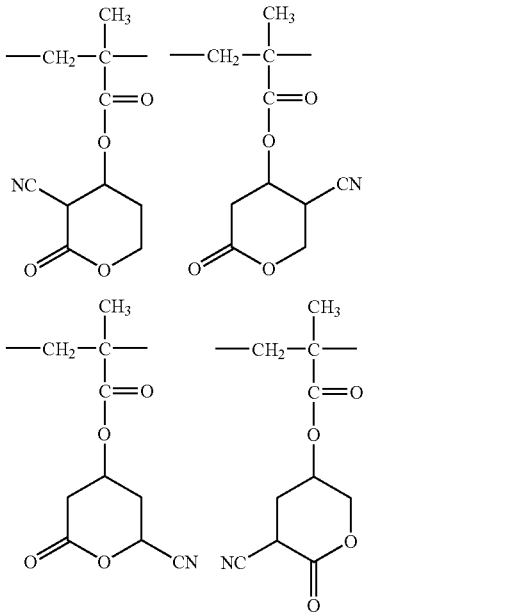

-continued
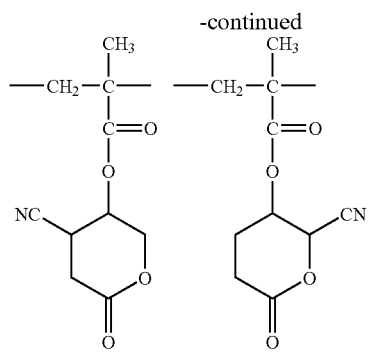
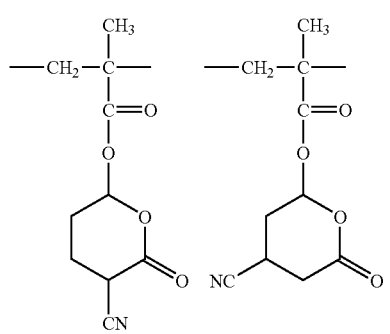
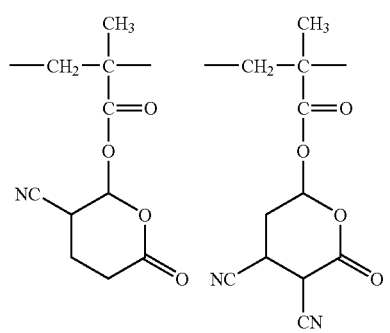
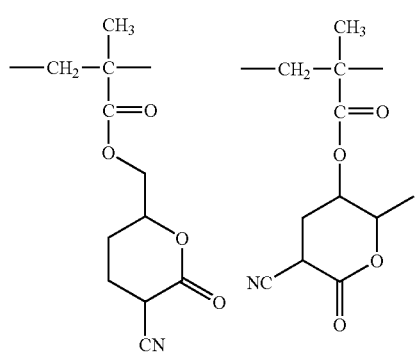
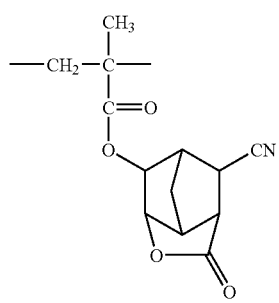
-continued
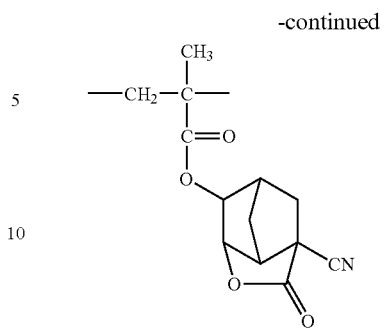
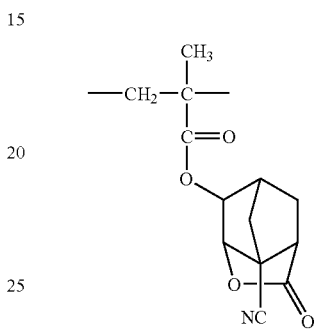
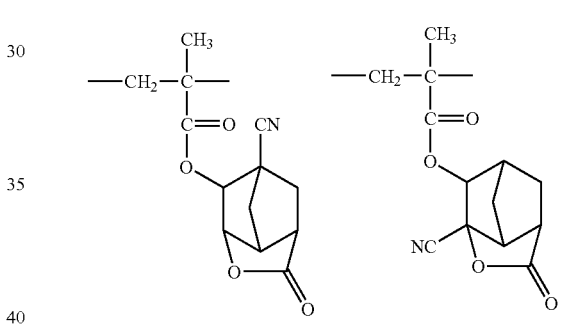
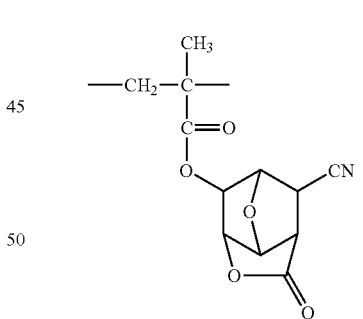

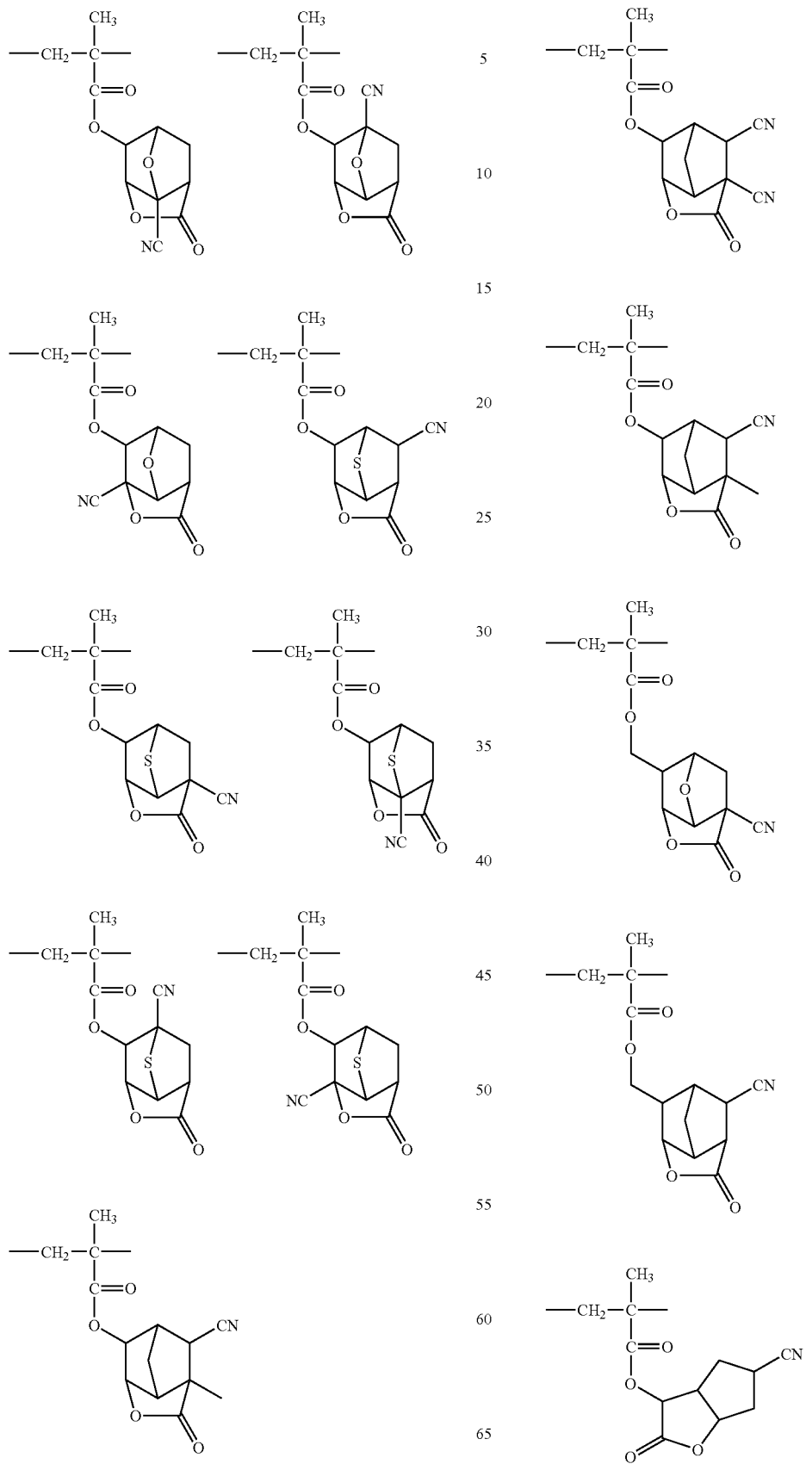

-continued
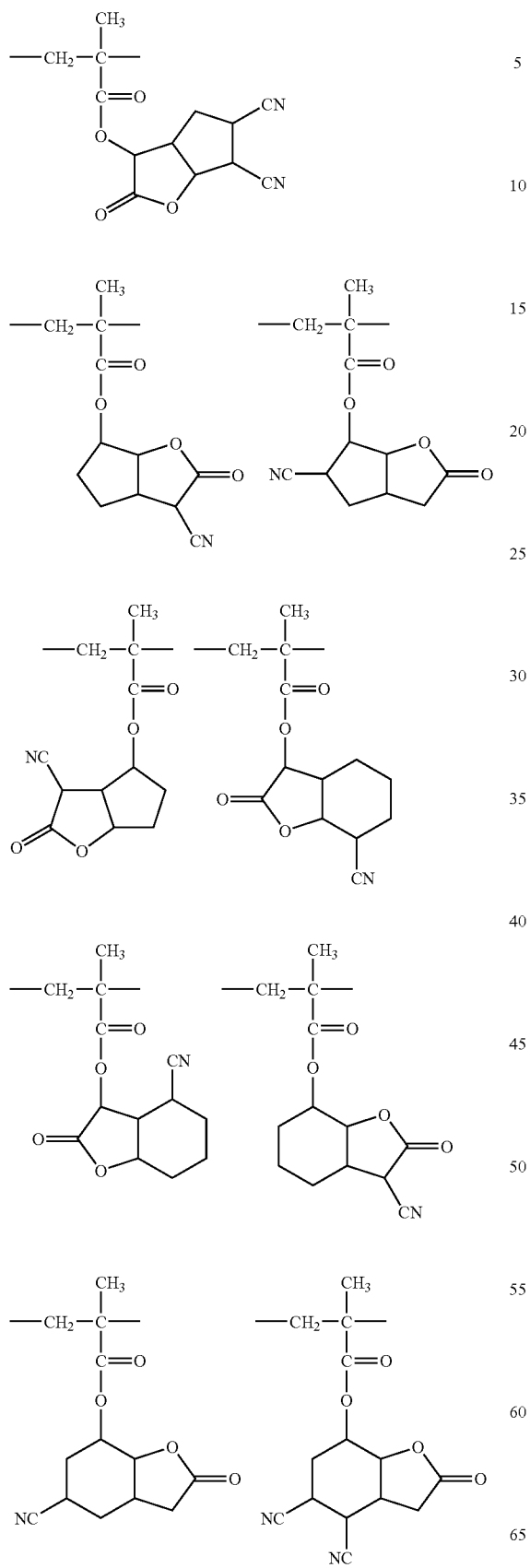
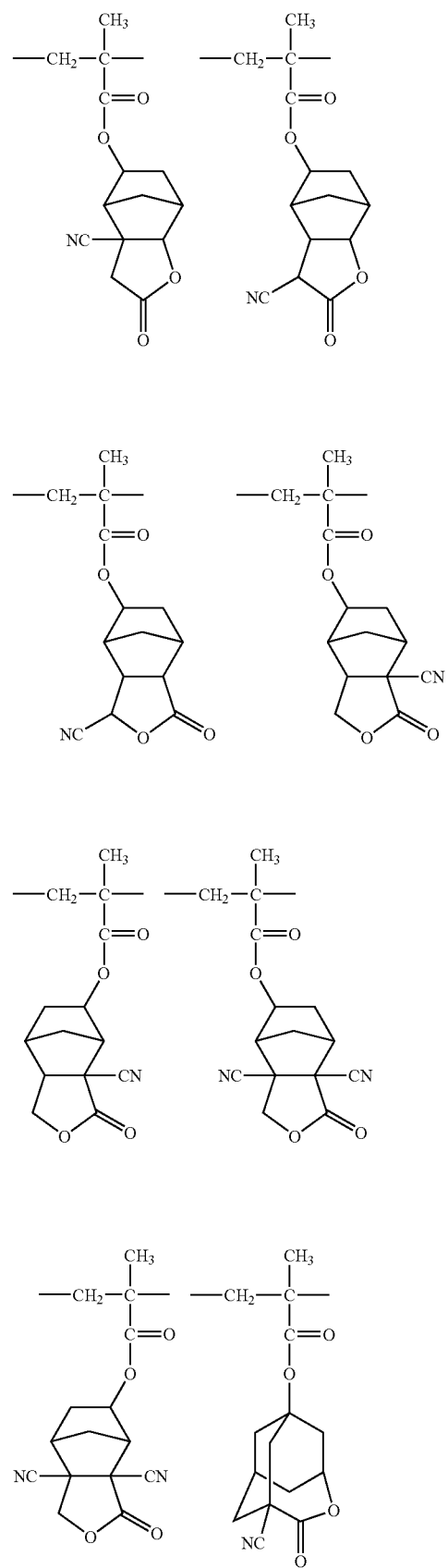

-continued
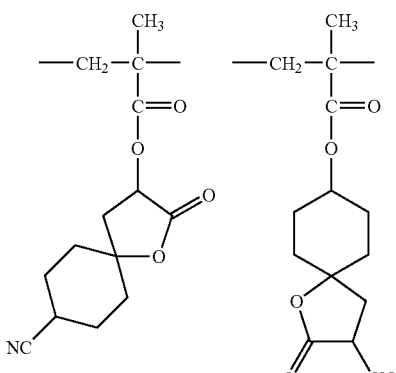
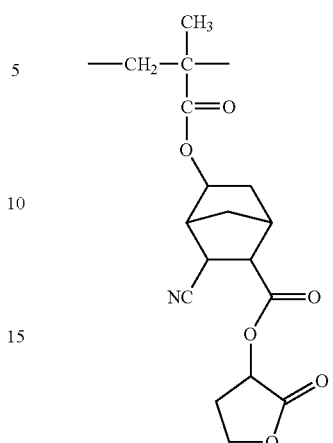
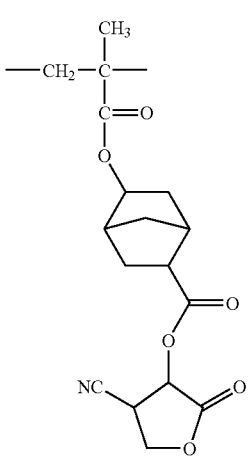
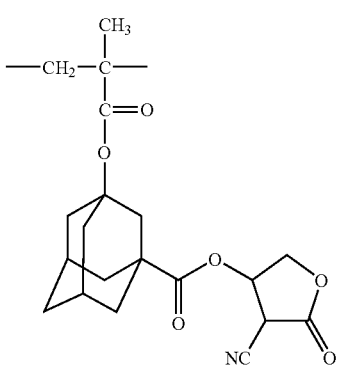
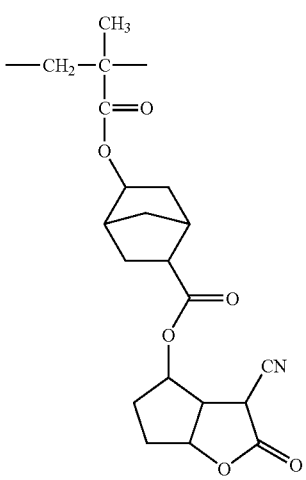
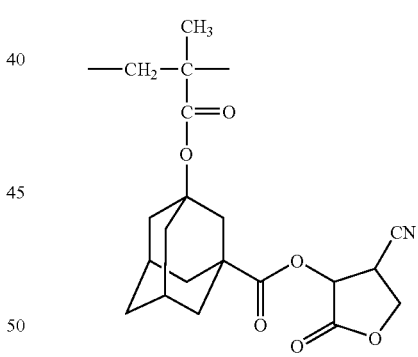
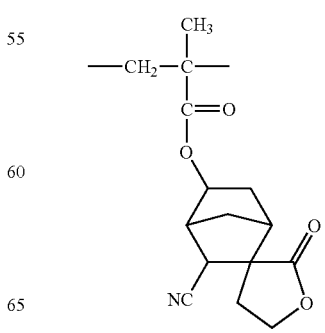
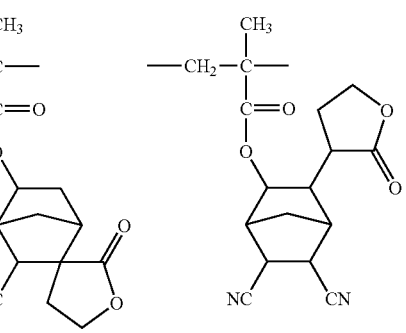

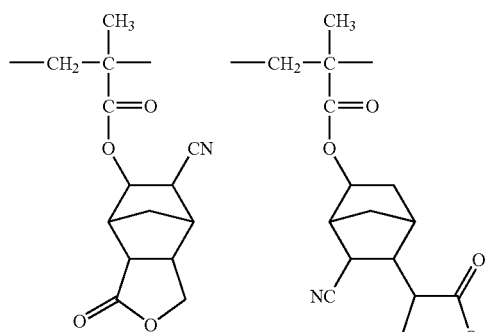

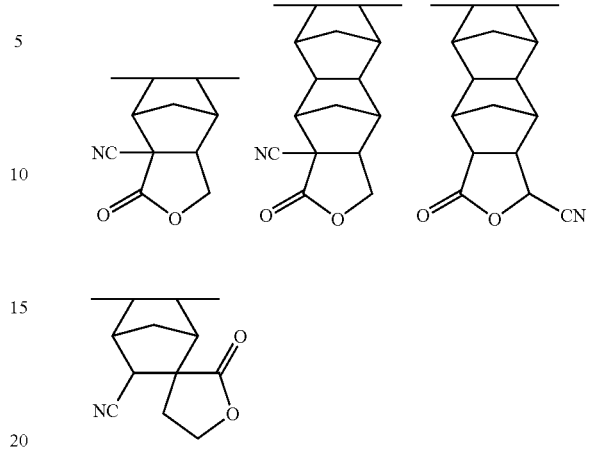

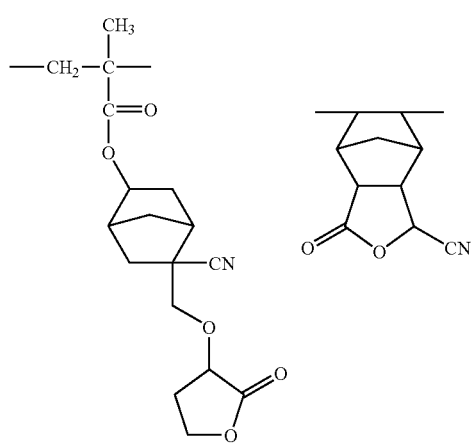

Synthesis method of a monomer corresponding to the repeating unit (A1) is not particularly limited. A method of synthesizing a monomer through an alkenylcarboxylic acid (intermediate I) or its ester (intermediate II) as shown in Scheme 1 and Scheme 2 below is preferable. Epoxidation in Scheme 1 may use the general method using mCPBA, dimethyl dioxysilane or the like. In the case of starting from Intermediate II, the similar epoxycarboxylic acid can be obtained by hydrolyzing an ester moiety after epoxidation. The epoxide obtained is treated under an acidic condition to lead to hydroxylactone, and a monomer can efficiently be obtained by attaching a polymerizable group to the hydroxyl group generated. Monomerization may use an optional esterification reaction.

Lactonization in Scheme 2 may use a general lactonization reaction. For example, a halolactonization reaction can be exemplified, and preferably, an iodolactonization reaction can be exemplified. An iodine atom of the iodolactone obtained can be substituted with a substituent containing a polymerizable group, leading to a monomer.

Scheme 1

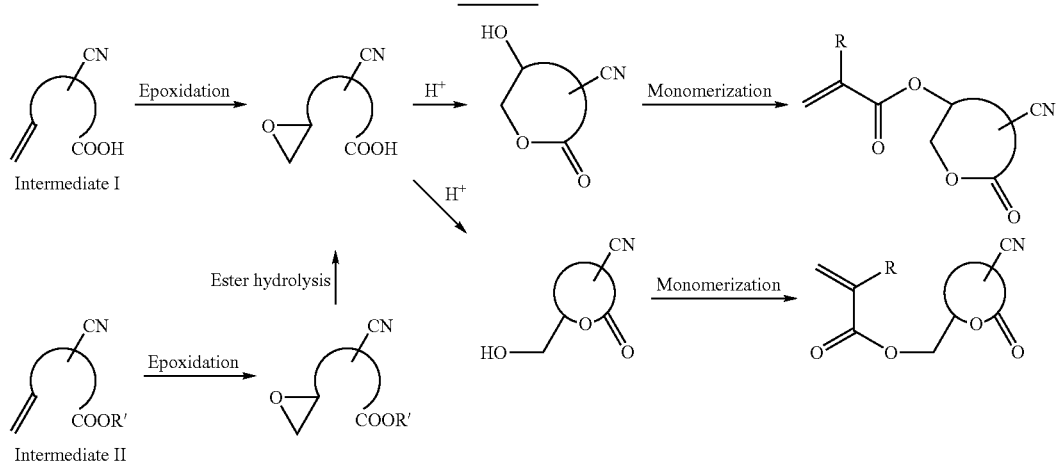

-continued
Scheme 2

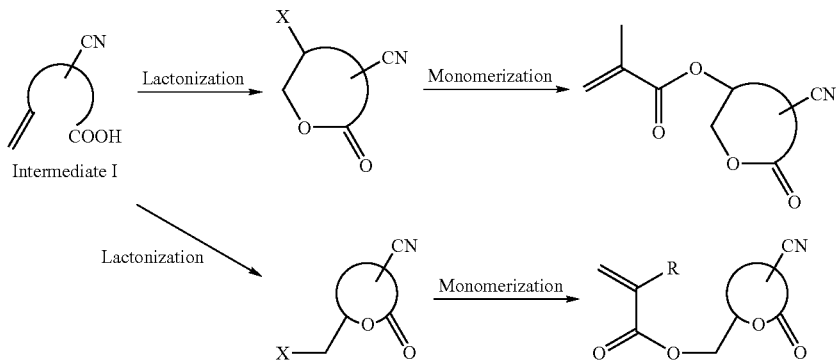

An acid-decomposable resin (A) is a resin that increases solubility to an alkali developer by the action of an acid, and has a group that decomposes by the action of an acid to generate an alkali-soluble group (hereinafter referred to as an "acid-decomposable group") in a main chain or a side chain or both the main chain and the side chain, of the resin.

A preferable group as a group capable of decomposing with an acid is a group in which a hydrogen atom of an alkali-soluble group such as —COOH group or —OH group was substituted with a group that eliminates with an acid.

Examples of the group that eliminates with an acid include —C($R_{36}$)($R_{37}$)($R_{38}$), —C($R_{36}$)($R_{37}$)($OR_{39}$) and —C($R_{01}$)($R_{02}$)($OR_{39}$).

In the above formulae, $R_{36}$ to $R_{39}$ each independently represent an alkyl group, a cycloalkyl group, an aryl group, an aralkyl group or an alkenyl group. $R_{36}$ and $R_{37}$, and $R_{36}$ and $R_{39}$ may be bonded with each other to form a ring.

$R_{01}$ to $R_{02}$ each independently represent a hydrogen atom, an alkyl group, a cycloalkyl group, an aryl group, an aralkyl group or an alkenyl group.

In the present invention, the acid-decomposable group is preferably an acetal group or a tertiary ester group.

Where the positive resist composition of the present invention is irradiated with ArF excimer laser light, the acid-decomposable resin (A) is preferably a resin that has a monocyclic or polycyclic alicyclic hydrocarbon structure, and decomposes by the action of an acid to increase solubility to an alkali developer.

The resin that has a monocyclic or polycyclic alicyclic hydrocarbon structure, and decomposes by the action of an acid to increase solubility to an alkali developer is preferably a resin having at least one repeating unit selected from the group consisting of a repeating unit having a partial structure containing an alicyclic hydrocarbon shown by the following general formulae (pI) to (pV), and a repeating unit shown by the following general formula (II-AB).

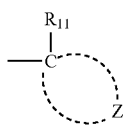
(pI)

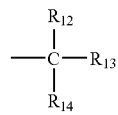
(pII)

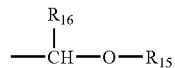
(pIII)

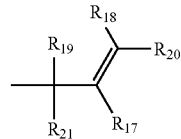
(pIV)

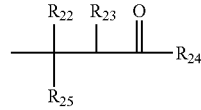
(pV)

In the general formulae (pI) to (pV), $R_{11}$ represents an alkyl group having from 1 to 8 carbon atoms or a cycloalkyl group having from 3 to 8 carbon atoms, Z represents an atomic group necessary to form a cycloalkyl group together with a carton atom.

$R_{12}$ to $R_{16}$ each independently represent a linear or branched alkyl group having from 1 to 4 carbon atoms or a cycloalkyl group, provided that at least one of $R_{12}$ to $R_{14}$ or any of $R_{15}$ or $R_{16}$ represents a cycloalkyl group.

$R_{17}$ to $R_{21}$ each independently represent a hydrogen atom, a linear or branched alkyl group having from 1 to 4 carbon atoms or a cycloalkyl group, provided that at least one of $R_{17}$ to $R_{21}$ represents a cycloalkyl group. Further, any of $R_{19}$ or $R_{21}$ represents a linear or branched alkyl group having from 1 to 4 carbon atoms or a cycloalkyl group.

$R_{22}$ to $R_{25}$ each independently represent a hydrogen atom, a linear or branched alkyl group having from 1 to 4 carbon atoms or a cycloalkyl group, provided that at least one of $R_{22}$ to $R_{25}$ represents a cycloalkyl group. Further, $R_{23}$ and $R_{24}$ may be bonded with each other to form a ring.

Particularly preferable embodiment in (pI) to (pV) can include the following structures.

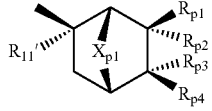
(pI')

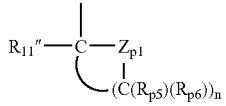
(pI²)

In the general formula (pI'), $R_{11}'$ represents an alkyl group having from 1 to 8 carbon atoms.

$X_{p1}$ represents an oxygen atom or a methylene group which may have a substituent.

$R_{p1}$ to $R_{p4}$ may be the same or different and represent a hydrogen atom or an alkyl group having from 1 to 8 carbon atoms. $R_{p1}$ to $R_{p4}$ may be bonded with each other to form a ring.

In the general formula (pI''), $R_{11}''$ represents an alkyl group having from 1 to 8 carbon atoms or a cycloalkyl group having from 3 to 8 carbon atoms, and preferably a cycloalkyl group having from 3 to 8 carbon atoms.

$Z_{p1}$ represents a single bond or —C($R_{p7}$)=C($R_{p8}$)—.

$R_{p5}$ to $R_{p8}$ may be the same or different and represent a hydrogen atom or an alkyl group having from 1 to 8 carbon atoms. $R_{p5}$ to $R_{p8}$ may be bonded with each other to form a ring.

n is an integer of from 2 to 8.

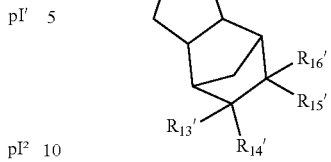
(II-AB)

In the general formula (II-AB), $R_{11}'$ and $R_{12}'$ each independently represent a hydrogen atom, a cyano group, a halogen atom or an alkyl group.

Z' represents an atomic group containing two carbon atoms bonded (C—C), and for forming an alicyclic structure.

The general formula (II-AB) is further preferably the following general formula (II-AB1) or general formula (II-AB2).

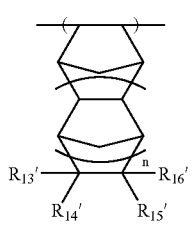
(II-AB1)

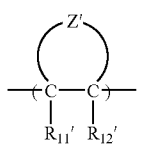
(II-AB2)

In the general formulae (II-AB1) and (II-AB2), $R_{13}'$ to $R_{16}'$ each independently represent a hydrogen atom, a halogen atom, a cyano group, a hydroxyl group, —COOH, —COOR$_5$, a group which decomposes by the action of an acid, —C(=O)—X-A'-R$_{17}$, an alkyl group or a cycloalkyl group.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

At least two of $R_{13}'$ to $R_{16}'$ may be bonded to form a ring.

n is 0 or 1.

In the general formulae (p1) to (pV), the alkyl group in $R_{12}$ to $R_{25}$ represents a linear or branched alkyl group having from 1 to 4 carbon atoms, and examples thereof include a methyl group, an ethyl group, a propyl group, an n-butyl group, a sec-butyl group, and a t-butyl group.

The cycloalkyl group formed by a cycloalkyl group or Z, and a carbon atom in $R_{11}$ to $R_{25}$ may be a monocyclic group or polycyclic group. Specifically, its examples include groups having monocyclic, bicyclic, tricyclic, and tetracylcic structures, each having 5 or more carbon atoms. The carbon atom number is preferably from 6 to 30, and particularly preferably from 7 to 25. Those cycloalkyl groups may have a substituent.

Examples of the preferable cycloalkyl group include an adamantly group, a noradamantyl group, a dekalin residue, a tricyclodecanyl group, a tetracyclododecanyl group, a norbornyl group, a cedrol group, a cyclopentyl group, a cyclohexyl group, a cycloheptyl group, a cyclooctyl group, a cylcodecanyl group and a cyclododecanyl group. More preferable examples include an adamntyl group, a norbornyl group, a cyclohexyl group, a cyclopentyl group, a tetracyclododecanyl group and tricyclododecanyl group.

Those alkyl groups and cycloalkyl groups may further have a substituent. Examples of the further substituents of the alkyl group and the cycloalkyl group include an alkyl group (1 to 4 carbon atoms), a halogen atom, a hydroxyl group, an alkoxy group (from 1 to 4 carbon atoms), a carboxyl group and an alkoxycarbonyl group (from 2 to 6 carbon atoms). The above alkyl group, alkoxy group, alkoxycarbonyl group and the like may further have a substituent. Examples of the substituent that the alkyl group, alkoxy group, alkoxycarbonyl group and the like may further have include a hydroxyl group, a halogen atom and an alkoxy group.

The structure shown by the general formulae (pI) to (PV) in the resin can form an acid-decomposable group by using the same to protect an alkali-soluble group. The alkali soluble group includes various conventional groups in the art of this field.

Specifically, the structure includes structures in which a hydrogen atom of a carboxylic acid group, a sulfonic acid group, a phenol group and a thiol group is substituted with the structure represented by the general formulae (pI) to (pV), and preferable examples are structures in which a hydrogen atom of a carboxylic acid group and a sulfonic acid group is substituted with the structure represented by the general formulae (pI) to (pV).

The repeating unit having an alkali-soluble group protected by the structure represented by the general formulae (pI) to (pV) is preferably a repeating unit represented by the following general formula (pA).

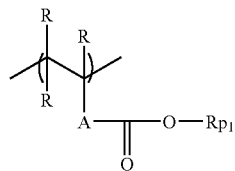

(pA)

In the general formula (pA),

R represents a hydrogen atom, a halogen atom or a linear or branched alkyl group having from 1 to 4 carbon atoms. Plural Rs may be the same or different.

A represents a single group or a combination of 2 or more groups, selected from the group consisting of a single bond, an alkylene group, an ether group, a thioether group, a carbonyl group, an ester group, an amide group, a sulfonamide group, an urethane group and an urea group. A single bond is preferable.

Rp1 represents any group of the general formulae (pI) to (pV).

The repeating unit represented by the general formula (pA) is most preferably a repeating unit by 2-alkyl-2-adamantyl (meth)acrylate or dialkyl(1-adamantyl)methyl(meth)acrylate).

Specific examples of the repeating unit represented by the general formula (pA) are shown below.

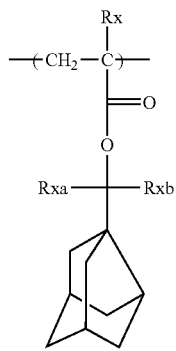

1

2

-continued

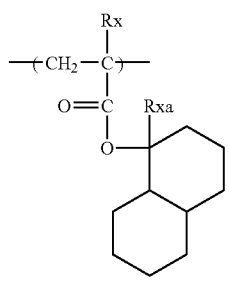

3

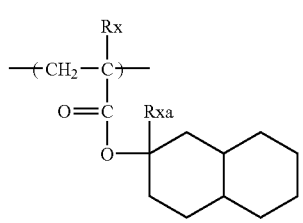

4

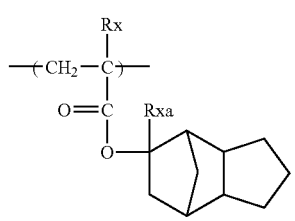

5

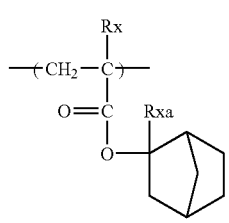

6

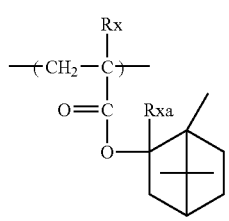

7

8

-continued
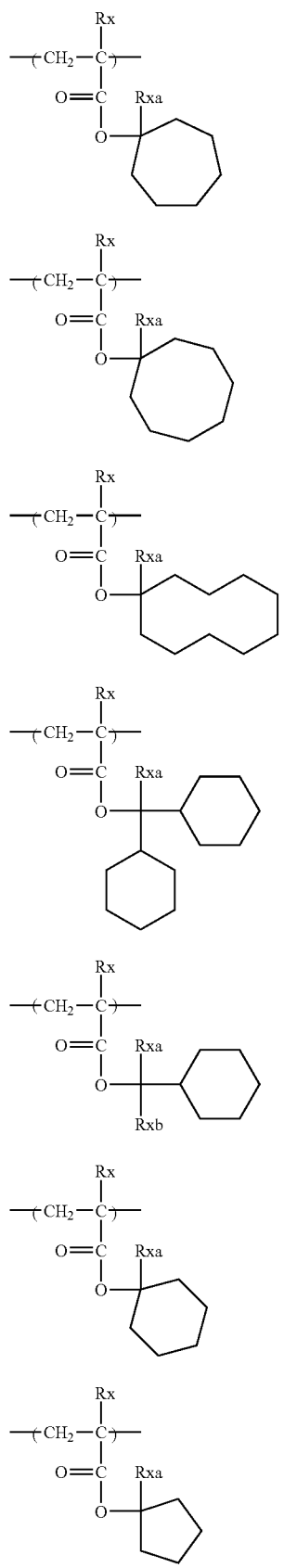
-continued
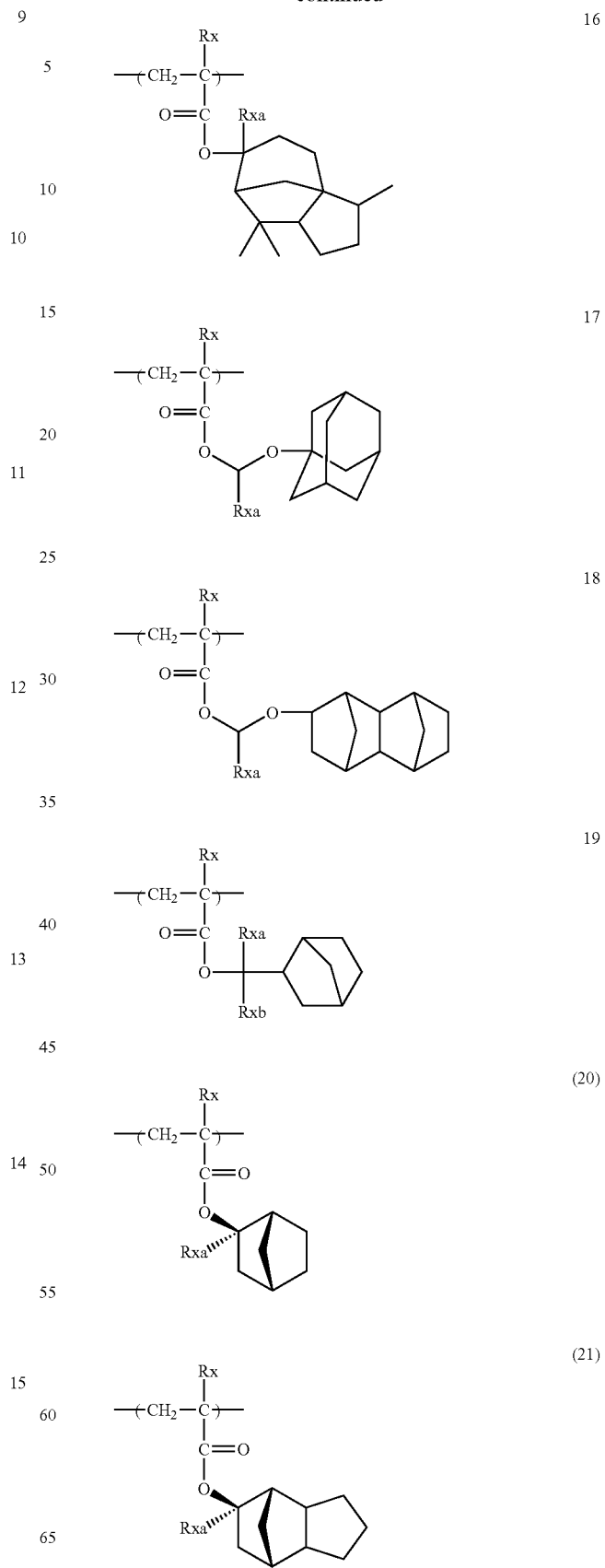

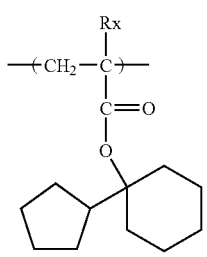
(22)

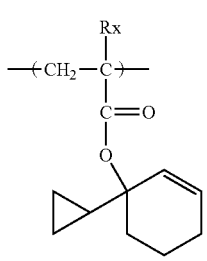
(23)

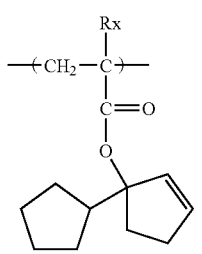
(24)

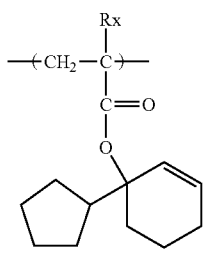
(25)

In the above structural formulae, Rx represents H, $CH_3$, $CF_3$ or $CH_2OH$, and Rxa and Rxb each individually represent an alkyl group having from 1 to 4 carbon atoms.

Examples of the halogen atom of $R_{11}'$ and $R_{12}'$ in the general formula (II-AB) include a chlorine atom, a bromine atom, a fluorine atom and a iodine atom.

The alkyl group in $R_{11}'$ and $R_{12}'$ is preferably a linear or branched alkyl group having from 1 to 10 carbon atoms, and examples thereof include a methyl group, an ethyl group, an n-propyl group, an isopropyl group, a linear or branched butyl group, a linear or branched pentyl group, a linear or branched hexyl group and a linear or branched heptyl group.

The atomic group for forming the alicyclic structure of the above Z' is an atomic group that forms a repeating unit of a alicyclic hydrocarbon that may have a substituent into a resin, and above all, an atomic group for forming a bridged alicyclic structure that forms a repeating unit of a bridged alicyclic hydrocarbon is preferable.

The skeleton of the alicyclic hydrocarbon formed includes the same as in the cycloalkyl groups of $R_{12}$ to $R_{25}$ in the general formulae (pI) to (pV).

The skeleton of the alicyclic hydrocarbon may have a substituent. Examples of such a substituent include $R_{13}'$ to $R_{16}'$ in the general formula (II-AB1) or (II-AB2).

In the acid-decomposable resin (A) according to the present invention, the group that decomposes by the action of an acid can have at least one repeating unit of the repeating unit having the partial structure containing the alicyclic hydrocarbon represented by the general formulae (pI) to (pV), the repeating unit represented by the general formula (II-AB), and a repeating unit of a copolymerization monomer described hereinafter.

Various substituents of $R_{13}'$ to $R_{16}'$ in the general formula (II-AB1) or (II-AB2) can be substituents in an atomic group for forming the alicyclic structure in the general formula (II-AB) and/or the atomic group Z for forming the bridged alicyclic structure.

Specific examples of the repeating unit represented by the general formula (II-AB1) or (II-AB2) are shown below, but the invention is not limited to those specific examples.

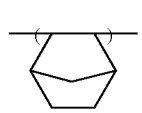
[II-1]

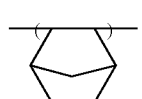
[II-2]

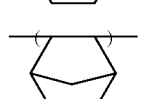
[II-3]

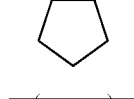
[II-4]

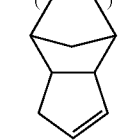
[II-5]

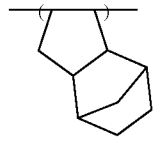
[II-6]

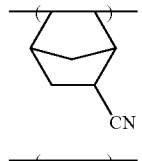
[II-7]

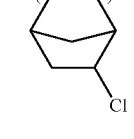
[II-8]

-continued
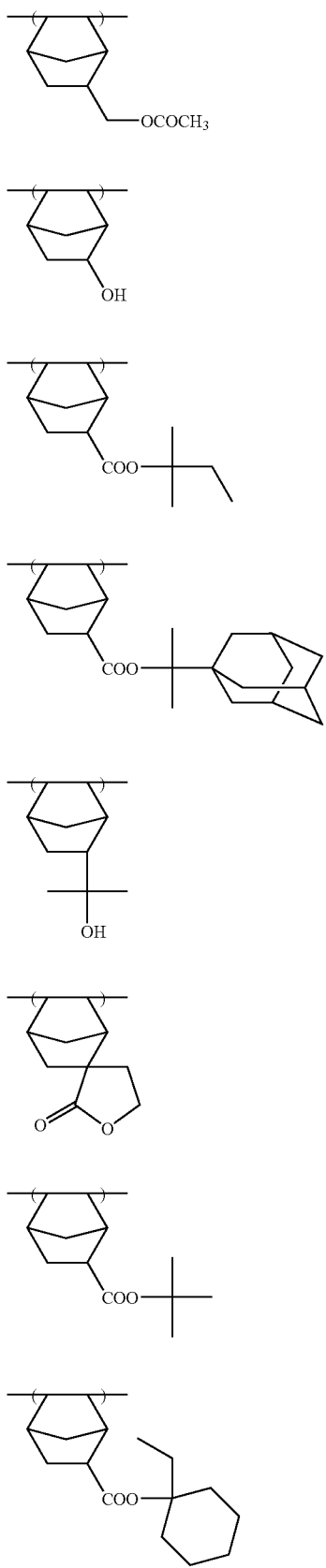
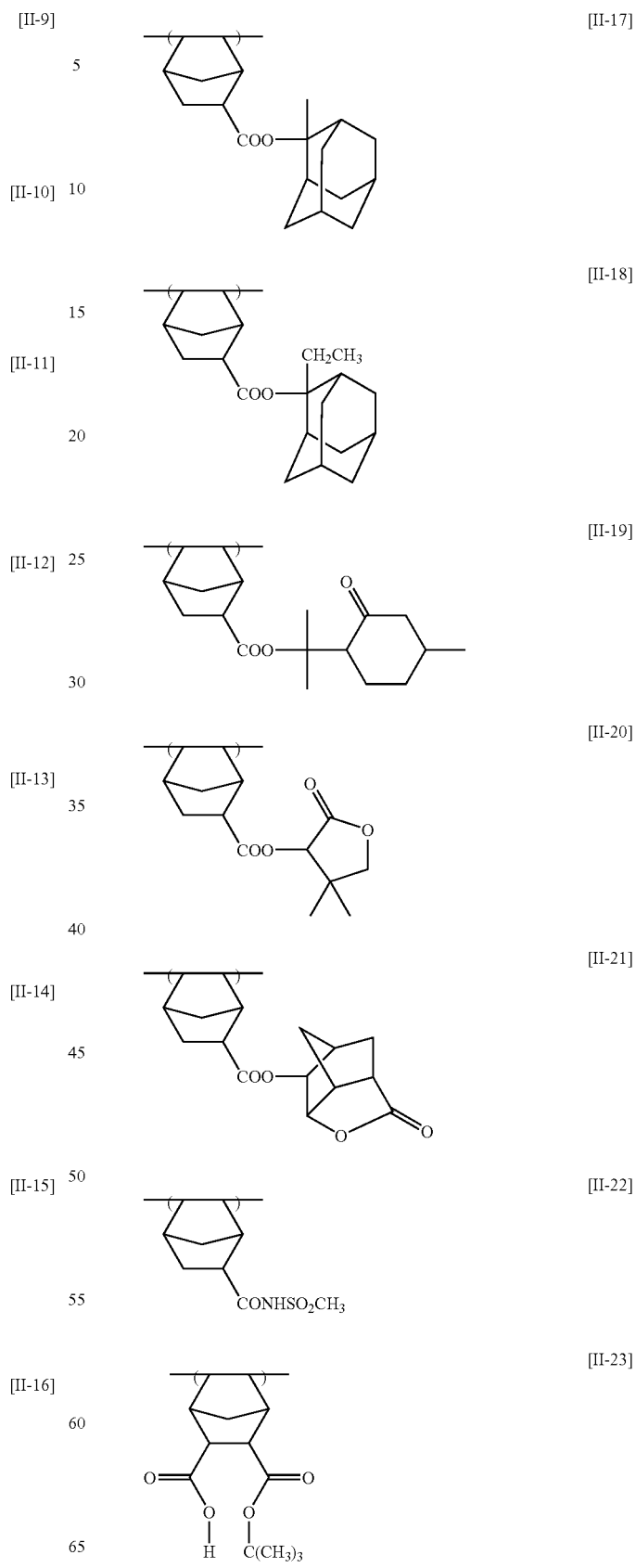

-continued

[II-24] 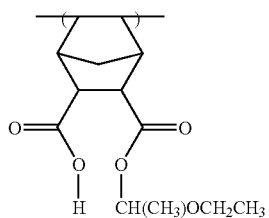

[II-25] 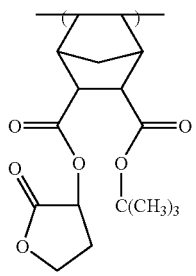

[II-26] 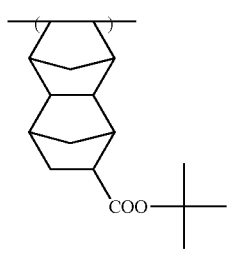

[II-27] 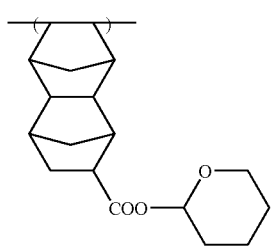

[II-28] 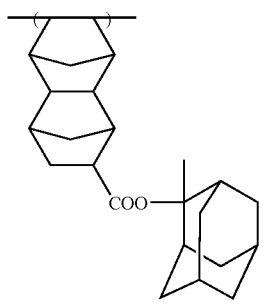

[II-29] 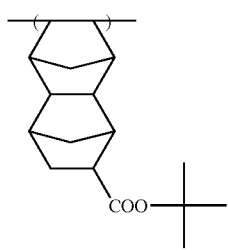

-continued

[II-30] 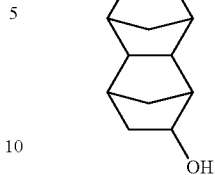

[II-31] 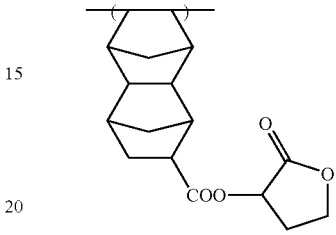

[II-32] 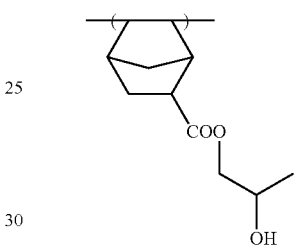

The acid-decomposable resin (A) of the present invention does not have a cyano group, and may have a repeating unit having a lactone group. Any lactone group can be used so long as it has a lactone group. A group having a 5 to 7-membered ring lactone structure is preferable, and a group in which other ring structure is ring-fused to the 5 to 7-membered ring lactone structure in a form of forming a bicycle structure or a spiro structure is more preferable. The acid-decomposable resin (A) of the present invention is more preferable to have a repeating unit having a group having the lactone structure represented by any one of the following general formulae (LC1-1) to (LC1-16). The group having a lactone structure may directly be bonded to the main chain. Preferable lactone structures are (LC1-1), (LC1-4), (LC1-5), (LC1-6), (LC1-13) and (LC1-14), and by using specific lactone structures, line edge roughness and development defect become good.

LC1-1 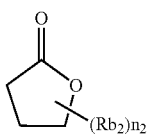

LC1-2 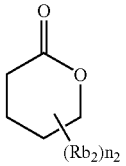

LC1-3
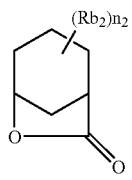

LC1-4
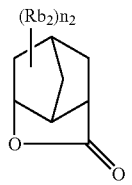

LC1-5
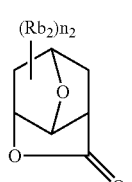

LC1-6
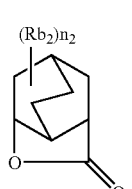

LC1-7
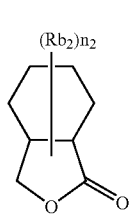

LC1-8
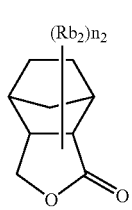

LC1-9
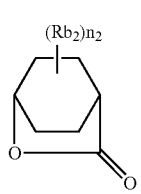

LC1-10
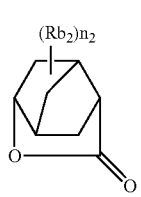

LC1-11
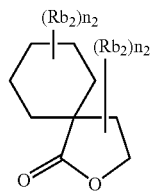

LC1-12
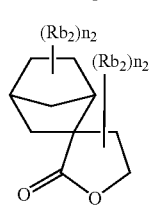

LC1-13
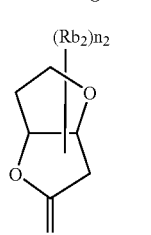

LC1-14
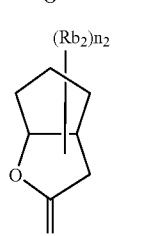

LC1-15
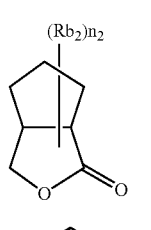

LC1-16
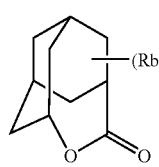

The lactone structure portion may have or may not have a substituent (Rb$_2$). Examples of the preferable substituent (Rb$_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, a halogen atom, a hydroxyl group, a cyano group and an acid-decomposable group. n2 is an integer of from 0 to 4. When n2 is 2 or more, plural Rb$_2$ may be the same or different, and plural Rb$_2$ may be bonded with each other to form a ring.

Examples of the repeating unit having a group having the lactone structure represented by any of the general formulae (LC1-1) to (LC1-16) include a repeating unit wherein at least one of R$_{13'}$ to R$_{16'}$ in the general formula (II-AB1) or (II-AB2) has a group represented by the general formulae (LC1-1) to (LC1-16) (for example, $R_5$ of —$COOR_5$ shows a group represented by the general formulae (LC1-1) to (LC1-6)), and repeating units represented by the following general formulae (AI).

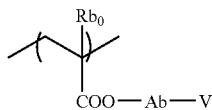

In the general formula (AI), $Rb_0$ represents a hydrogen atom, a halogen atom or an alkyl group having from 1 to 4 carbon atoms.

Examples of the alkyl group of $Rb_0$ include a methyl group, an ethyl group, a propyl group, an n-butyl group, a sec-butyl group and a t-butyl group. The alkyl group of $Rb_0$ may have a substituent. Examples of the substituent that the alkyl group of $Rb_0$ may have include a hydroxyl group and a halogen atom.

Examples of the halogen atom of $Rb_0$ include a fluorine atom, a chlorine atom, a bromine atom and iodine atom. The $Rb_0$ is preferably a hydrogen atom and a methyl group.

Ab represents an alkylene group, a divalent linking group having a monocyclic or polycyclic aliphatic hydrocarbon structure, a single bond, an ether group, an ester group, a carbonyl group, a carboxyl group, and divalent groups of those combinations. Preferable Ab is a single bond or a linking group represented by -$Ab_1$-$CO_2$—.

$Ab_1$ represents a linear or branched alkylene group or a monocyclic or polycyclic cycloalkylene group, and is preferably a methylene group, an ethylene group, a cyclohexyl group, an adamantly group and a norbornyl group.

V represents a group represented by any of the general formulae (LC1-1) to (LC1-16).

In general, an optical isomer is present in the repeating unit having a lactone structure, and any optical isomer may be used. Further, one kind of the optical isomer may be used alone or plural optical isomers may be used as a mixture. Where one kind of the optical isomer is mainly used, its optical purity (ee) is preferably 90 or more, and more preferably 95 or more.

Specific examples of the repeating unit having a group having a lactone structure are described below, but the invention is not limited to those.

(In the formula, Rx is H, $CH_3$, $CH_2OH$ or $CF_3$.)

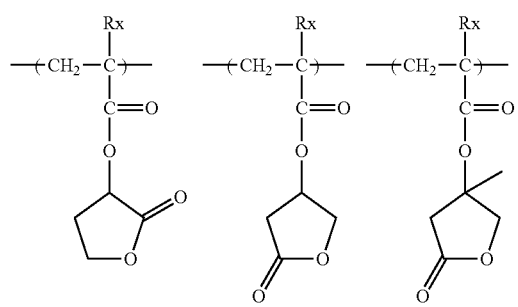

-continued

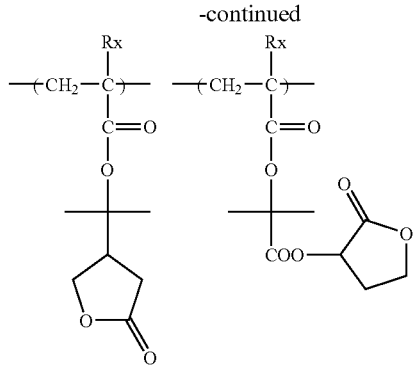

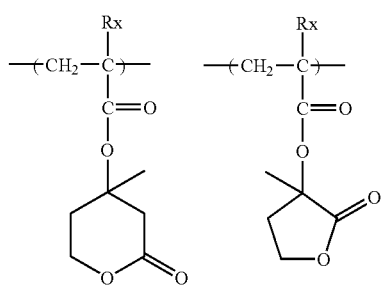

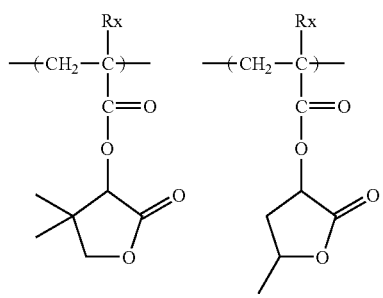

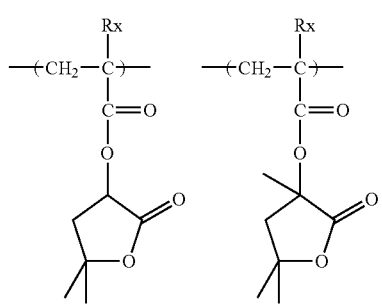

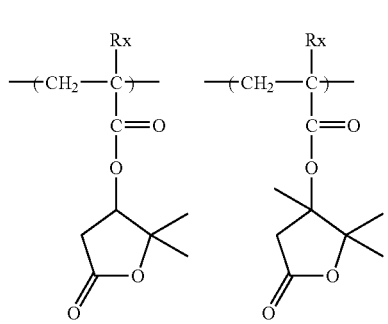

-continued
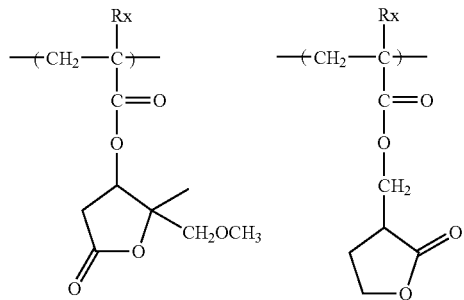
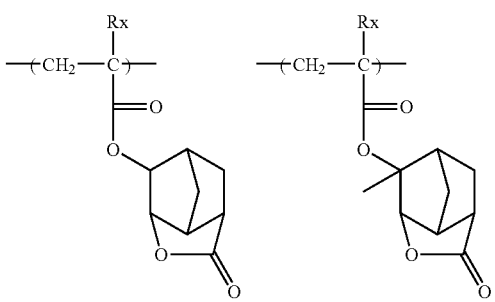
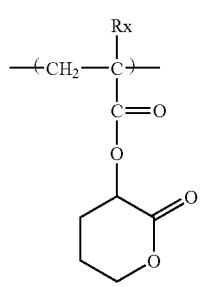
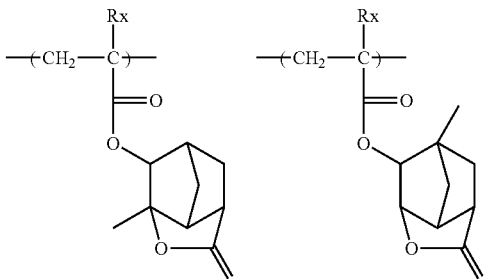
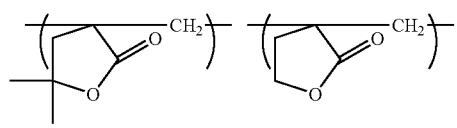
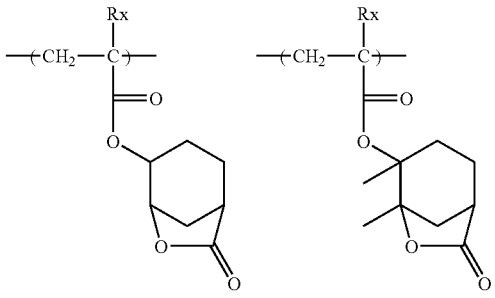
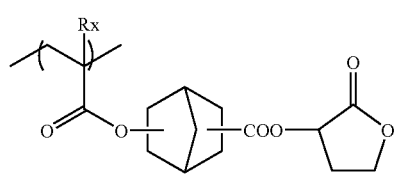
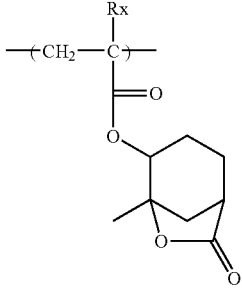
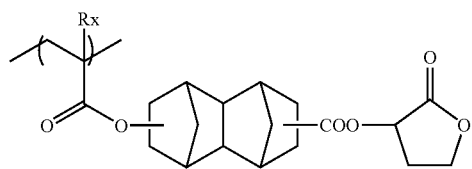
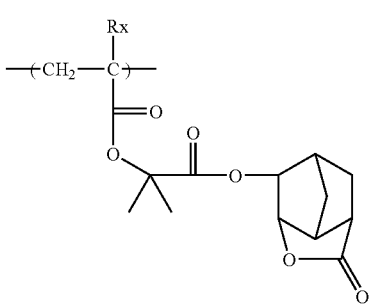
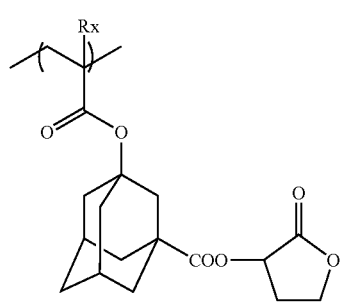
(In the formula, Rx is H, CH$_3$, CH$_2$OH or CF$_3$.)

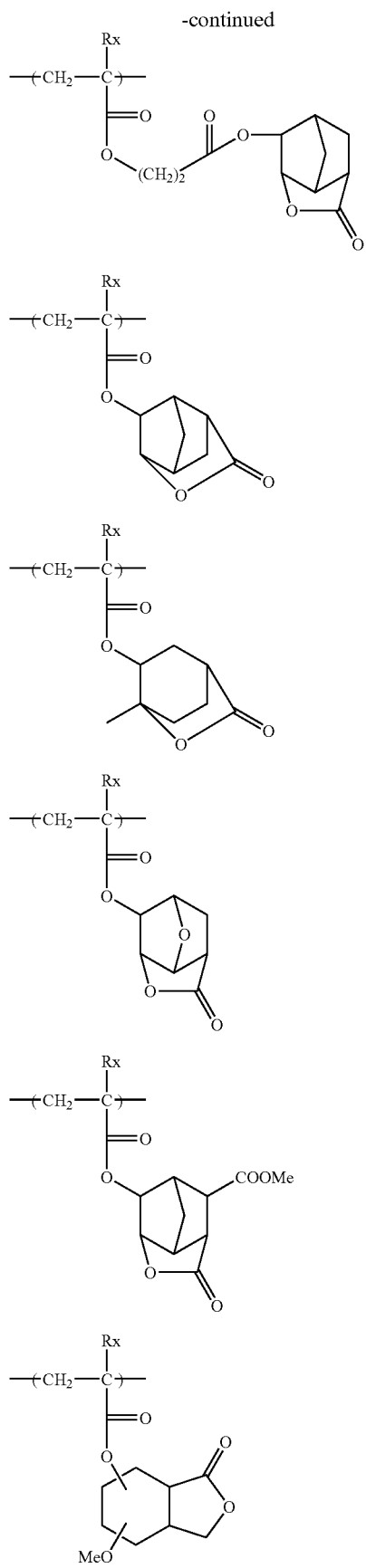
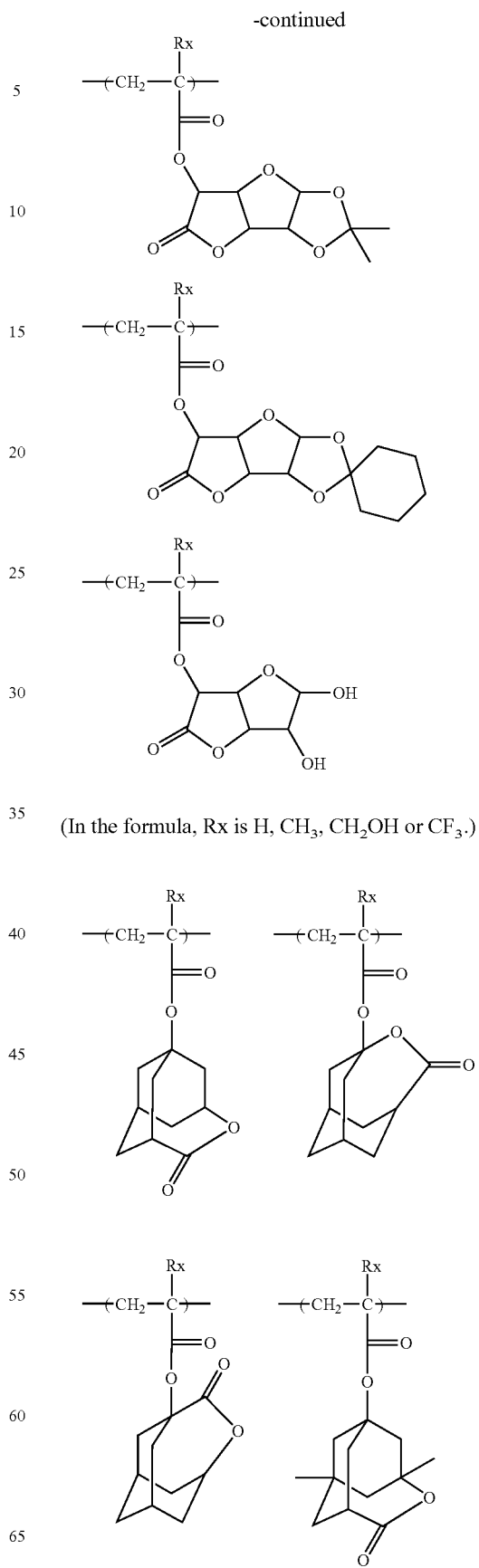
(In the formula, Rx is H, CH$_3$, CH$_2$OH or CF$_3$.)

-continued

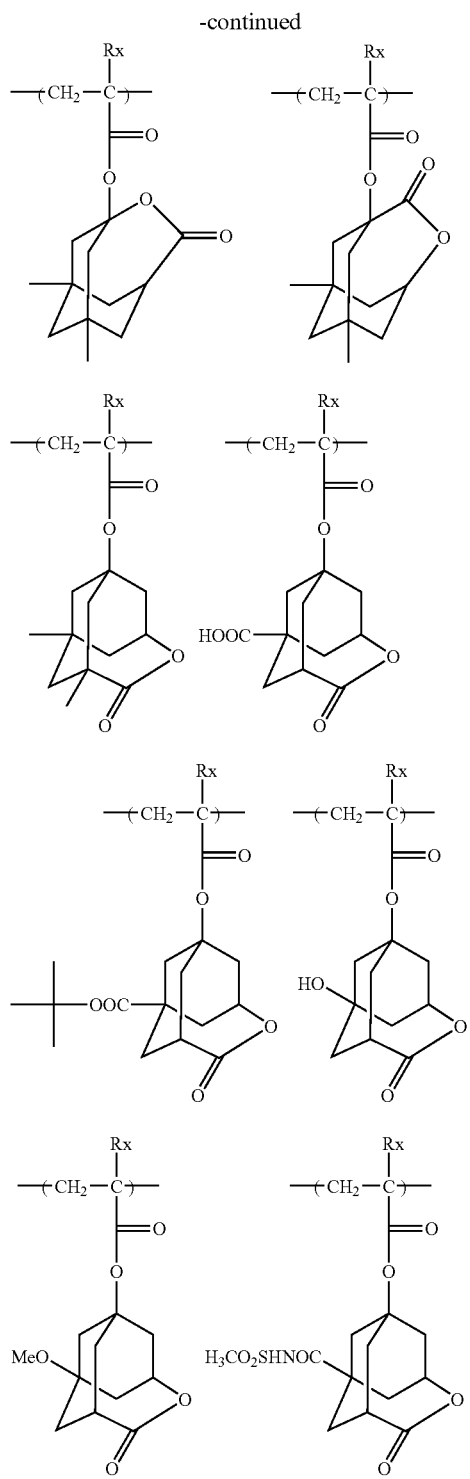

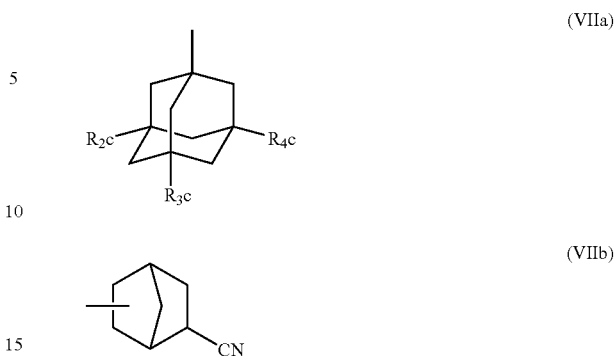

In the general formula (VIIa), $R_{2c}$ to $R_{4c}$ each independently represent a hydrogen atom, a hydroxyl group or a cyano group, provided that at least one of $R_{2c}$ to $R_{4c}$ is a hydroxyl group or a cyano group. Preferably, one or two of $R_{2c}$ to $R_{4c}$ are a hydroxyl group, and the remainder is a hydrogen atom, and more preferably, two of $R_{2c}$ to $R_{4c}$ are a hydroxyl group, and the remainder is a hydrogen atom.

The group represented by the general formula (VIIa) is preferably a dihydroxyl form or a monohydroxyl form, and more preferably a dihydroxyl form.

Examples of the repeating unit having a group represented by any of the general formula (VIIa) or (VIIb) include a repeating unit wherein at least one of $R_{13'}$ to $R_{16'}$ in the general formula (II-AB1) or (II-AB2) has a group represented by the general formulae (VIIa) to (VIIb) (for example, $R_5$ of —COOR$_5$ shows a group represented by the general formula (VIIa) or (VIIb)), and repeating units represented by the following general formula (AIIa) or (AIIb).

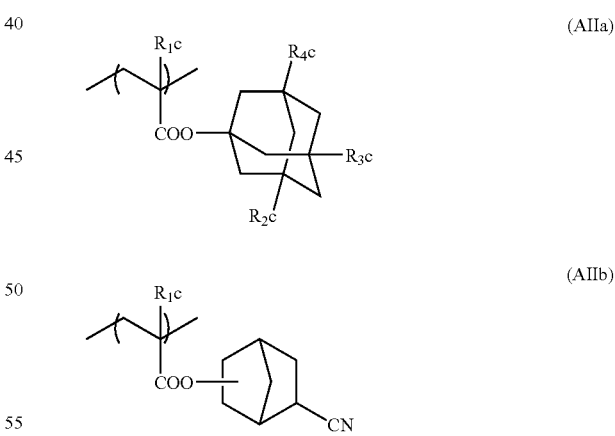

The acid-decomposable resin (A) of the present invention preferably has a repeating unit having an alicyclic hydrocarbon structure substituted with a polar group. By this, adhesion to a substrate and affinity with a developer are improved. The polar group is preferably a hydroxyl group and a cyano group.

The alicyclic hydrocarbon structure substituted with a polar group includes a structure represented by the following general formula (VIIa) or (VIIb).

In the general formulae (AIIa) and (AIIb), $R_{1c}$ represents a hydrogen atom, a methyl group, a trifluoromethyl group or a hydroxymethyl group.

$R_{2c}$ to $R_{4c}$ are the same as defined in $R_{2c}$ to $R_{4c}$ in the general formula (VIIa).

Specific examples of the repeating unit having an alicyclic hydrocarbon structure substituted with a polar group, represented by the general formula (AIIa) or (AIIb) are described below, but the invention is not limited to those.

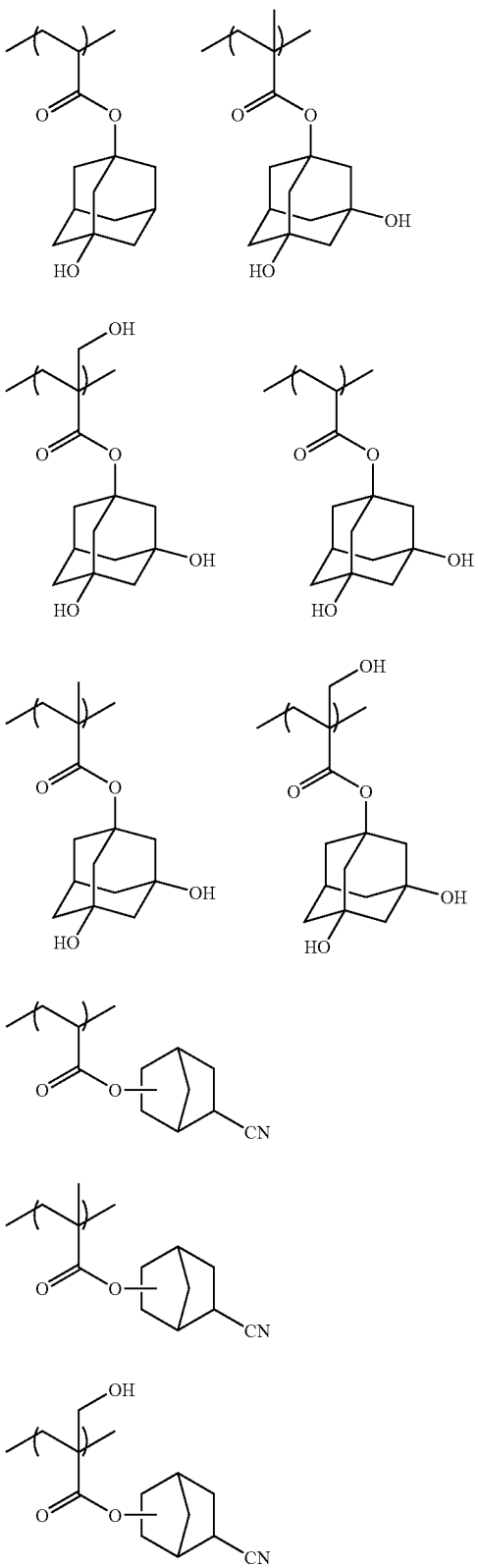

The acid-decomposable resin (A) of the present invention may have a repeating unit represented by the following general formula (VIII).

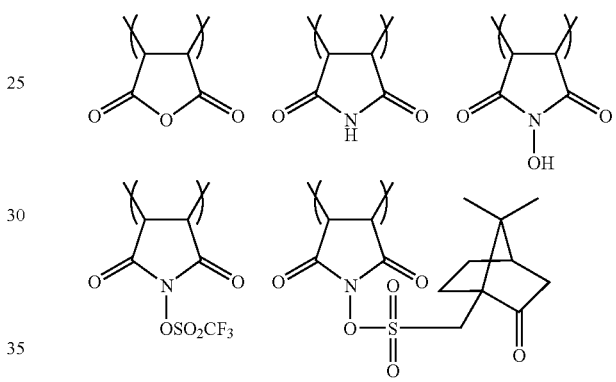

In the general formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or camphor residue. $R_{41}$ and $R_{42}$ may be substituted with, for example, a halogen atom (preferably, a fluorine atom).

Specific examples of the repeating unit represented by the general formula (VIII) are described below, but the invention is not limited to those.

The acid-decomposable resin (A) of the present invention preferably has a repeating unit having an alkali-soluble group, and more preferably has a repeating unit having a carboxyl group. By having such a repeating unit, resolution in use of a contact hall is improved. The repeating unit having a carboxyl group is preferably a repeating unit having a carboxylic group directly bonded to a main chain of a resin such as a repeating unit by acrylic acid or methacrylic acid, and a repeating unit having a carboxyl group bonded to the main chain of a resin through a linking group. The linking group may have a monocyclic or polycyclic alicyclic hydrocarbon structure. Acrylic acid and methacrylic acid are most preferable.

The acid-decomposable resin (A) of the present invention may have a repeating unit having from 1 to 3 groups represented by the following general formula (F1). By this, line edge roughness performance is improved.

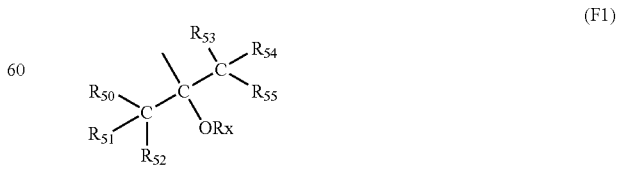

In the general formula (F1), $R_{50}$ to $R_{55}$ each independently represent a hydrogen atom, a fluorine atom or an alkyl group, provided that at least one of $R_{50}$ to $R_{55}$ is a fluorine atom or an alkyl group in which at least one hydrogen atom is substituted with a fluorine atom.

Rx represents a hydrogen atom or an organic group (preferably an acid-decomposable protecting group, an alkyl group, a cycloalkyl group, an acyl group or an alkoxycarbonyl group).

The alkyl group of $R_{50}$ to $R_{55}$ may be substituted with a halogen atom such as a fluorine atom, a cyano group or the like, and the preferable examples include an alkyl group having from 1 to 3 carbon atoms, such as a methyl group and a trifluoromethyl group.

$R_{50}$ to $R_{55}$ preferably are all fluorine atoms.

The organic group of Rx is preferably an acid-decomposable protecting group; and an alkyl group, a cycloalkyl group, an acyl group, an alkylcarbonyl group, an alkoxycarbonyl group, an alkoxycarbonylmethyl group, an alkoxymethyl group and a 1-alkoxyethyl group, that may be have a substituent.

The repeating unit having a group represented by the general formula (F1) is preferably a repeating unit represented by the following general formula (F2).

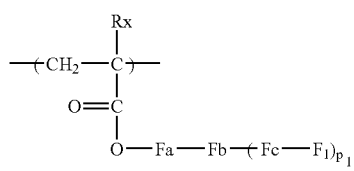

(F2)

In the general formula (F2), Rx represents a hydrogen atom, a halogen atom or an alkyl group having from 1 to 4 carbon atoms. The substituent that the alkyl group of Rx may have includes a hydroxyl group and a halogen atom.

Fa represents a single bond or a linear or branched alkylene group, and is preferably a single bond.

Fb represents a monocyclic or polycyclic hydrocarbon group.

Fc represents a single bond or a linear or branched alkylene group, and is preferably a single bond or a methylene group.

F1 represents a group represented by the general formula (F1).

P1 is from 1 to 3.

The cyclic hydrocarbon group in Fb is preferably a cyclopentyl group, a cyclohexyl group or a norbornyl group.

Specific examples of the repeating unit having a structure of the general formula (F1) are described below.

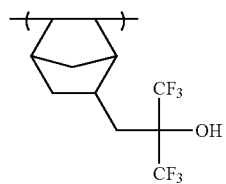

-continued

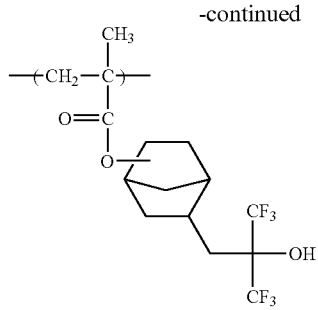

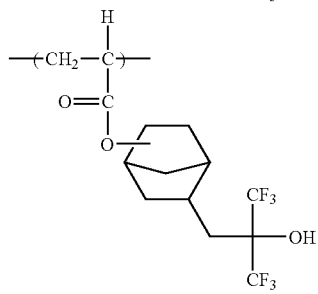

Other than the above-described repeating structural unit, the acid-decomposable resin (A) of the present invention can have various repeating structural units for the purpose of controlling a dry etching resistance, a standard developer adaptability, a substrate adhesion and a resist profile, and additionally resolving power, heat resistance, sensitivity and the like that are generally necessary characteristics of a resist.

As such a repeating structural unit, repeating structural units corresponding to the following monomers can be exemplified, but the unit is not limited to those.

This makes it possible to slightly adjust performances required in the acid-decomposable resin (A), particularly:

(1) solubility to a coating solvent,
(2) film-forming property (glass transition point),
(3) alkali development property,
(4) film reduction (hydrophilic and hydrophobic properties, and selection of alkali-soluble group),
(5) adhesion of unexposed area to a substrate,
(6) dry etching resistance, and the like.

Examples of such a monomer include compounds having at least one addition-polymerizable unsaturated bond, selected from acrylic acid esters, methacrylic acid esters, acrylamides, methacrylamides, allyl compounds, vinyl ethers and vinyl esters.

Besides, addition-polymerizable unsaturated compounds that are copolymerizable with the monomers corresponding to the above various repeating structural units may be copolymerized.

In the acid-decomposable resin (A), a molar ratio of each repeating structural unit is appropriately determined to control a dry etching resistance, a standard developer adaptability, a substrate adhesion and a resist profile of a resist, and additionally resolving power, heat resistance, sensitivity and the like that are generally necessary characteristics of a resist.

Preferred embodiments of the acid-decomposable resin (A) of the present invention are as follows.

(1) A resin containing a repeating unit having a partial structure containing an alicyclic hydrocarbon represented by the general formulae (pI) to (pV) (side chain type). Preferably, a resin having a repeating unit by a (meth)acrylate having the structure of the general formulae (pI) to (pV).

(2) A resin having a repeating unit represented by the general formula (II-AB) (main chain type). However, in (2), the following resin is additionally included.

(3) A resin having a repeating unit represented by the general formula (II-AB), a maleic anhydride derivative structure and a (meth)acrylate structure (hybrid type).

The content of the repeating unit having an acid-decomposable group in the acid-decomposable resin (A) is preferably from 10 to 60 mol %, more preferably from 20 to 50 mol %, and further preferably from 25 to 40 mol %, in all repeating structural units.

The content of the repeating unit (A1) in the acid-decomposable resin (A) is preferably from 10 to 90 mol %, more preferably from 20 to 80 mol %, and further preferably from 30 to 70 mol %, in all repeating structural units.

The content of the repeating unit having a partial structure containing the alicyclic hydrocarbon represented by the general formulae (pI) to (pV) in the acid-decomposable resin (A) is preferably from 25 to 70 mol %, more preferably from 35 to 65 mol %, and further preferably from 40 to 60 mol %, in all repeating structural units.

The content of the repeating unit represented by the general formula (II-AB) in the acid-decomposable resin (A) is preferably from 10 to 60 mol %, more preferably from 15 to 55 mol %, and further preferably from 20 to 50 mol %, in all repeating structural units.

The content of a repeating structural unit based on a monomer of further copolymerization component in the resin can appropriately be determined according to performance of the desired resist. In general, the content is preferably 99 mol % or less, more preferably 99 mol % or less, and further preferably 80 mol % or less, to the total moles of the repeating structural unit having a partial structure containing the alicyclic hydrocarbon represented by the general formulae (pI) to (pV) and the repeating unit represented by the general formula (II-AB).

When the composition of the present invention is for ArF exposure, the resin preferably does not have an aromatic group from the point of transparency to ArF light.

The acid-decomposable resin (A) used in the present invention is preferably that all of the repeating units are constituted of a (meth)acrylate repeating unit. In this case, any of the resins wherein all of the repeating units are a methacrylate, all of the repeating units are an acrylate, and all of the repeating units are a methacrylate/acrylate mixture can be used. Above all, a resin wherein the content of the acrylate repeating unit is 50 mol % or less of all of the repeating units is preferable.

The acid-decomposable resin (A) used in the present invention can be synthesized according to the conventional methods (such as a radical polymerization). For example, the general synthesis method includes an en bloc polymerization method that dissolves monomer species and an initiator in a solvent, and conducting polymerization by heating, and a dropping polymerization method that adds dropwise a solution of monomer species and an initiator to a heated solvent. Of those, a dropping polymerization method is preferable. Examples of a reaction solvent include ethers such as tetrahydrofuran, 1,4-dioxane and diisopropyl ether; ketones such as methyl ethyl ketone and methyl isobutyl ketone; ester solvents such as ethyl acetate; amide solvent such as dimethylformamide and dimethyl acetamide; and solvents that dissolve the composition of the present invention, such as propylene glycol monomethyl ether and cyclohexane, described hereinafter. More preferably, polymerization is conducted using the same solvent as the solvent used in the resist composition of the present invention. This enables generation of particles to suppress during storage.

The polymerization reaction is preferably conducted under an insert gas atmosphere such as nitrogen or argon. Polymerization is initiated using the commercially available radical initiator (an azo type initiator, a peroxide and the like) as a polymerization initiator. The radical initiator is preferably an azo type initiator, and the azo type initiator having an ester group, a cyano group or a carboxyl group is preferable. Preferable examples of the initiator include azobisisobutyronitrile, azobisdimethylvaleronitrile and dimethyl 2,2'-azobis(2-methylpropionate). If desired, the initiator is dividedly added or further initiator is added. After completion of the reaction, the reaction mixture is introduced into a solvent to recover the desired polymer by a method such as powder or solid recover. Concentration of the reaction is from 5 to 50 mass %, and preferably from 10 to 30 mass %. The reaction temperature is generally from 10 to 150° C., preferably from 30 to 120° C., and further preferably from 50 to 100° C.

When the composition of the present invention is used as an upper layer resist of a multilayer resist, the acid-decomposable resin (A) preferably has a silicon atom.

A resin having a silicon atom in at least one of a main chain and a side chain can be used as a resin that has a silicon atom, decomposes by the action of an acid and increases solubility in an alkali developer. Examples of the resin having a siloxane structure in a side chain thereof include copolymers of an olefinic monomer having a silicon atom in a side chain, and a (meth)acrylic acid series monomer having maleic anhydride and acid-decomposable groups in a side chain.

The resin having a silicon atom is preferably a resin having a trialkylsilyl structure, or a monocyclic or polycyclic siloxane structure, more preferably a resin having a repeating unit having a structure represented by the following general formulae (SS-1) to (SS-4), and further preferably a resin having a (meth)acrylic acid ester repeating unit, a vinyl repeating unit or an acrylic repeating unit, having a structure represented by the following general formulae (SS-1) to (SS-4).

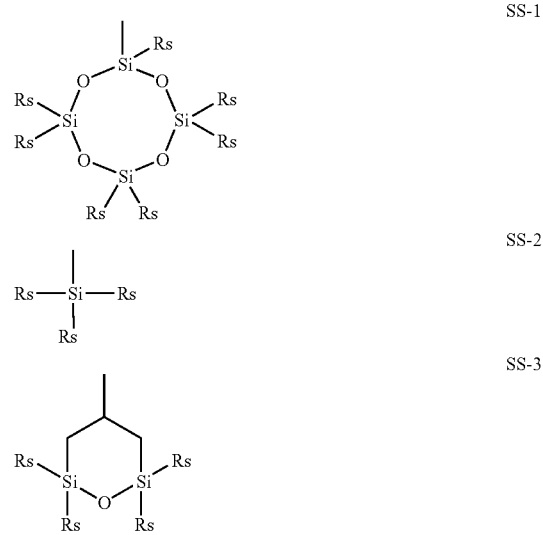

-continued

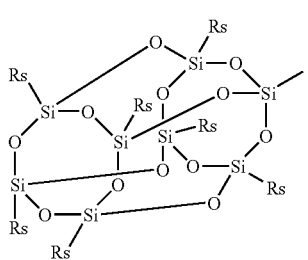
(SS-4)

In the general formulae (SS-1) to (SS-4), Rs represents an alkyl group having from 1 to 5 carbon atoms, and is preferably a methyl group or an ethyl group.

The resin having a silicon atom has preferably a repeating unit having two or more different silicon atoms, more preferably a repeating unit (Sa) having from 1 to 4 silicon atoms and a repeating unit (Sb) having from 5 to 10 silicon atoms, and further preferably at least one repeating unit having a structure represented by the general formulae (SS-1) to (SS-3) and a repeating unit having a structure represented by the general formula (SS-4).

When the positive resist composition of the present invention is irradiated with $F_2$ excimer laser light, the acid-decomposable resin (A) is preferably a resin that has a structure having a fluorine atom substituted on a main chain and/or a side chain of the polymer skeleton, decomposes by the action of an acid, and increases solubility to an alkali developer, more preferably a resin containing a hydroxyl group in which 1-position is substituted with a fluorine atom or a fluoroalkyl group, or a group that a hydroxyl group in which 1-position is substituted with a fluorine atom or a fluoroalkyl group, is protected with an acid-decomposing group, and particularly preferably a resin containing a hexafluoro-2-propanol structure or a structure that a hydroxyl group of hexafluoro-2-propanol is protected with an acid-decomposing group. It is possible to improve the transparency for far-ultraviolet light, particularly $F_2$ (157 nm) light by introducing a fluorine atom.

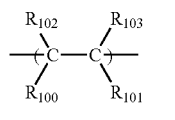
(FA)

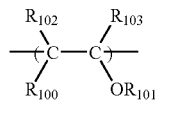
(FB)

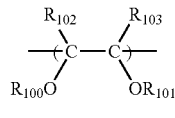
(FC)

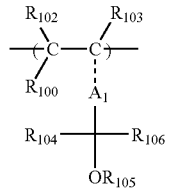
(FD)

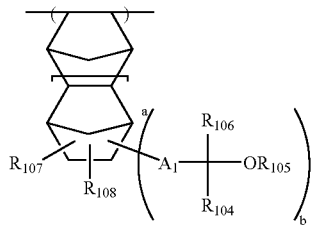
(FE)

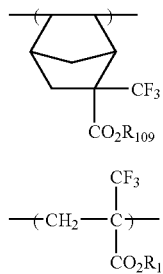
(FF)

(FG)

In the general formulae (FA) to (FG), $R_{100}$ to $R_{103}$ each independently represent a hydrogen atom, a fluorine atom, an alkyl group or an aryl group.

$R_{104}$ and $R_{106}$ each independently represent a hydrogen atom, a fluorine atom or an alkyl group, and at least one of $R_{104}$ and $R_{106}$ is a fluorine atom or a fluoroalkyl group. Preferably, $R_{104}$ and $R_{106}$ are simultaneously a trifluoromethyl group.

$R_{105}$ represents a hydrogen atom, an alkyl group, a cycloalkyl group, an acyl group, an alkoxycarbonyl group or an acid that decomposes by the action of an acid.

$A_1$ represents a single bond, a divalent linking group such as linear, branched or cyclic alkylene group, an alkenylene group, arylene group, —OCO—, —COO— or —CON($R_{24}$)—, or a linking group comprising a plurality of those being bonded. $R_{24}$ represents a hydrogen atom or an alkyl group.

$R_{107}$ and $R_{108}$ each independently represent a hydrogen atom, a halogen atom, an alkyl group, an alkoxy group, an alkoxycarbonyl group or an acid that decomposes by the action of an acid.

$R_{109}$ represents a hydrogen atom, an alkyl group, a cycloalkyl group or an acid that decomposes by the action of an acid.

a is 0 or 1.

b is 0, 1 or 2.

Further, $R_{100}$ and $R_{101}$ in the general formulae (FA) and (FC) may form a ring through an alkylene group (1 to 5 carbon atoms) that may be substituted with a fluorine atom.

The repeating units represented by the general formulae (FA) to (FG) contain at least one, and preferably at least three, fluorine atoms per one repeating unit.

The acid-decomposable resin (A) has a weight average molecular weight of preferably from 2,000 to 200,000 in terms of a polystyrene conversion by GPC method. When the weight average molecular weight is 2,000 or more, heat resistance, dry etching resistance and exposure latitude can be improved. Further, when the weight average molecular weight is 200,000 or less, development defect improvement effect due to improvement of developability is obtained, and further, viscosity decreases, thereby film-forming property can be improved. The weight average molecular weight is more preferably from 5,000 to 50,000, further preferably from 7,000 to 30,000, and most preferably from 8,000 to 16,000.

The acid-decomposable resin (A) has a degree of dispersion (Mw/Mn) of preferably from 1.0 to 3.0, more preferably from 1.0 to 2.5, and further preferably from 1.0 to 2.0. Line edge roughness performance can be improved by adjusting the degree of dispersion to an appropriate range.

In the positive resist composition of the present invention, the content of the acid-decomposable resin (A) according to the present invention in the composition is preferably from 40 to 99.99 mass %, more preferably from 50 to 99 mass %, and further preferably from 80 to 96 mass %, in the total solid content.

[2] (B) Compound that Generates Acid by Irradiation with Actinic Ray or Radiation The compound that generates an acid by irradiation with actinic ray or radiation (hereinafter referred to as "acid generator") used in the positive resist composition of the present invention is described below.

The acid generator used in the present invention can be selected from compounds generally used as an acid generator.

Specifically, photoinitiators in photocationic polymerization, photoinitiators in photoradical polymerization, photodecolorizers of dyes, photodiscoloring agents, or the conventional compounds that generate an acid by irradiation with actinic ray or radiation, such as far ultraviolet light or X ray, used in microresists and the like, and mixtures of those can appropriately be selected and used.

Examples of the acid generator include a diazonium salt, a phosphonium salt, an iodonium salt, imidosulfonate, oxime sulfonate, diazodisulfone, disulfone and o-nitrobenzylsulfonate.

Further, compounds having those group or compounds that generates an acid by irradiation with actinic ray or radiation introduced into the main chain or side chain of a polymer, as described in, for example, U.S. Pat. No. 3,849,137, German Patent 3914407, JP-A-63-26653, JP-A-55-164824, JP-A-62-69263, JP-A-63-146038, JP-A-63-163452, JP-A-62-153853 and JP-A-63-146029, can be used.

Additionally, compounds that generate an acid by light, as described in, for example, U.S. Pat. No. 3,779,778 and European Patent 126,712, can be used.

Preferable compounds in the acid generators include compounds represented by the following general formulae (ZI), (ZII) and (ZIII).

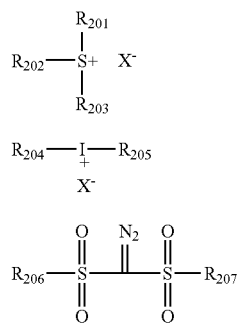

In the general formula (ZI), $R_{201}$, $R_{202}$ and $R_{203}$ each independently represent an organic group.

$X^-$ represents a non-nucleophilic anion.

The organic group of $R_{201}$, $R_{202}$ and $R_{203}$ has generally from 1 to 30, and preferably from 1 to 20, carbon atoms.

At least two of $R_{201}$, $R_{202}$ and $R_{203}$ may be bonded to form a ring, and the ring may contain an oxygen atom, a sulfur atom, an ester bond, an amide bond and a carbonyl bond therein.

A group formed by bonding at least two of $R_{201}$ to $R_{203}$ includes an alkylene atom (such as a butylene group or a pentylene group).

Specific examples of the organic group as $R_{201}$, $R_{202}$ and $R_{203}$ include the corresponding groups in the compounds (ZI-1), (ZI-2) and (ZI-3) described hereinafter.

The organic group may be a compound having a plurality of the structure represented by the general formula (ZI). For example, it may be a compound having a structure that at least one of $R_{201}$ to $R_{203}$ in the compound represented by the general formula (ZI) is bonded to at least one of $R_{201}$ to $R_{203}$ in another compound represented by the general formula (ZI).

Further preferable component (ZI) includes the compounds (ZI-1), (ZI-2) and (ZI-3) described hereinafter.

The compound (ZI-1) is an aryl sulfonium compound that at least one of $R_{201}$ to $R_{203}$ in the general formula (ZI) is an aryl group, that is, a compound having aryl sulfonium as a cation.

The aryl sulfonium compound may be that all of $R_{201}$ to $R_{203}$ are an aryl group, or a part of $R_{201}$ to $R_{203}$ is an aryl group, and the remainder is a cycloalkyl group.

Examples of the aryl sulfonium compound include a triaryl sulfonium compound, a diarylalkyl sulfonium compound, an aryldialkyl sulfonium compound, a diarylcycloalkyl sulfonium compound and an aryldicycloalkyl sulfonium compound.

The aryl group of the aryl sulfonium compound is preferably a phenyl group and a naphthyl group, and further preferably a phenyl group. The aryl group may be an aryl group having a heterocyclic structure having an oxygen atom, a nitrogen atom, a sulfur atom and the like. Examples of the aryl group having a heterocyclic structure include a pyrrole residue (a group formed by losing one hydrogen atom from pyrrole), a furan residue (a group formed by losing one hydrogen atom from furan), a thiophene residue (a group formed by losing one hydrogen atom from thiophene), an indole residue (a group formed by losing one hydrogen atom from indole), a benzofuran residue (a group formed by losing one hydrogen atom from benzofuran) and a benzothiophene residue (a group formed by losing one hydrogen atom from benzothiophene). When the aryl sulfonium compound has two or more aryl groups, the two or more aryl groups may be the same or different.

The alkyl group that the aryl sulfonium compound may have according to need is preferably a linear or branched alkyl group having from 1 to 15 carbon atoms, and examples thereof include a methyl group, an ethyl group, a propyl group, an n-butyl group, a sec-butyl group and a t-butyl group.

The cycloalkyl group that the aryl sulfonium compound may have according to need is preferably a cycloalkyl group having from 3 to 15 carbon atoms, and examples thereof include a cyclopropyl group, a cyclobutyl group and a cyclohexyl group.

The aryl group, alkyl group and cycloalkyl group of $R_{201}$ to $R_{203}$ may have an alkyl group (for example, from 1 to 15 carbon atoms), a cycloalkyl group (for example, from 3 to 15 carbon atoms), an aryl group (for example, from 6 to 14 carbon atoms), an alkoxy group (for example, from 1 to 15 carbon atoms), a halogen atom, a hydroxyl group, a phenylthio group and the like as a substituent. The substituent is preferably a linear or branched alkyl group having from 1 to 12 carbon atoms, a cycloalkyl group having from 3 to 12 carbon atoms and an alkoxy group having from 1 to 12 carbon atoms, and most preferably an alkyl group having from 1 to 4 carbon atoms and an alkoxy group having from 1 to 4 carbon atoms. The substituent may be substituted on any one of $R_{201}$ to $R_{203}$, or may be substituted on all of three. When $R_{201}$ to $R_{203}$ are an aryl group, it is preferable that the substituent is substituted on p-position of the aryl group.

Examples of the non-nucleophilic anion as $X^-$ include a sulfonic acid anion, a carboxylic acid anion, a sulfonylimide anion, a bis(alkylsulfonyl)imide anion and a tris(aklylsulfonyl)methyl anion.

The non-nucleophilic anion is an anion having remarkably low ability to cause a nucleophilic reaction, and is an anion that can suppress decomposition with time by an intramolecular nucleophilic reaction. By this, stability with time of a resist is improved.

Examples of the sulfonic acid anion include an aliphatic sulfonic acid anion, an aromatic sulfonic acid anion and a camphorsulfonic acid anion.

Examples of the carboxylic acid anion include an aliphatic carboxylic acid anion, an aromatic carboxylic acid anion and an aralkylcarboxylic acid anion.

Examples of the aliphatic group in the aliphatic sulfonic acid anion include an alkyl group having from 1 to 30 carbon atoms (specifically, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an udecyl group, a dodecyl group, a tridodecyl group, a tetradodecyl group, a pentadecyl group, a hexadecyl group, a heptadecyl group, an octadecyl group, a nonadecyl group and eicosyl group), and a cycloalkyl group having from 3 to 30 carbon atoms (specifically, a cyclopropyl group, a cyclopentyl group, a cyclohexyl group, an adamantly group, a norbornyl group and boronyl group).

The aromatic group in the aromatic sulfonic acid anion is preferably an aryl group having from 6 to 14 carbon atoms, and examples thereof include a phenyl group, a tolyl group and a naphthyl group.

The alkyl group, cycloalkyl group and aryl group in the above aliphatic sulfonic acid anion and aromatic sulfonic acid anion may have a substituent.

Examples of such a substituent include a nitro group, a halogen atom (a fluorine atom, a chlorine atom, a bromine atom or an iodine atom), a carboxyl group, a hydroxyl group, an amino group, a cyano group, an alkoxy group (preferably from 1 to 5 carbon atoms), a cycloalkyl group (preferably from 3 to 15 carbon atoms), an aryl group (preferably from 6 to 14 carbon atoms), an alkoxycarbonyl group (preferably from 2 to 7 carbon atoms), an acyl group (preferably from 2 to 12 carbon atoms), an alkoxycarbonyloxy group (preferably from 2 to 7 carbon atoms) and an alkylthio group (preferably from 1 to 5 carbon atoms). Regarding the aryl group and the ring structure that each group has, an alkyl group (preferably from 1 to 15 carbon atoms) can further be exemplified as the substituent.

Examples of the aliphatic group in the aliphatic carboxylic acid anion include the same aliphatic groups in the aliphatic sulfonic acid anion.

Examples of the aromatic group in the aromatic carboxylic acid anion include the same aromatic groups in the aromatic sulfonic acid anion.

The aralkyl group in the aralkylcarboxylic acid anion is preferably an aralkyl group having from 6 to 12 carbon atoms, and examples thereof include a benzyl group, a phenethyl group, a naphthylmethyl group, a naphthylethyl group and a naphthylbutyl group.

The aliphatic group, aromatic group and aralkyl group in the above aliphatic carboxylic acid anion, aromatic carboxylic acid anion and aralkylcarboxylic acid anion may have a substituent, and examples of the substituent include a halogen atom, an alkyl group, a cylcoalkyl group, and alkoxy group and alkylthio group that are the same as in the aliphatic sulfonic acid anion.

The sulfonylimide anion includes a saccharine anion.

The alkyl group in the bis(alkylsulfonyl)imide anion and tris(alkylsulfonyl)methyl anion is preferably an alkyl group having from 1 to 5 carbon atoms, and examples thereof include a methyl group, an ethyl group, a propyl group, an isopropyl group, an n-butyl group, an isobutyl group, a sec-butyl group, a pentyl group and a neopentyl group. Those alkyl groups may have a substituent, and examples of the substituent include a halogen atom, an alkyl group substituted with a halogen atom, an alkoxy group and an alkylthio group. Of those, an alkyl group substituted with a fluorine atom is preferable.

Other examples of the non-nucleophilic anion include phosphorus fluoride, boron fluoride and antimony fluoride.

The non-nucleophilic anion of $X^-$ is preferably an aliphatic sulfonic acid anion wherein α-position of sulfonic acid is substituted with a fluorine atom, an aromatic sulfonic acid anion substituted with a fluorine atom or a group having a fluorine atom, an bis(alkylsulfonyl)imide anion wherein an alkyl group is substituted with a fluorine atom, or a tri(alkylsulfonyl)methide anion wherein an alkyl group is substituted with a fluorine atom. The non-nucleophilic anion is particularly preferably a perfluoro aliphatic sulfonic acid anion having from 4 to 8 carbon atoms and an aromatic sulfonic acid anion having a fluorine atom, and most preferably a nonafluorobutanesulfonic acid anion, a perfluorooctanesulfonic acid anion, a pentafluorobenzenesulfonic acid anion and 3,5-bis(trifluoromethyl)benzenesulfonic acid anion.

The compound (ZI-2) is described below.

The compound (ZI-2) is a compound in the case that $R_{201}$ to $R_{203}$ in the general formula (ZI) each independently represent an organic group that does not contain an aromatic ring. The aromatic ring used herein includes an aromatic ring containing a hetero atom.

The organic group that does not contain an aromatic ring as $R_{201}$ to $R_{203}$ has generally from 1 to 30, and preferably from 1 to 20, carbon atoms.

$R_{201}$ to $R_{203}$ each independently are preferably an alkyl group, a cycloalkyl group, an allyl group and a vinyl group, further preferably a linear, branched or cyclic 2-oxoalkyl group and an alkoxy group, and most preferably a linear or branched 2-oxoalkyl group.

The alkyl group as $R_{201}$ to $R_{203}$ may be any of linear and branched alkyl groups, and is preferably a linear or branched alkyl group having from 1 to 10 carbon atoms. Examples of the alkyl group include a methyl group, an ethyl group, a propyl group, a butyl group and a pentyl group. More preferable examples of the alkyl group include a 2-linear or branched oxalkyl group and an alkoxycarbonylmethyl group.

The cycloalkyl group as $R_{201}$ to $R_{203}$ is preferably a cycloalkyl group having from 3 to 10 carbon atoms. Examples of the cycloalkyl group include a cyclopentyl group, a cyclohexyl group and a norbornyl group. More preferable cycloalkyl group is a 2-oxocycloalkyl group.

The 2-oxoalkyl group may be any of linear, branched and cyclic forms, and preferable examples thereof include the above-described alkyl group and a group having >C=O at 2-position of the cycloalkyl group.

The alkoxy group in the alkoxycarbonylmethyl group is preferably an alkoxy group having from 1 to 5 carbon atoms, and examples thereof include a methoxy group, an ethoxy group, a propoxy group, a butoxy group and a pentoxy group.

$R_{201}$ to $R_{203}$ may further be substituted with a halogen atom, an alkoxy group (for example, from 1 to 5 carbon atoms), a hydroxyl group, a cyano group or a nitro group.

The compound (ZI-3) is a compound represented by the following general formula (ZI-3), and is a compound having a phenacylsulfonium salt structure.

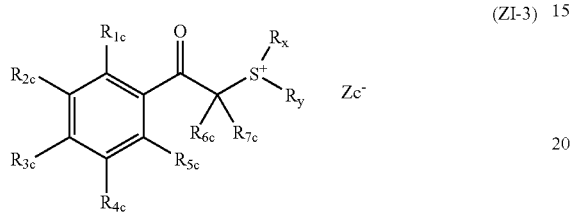

(ZI-3)

In the general formula (ZI-3), $R_{1c}$ to $R_{5c}$ each independently represent a hydrogen atom, an alkyl group, a cycloalkyl group, an alkoxy group or a halogen atom.

$R_{6c}$ and $R_{7c}$ each independently represent a hydrogen atom, an alkyl group or a cycloalkyl group.

$R_x$ and $R_y$ each independently represent an alkyl group, a cylcoalkyl group, an allyl group or a vinyl group.

At least two of $R_{1c}$ to $R_{7c}$, and $R_x$ and $R_y$ may be bonded to form a ring structure, respectively. This ring structure may contain an oxygen atom, a sulfur atom, an ester bond or an amide bond. Examples of the group formed by bonding at least two of $R_{1c}$ to $R_{7c}$, and $R_x$ and $R_y$, respectively, include a butylenes group and a pentylene group.

$Zc^-$ represents a non-nucleophilic anion, and examples thereof include the same non-nucleophilic anions of $X^-$ in the general formula (ZI).

The alkyl group as $R_{1c}$ to $R_{7c}$ is preferably a linear or branched alkyl group having from 1 to 20 carbon atoms, and examples thereof include a methyl group, an ethyl group, a linear or branched propyl group, a linear or branched butyl group and a linear or branched pentyl group.

The cycloalkyl group as $R_{1c}$ to $R_{7c}$ is preferably a cycloalkyl group having from 3 to 8 carbon atoms, and examples thereof include a cyclopentyl group and a cyclohexyl group.

The alkoxt group as $R_{1c}$ to $R_{5c}$ may be any of linear, branched and cyclic forms, and examples thereof include an alkoxy group having from 1 to 10 carbon atoms, and preferably a linear or branched alkoxy group having from 1 to 5 carbon atoms (for example, a methoxy group, an ethoxy group, a linear or branched propoxy group, a linear or branched butoxy group and a linear or branched pentoxy group) and a cyclic alkoxy group having from 3 to 8 carbon atoms (for example, a cyclopentyloxy group and a cyclohexyloxy group).

Preferably, any of $R_{1c}$ to $R_{5c}$ is a linear or branched alkyl group, a cycloalkyl group or a linear or branched alkoxy group, and further preferably, the sum of carbon atom number of $R_{1c}$ to $R_{5c}$ is from 2 to 15. By this, solvent solubility is further improved, thereby suppressing generation of particles during storage.

The alkyl group and cycloalkyl group as $R_x$ and $R_y$ are the same as the alkyl groups and cycloalkyl groups as $R_{1c}$ to $R_{7c}$. 2-Oxoalkyl group, 2-oxocycloalkyl group and an alkoxycarbonylmethyl group are more preferable.

Examples of the 2-oxoalkyl group and 2-oxocycloalkyl group include alkyl groups as $R_{1c}$ to $R_{7c}$, and a group having >C=O at 2-position of the cycloalkyl group.

Examples of the alkoxy group in the alkoxycarbonylmethyl group include the same alkoxy groups as $R_{1c}$ to $R_{5c}$.

$R_x$ and $R_y$ are an alkyl group having preferably 4 or more, more preferably 6 or more, and further preferably 8 or more, carbon atoms.

In the general formulae (ZII) and (ZIII), $R_{204}$ to $R_{207}$ each independently represent an aryl group, an alkyl group or a cycloalkyl group.

The aryl group of $R_{204}$ to $R_{207}$ is preferably a phenyl group or a naphthyl group, and further preferably a phenyl group. The aryl group of $R_{204}$ to $R_{207}$ may be an aryl group having a heterocyclic structure having an oxygen atom, a nitrogen atom, a sulfur atom or the like. Examples of the aryl group having a heterocyclic structure include a pyrrole residue (a group formed by losing one hydrogen atom from pyrrole), a furan residue (a group formed by losing one hydrogen atom from furan), a thiophene residue (a group formed by losing one hydrogen atom from thiophene), an indole residue (a group formed by losing one hydrogen atom from indole), a benzofuran residue (a group formed by losing one hydrogen atom from benzofuran) and a benzothiophene residue (a group formed by losing one hydrogen atom from benzothiophene).

The alkyl group as $R_{204}$ to $R_{207}$ is preferably a linear or branched alkyl group having from 1 to 10 carbon atoms, and examples thereof include a methyl group, an ethyl group, a propyl group, a butyl group and a pentyl group.

The cycloalkyl group as $R_{204}$ to $R_{207}$ is preferably a cycloalkyl group having from 3 to 10 carbon atoms, and examples thereof include a cyclopentyl group, a cyclohexyl group and a norbornyl group.

Examples of the alkyl group that $R_{204}$ to $R_{207}$ may have include an alkyl group (for example, from 1 to 15 carbon atoms), a cycloalkyl group (for example, from 3 to 15 carbon atoms), an aryl group (for example, from 6 to 15 carbon atoms), an alkoxy group (for example, from 1 to 15 carbon atoms), a halogen atom, a hydroxyl group and a phenylthio group.

$X^-$ represents a non-nucleophilic anion, and examples thereof include the same non-nucleophilic anions of $X^-$ in the general formula (ZI).

The preferable compound in the acid generator can further include compounds represented by the following general formulae (ZIV), (ZV) and (ZVI).

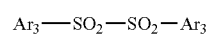

ZIV

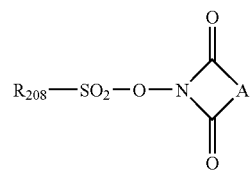

ZV

-continued

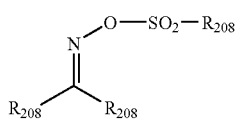

(ZVI)

In the general formula (ZIV), two $Ar_3$ each independently represent an aryl group.

$R_{208}$ in the general formulae (ZV) and (ZVI) each independently represent an alkyl group, a cycloalkyl group or an aryl group, and are the same as the alkyl group, cycloalkyl group or aryl group as $R_{204}$ to $R_{207}$ in the general formulae (ZI) to (ZIII).

A represents an alkylene group, an alkenylene group or an arylene group.

More preferable acid generator is compounds represented by the general formulae (ZI) to (ZIII).

The acid generator in the invention is preferably a sulfonium salt compound having an anion represented by the following (AN1) to (AN4) as the anion ($X^-$) in (ZI).

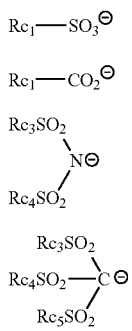

(AN1)
(AN2)
(AN3)
(AN4)

$Rc_1$ represents an organic group.

The organic group of $Rc_1$ includes organic groups having from 1 to 30 carbon atoms, and preferable examples thereof include an alkyl group and an aryl group, which may be substituted, and groups wherein plural those groups are linked with a linking group such as a single bond, —O—, —$CO_2$—, —S—, —$SO_3$— or —$SO_2N(Rd_1)$—.

$Rd_1$ represents a hydrogen atom or an alkyl group, and may form a cyclic structure together with the bonded alkyl group or aryl group.

The organic group of $Rc_1$ is more preferably an alkyl group whose 1-position is substituted with a fluorine atom or a fluoroalkyl group, or a phenyl group substituted with a fluorine atom or a fluoroalkyl group. By having a fluorine atom or a fluoroalkyl group, acidity of an acid generated by light irradiation increases, and sensitivity is improved. When $Rc_1$ has 5 or more carbon atoms, it is preferable that all hydrogen atoms on at least one carbon atom is not substituted with fluorine atoms, the part of the hydrogen atoms is remained and the number of hydrogen atom is larger than the number of fluorine atom. By not having a perfluoroalkyl group having 5 or more carbon atoms, toxicity to the ecology is reduced.

The most preferable embodiment of $Rc_1$ is a group represented by the following general formula.

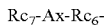

$Rc_6$ is a perfluoroalkylene group having 4 or less, more preferably from 2 to 4, and further preferably from 2 to 3, carbon atoms, or a phenylene group substituted with from 3 to 4 fluorine atoms and/or from 1 to 3 fluoroalkyl groups.

Ax is a linking group (preferably a single bond, —O—, —$CO_2$—, —S—, —$SO_3$— or —$SO_2N(Rd_1)$—). $Rd_1$ represents a hydrogen atom or an alkyl group, and may form a cyclic structure by combining with $Rc_7$.

$Rc_7$ represents a hydrogen atom, a fluorine atom, a linear, branched, monocyclic or polycyclic alkyl group which may be substituted, or an aryl group which may be substituted.

$Rc_3$, $Rc_4$ and $Rc_5$ each independently represents an organic group.

The organic groups of $Rc_3$, $Rc_4$ and $Rc_5$ preferably include the same preferable organic groups in $Rc_1$.

$Rc_3$ and $Rc_4$ may be combined to from a ring.

The groups formed by combining $Rc_3$ and $Rc_4$ include an alkylene group and an arylene group. A perfluoroalkyl group having from 2 to 4 carbon atoms is preferable. By forming a ring by combining $Rc_3$ and $Rc_4$, acidity of an acid generated by light irradiation increases, and sensitivity is improved, which are preferable.

More preferable anion (X—) is pentafluoroethanesulfonic acid anion, heptafluoropropanesulfonic acid anion and nonafluorobutanesulfonic acid anion, and most preferable anion is pentafluoroethanesulfonic acid anion and heptafluoropropanesulfonic acid anion.

Particularly preferable acid generator in the present invention is an acid generator having an anion structure containing an alkyl group having 4 or less carbon atoms and having a fluorine atom as a substituent, a cycloalkyl group having a fluorine atom as a substituent, or an aromatic group having a fluorine atom as a substituent, and a triarylsulfonium cation structure. Such an acid generator is preferably represented by the following general formulae (B1) to (B3).

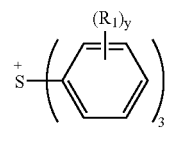

(B1)

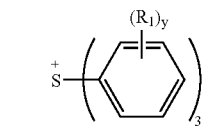

(B2)

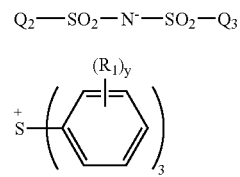

(B3)

In the general formulae (B1) to (B3), $R_1$ represents an alkyl group, an alicyclic hydrocarbon group, a hydroxyl group, a carboxyl group, an alkoxy group or a halogen atom.

y each independently represent an integer of 0 or from 1 to 5. When y is an integer of 2 or more, two or more $R_1$ may be the same or different.

$Q_1$ to $Q_4$ each independently represent an alkyl group having from 1 to 8 carbon atoms substituted with a fluorine atom, a cyloalkyl group substituted with a fluorine atom, an aryl group substituted with a fluorine atom or an aryl group substituted with a fluorinated alkyl group.

In particular, in the general formula (B2), it is preferable from the standpoint of improvement of exposure latitude that $Q_2$ and $Q_3$ are bonded to form a ring structure.

The alkyl group of $R_1$ is preferably a linear or branched alkyl group having from 1 to 15 carbon atoms, and examples thereof include a methyl group, an ethyl group, a propyl group, an n-butyl group, a sec-butyl group and a t-butyl group.

The alicyclic hydrocarbon group of $R_1$ is preferably a cycloalkyl group having from 3 to 15 carbon atoms, and examples thereof include a cyclopropyl group, a cyclobutyl group, a cyclopentyl group, a cyclohexyl group, a norbornyl group and an adamantly group.

Examples of the alkyl group substituted with a fluorine atom in $Q_1$ to $Q_4$ include —$CF_3$, —$C_2F_5$, -n-$C_3F_7$, -n-$C_4F_9$, -n-$C_8F_{17}$, —$CF(CF_3)_2$, —$CH(CF_3)_2$, —$(CF_2)_2OCF_2CF_3$, —$(CF_2)_2O(CH_2)_3CH_3$, —$(CF_2)_2O(CH_2)_{13}CH_3$ and —$(CF_2)_2O(CF_2)_2(CH_2)_3CH_3$. The alkyl group having 4 or less carbon atoms substituted with a fluorine atom in $Q_1$ to $Q_4$ may further have a substituent such as an alkoxy group or a fluoroalkoxy group.

Examples of the aryl group substituted with a fluorine atom in $Q_1$ to $Q_4$ include 2,3,4,5,6-pentafluorophenyl group, 2,3,4-trifluorophenyl group, 2,4-difluorophenyl group, 4-fluorophenyl group and 4-undecanyloxy-2,3,5,6-tetrafluorophenyl group.

Examples of the aryl group substituted with a fluorinated alkyl group in $Q_1$ to $Q_4$ include 3-trifluoromethylphenyl group, 3,5-bis(trifluoromethyl)phenyl group, 4-trifluoromethylphenyl group and 4-n-nonafluorobutylphenyl group.

By selecting the suitable acid generator, performance difference (iso/dense dependency) between dense pattern and isolated pattern can be minimized, which is preferable.

Particularly preferable examples in the acid generator are described below.

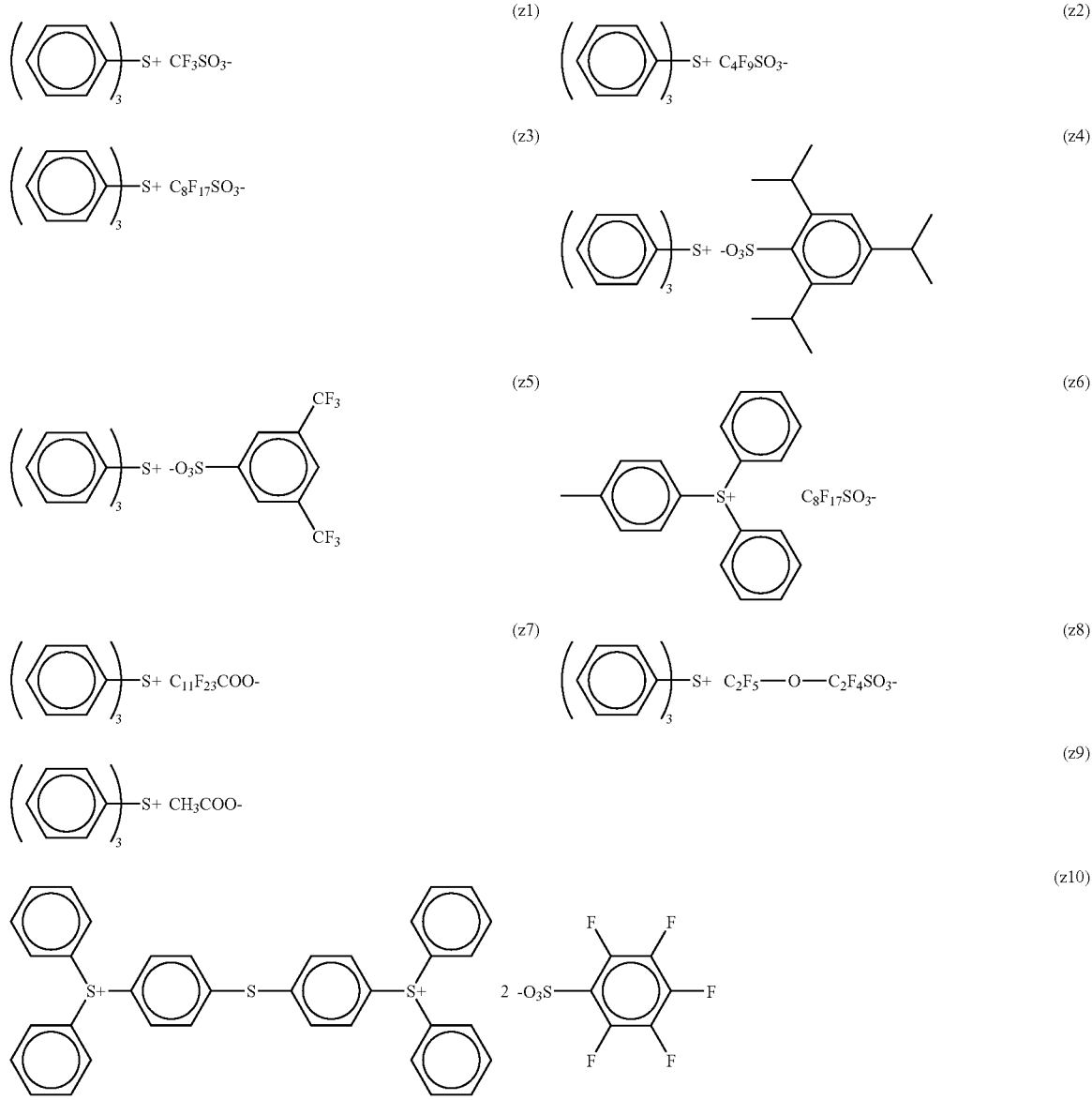

-continued
(z11) 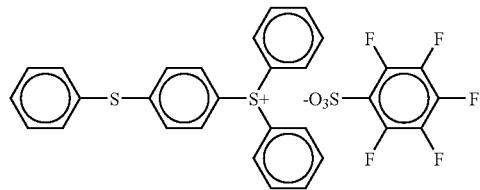
(z12) 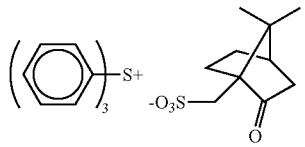
(z13) 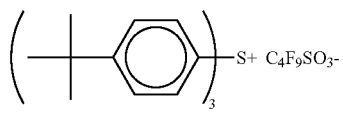
(z14) 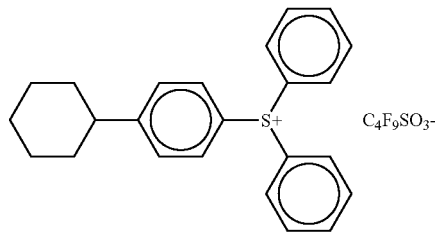
(z15) 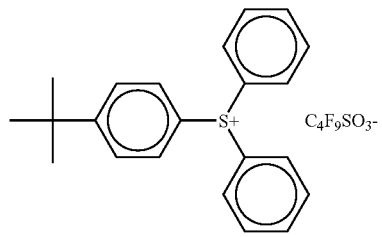
(z16) 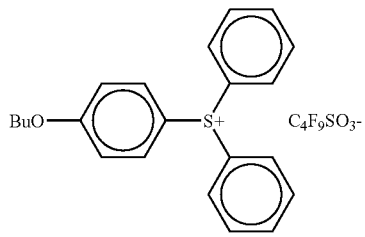
(z17) 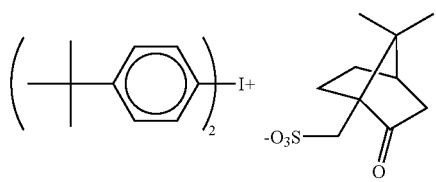
(z18) 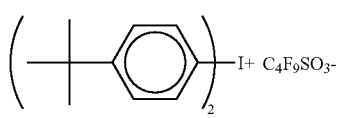
(z19) 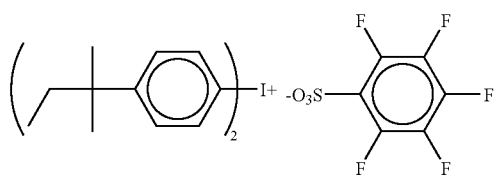
(z20) 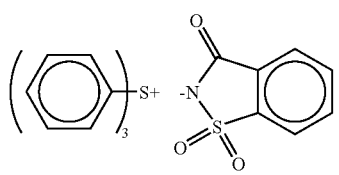
(z21) 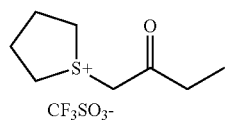
(z22) 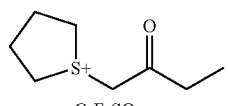
(z23) 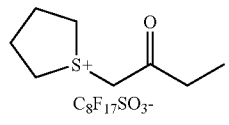
(z24) 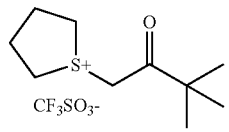
(z25) 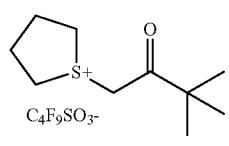
(z26) 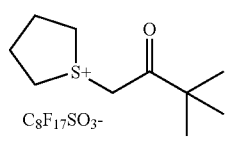
(z27) 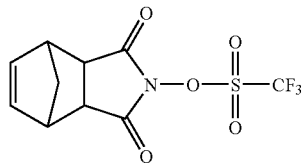
(z28) 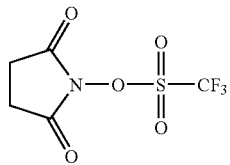

-continued
(z29) 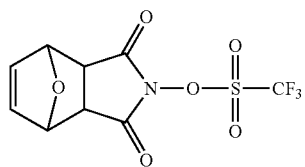
(z30) 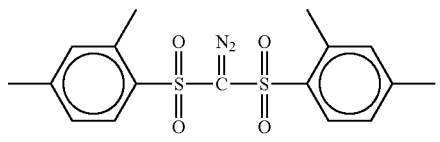
(z31) 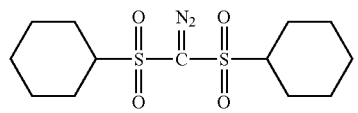
(z32) 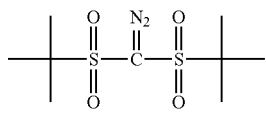
(z33) 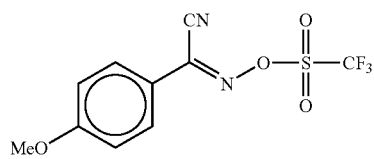
(z34) 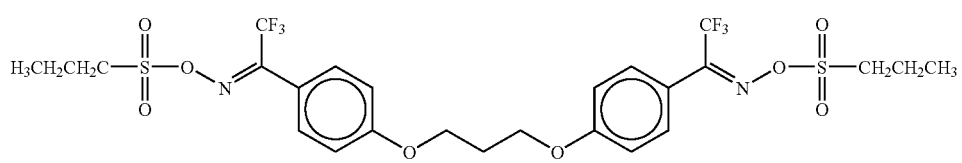
(z35) 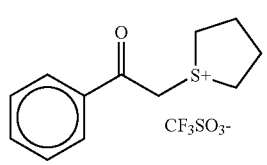
(z36) 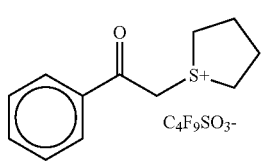
(z37) 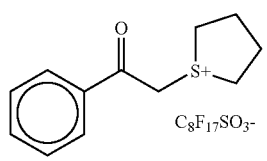
(z38) 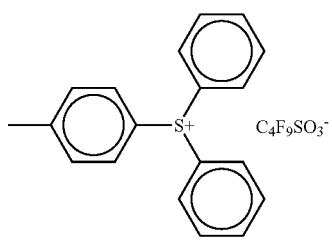
(z39) 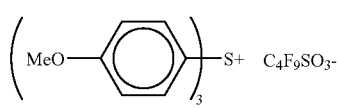
(z40) 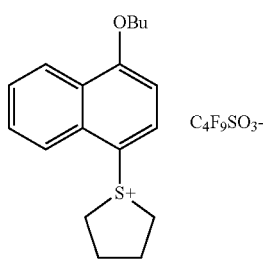
(z41) 
(z42) 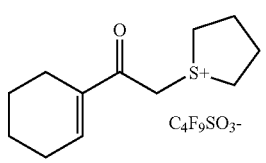

-continued
(z43) 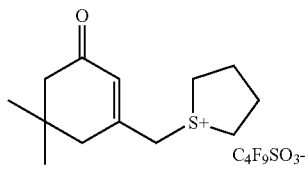
(z44) 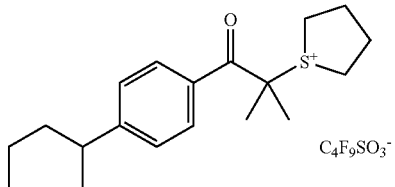
(z45) 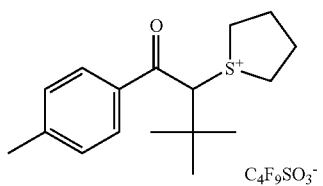
(z46) 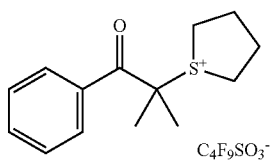
(z47) 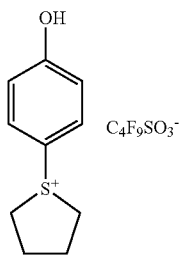
(z48) 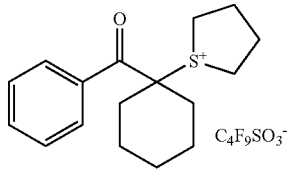
(z49) 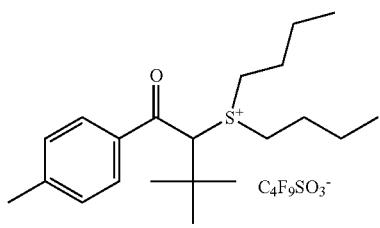
(z50) 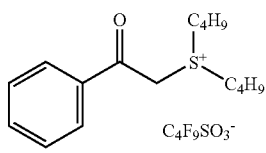
(z51) 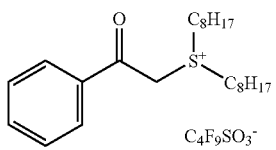
(z52) 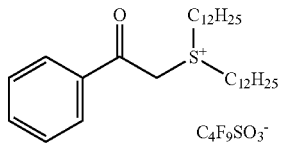
(z53) 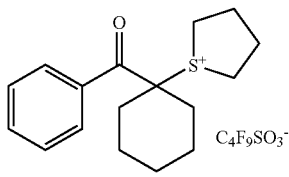
(z54) 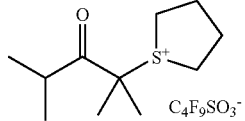
(z55) 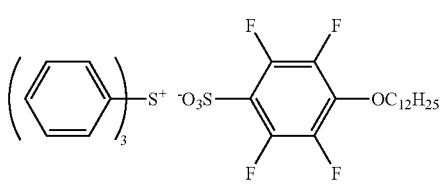
(z56) 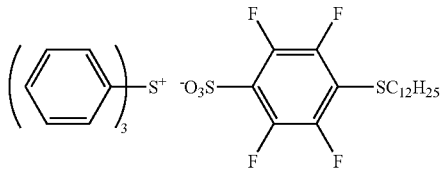
(z57) 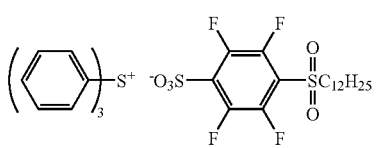
(z58) 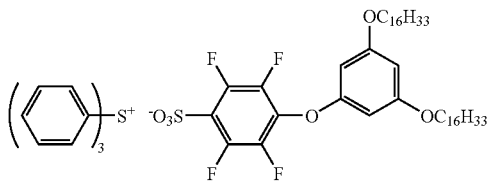

-continued
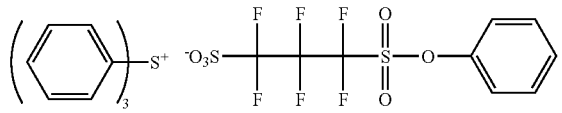 (z59)
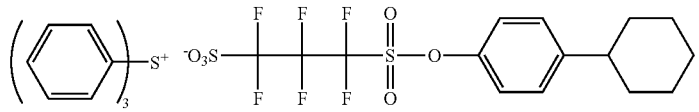 (z60)
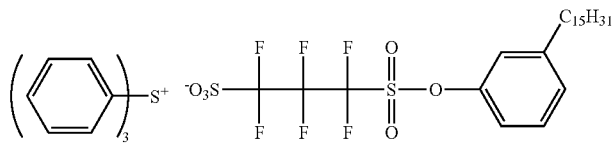 (z61)
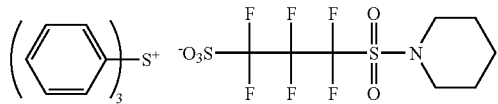 (z62)       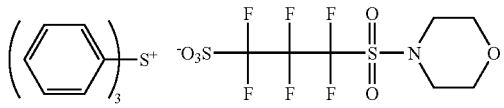 (z63)
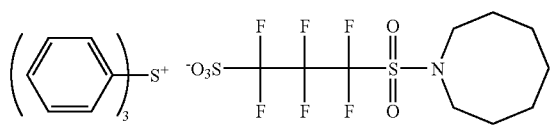 (z64)
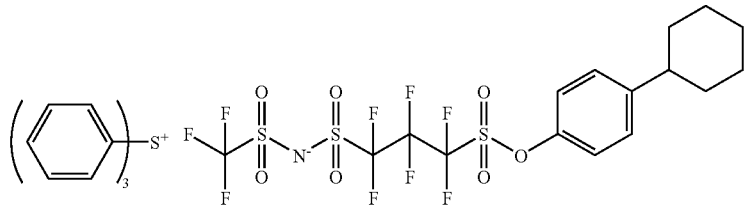 (z65)
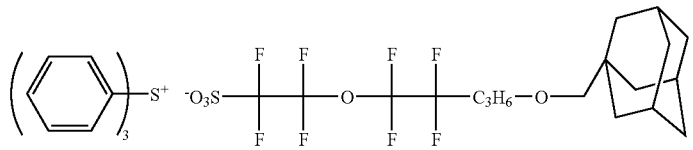 (z66)
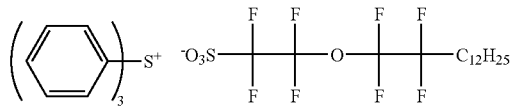 (z67)       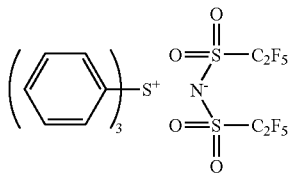 (z68)
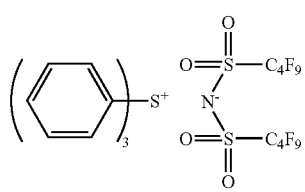 (z69)       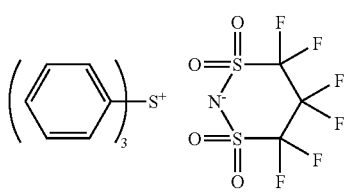 (z70)
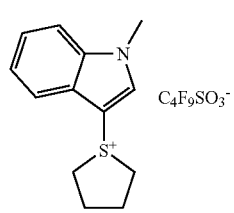 z71       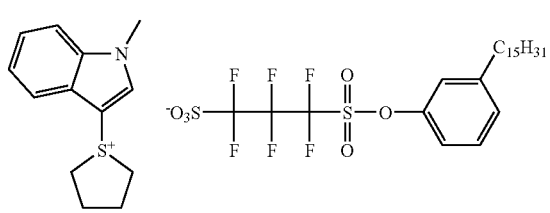 z72

-continued
(z73)
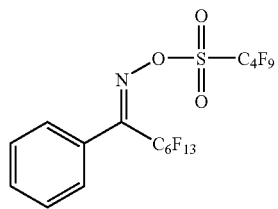
(z74)
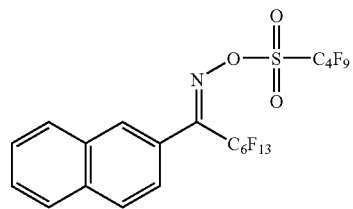
(z75)
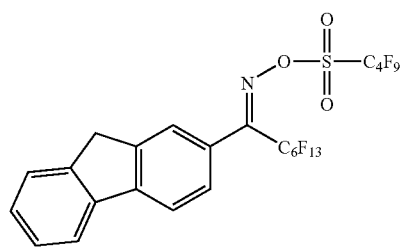
(z76)
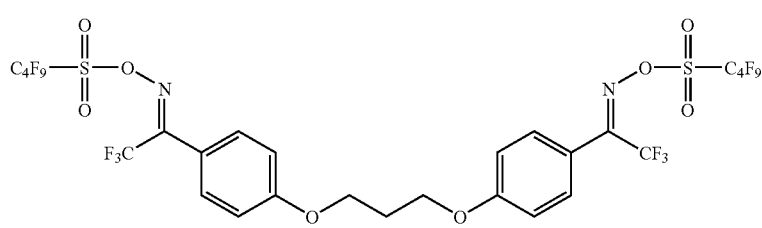
(z77)
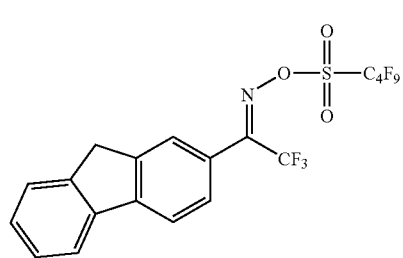
(z78)
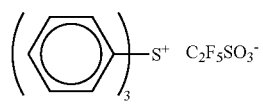
(z79)
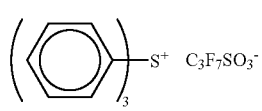
(z80)
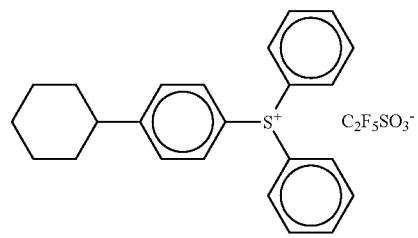
(z81)
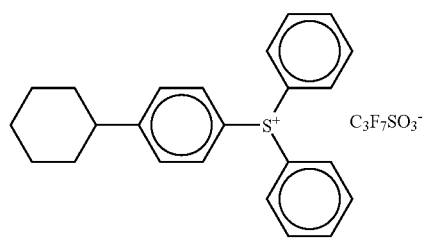
(z82)
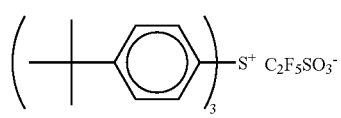

-continued
(z83)
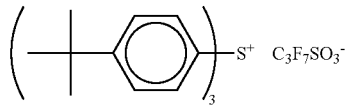 Ba-1
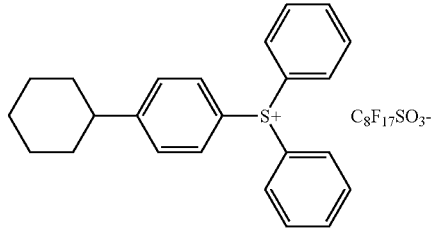 Ba-2
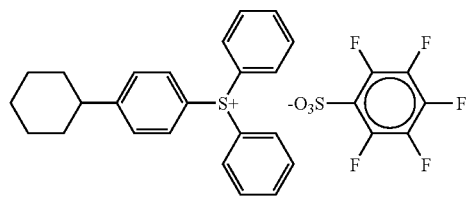 Ba-3
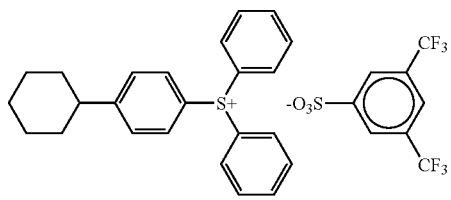 Ba-4
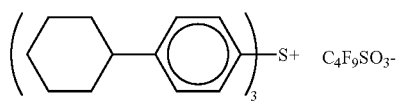 Ba-5
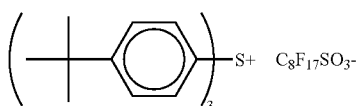 Ba-6
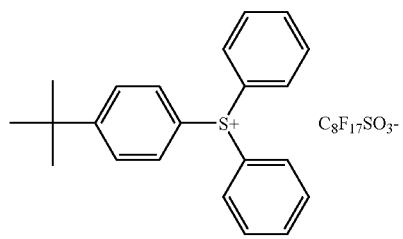 Ba-7
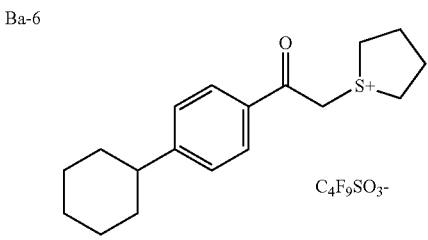 Ba-8
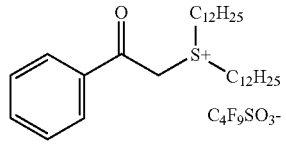 Ba-9
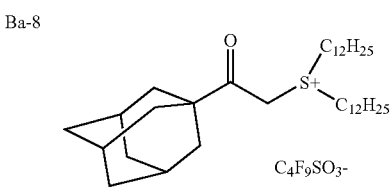 Ba-10
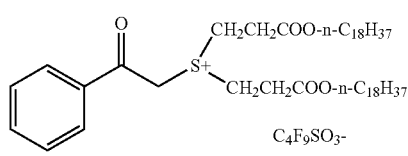 Ba-11
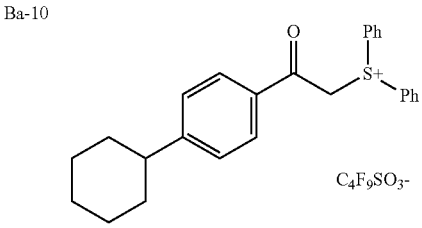 Ba-12
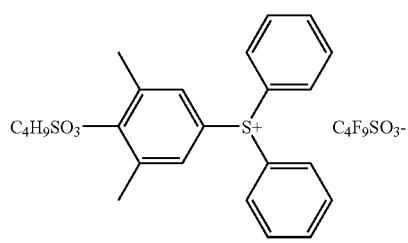 Ba-13
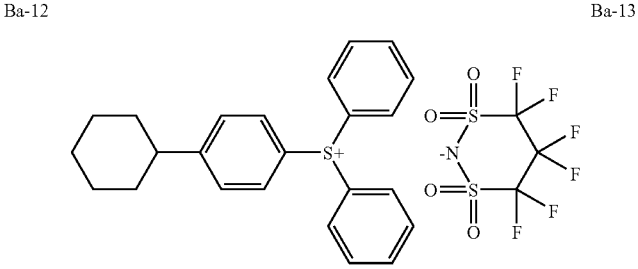

-continued
| Ba-14 | Bb-1 |
|---|---|
| 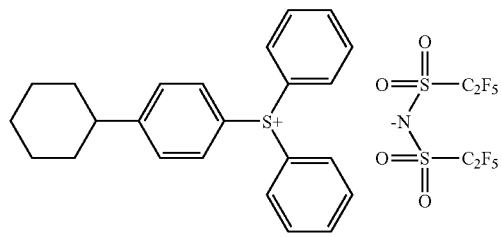 | 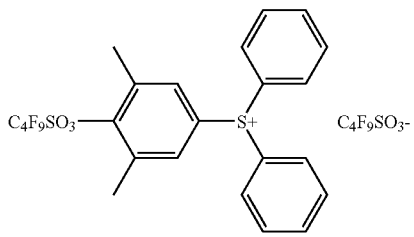 |
| Bb-2 | Bb-3 |
| 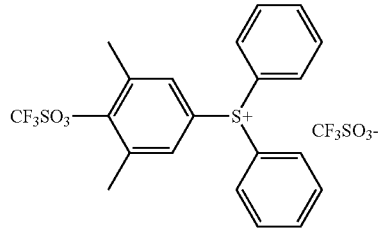 | 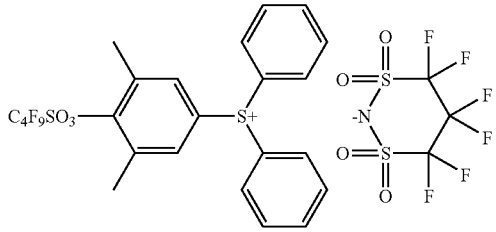 |
| Bb-4 | Bb-5 |
| 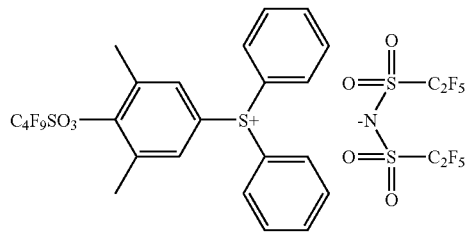 | 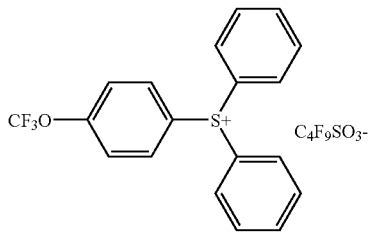 |
| Bb-6 | Bb-7 |
| 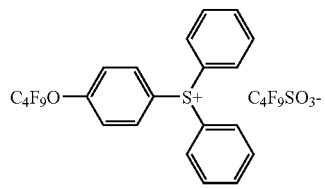 | 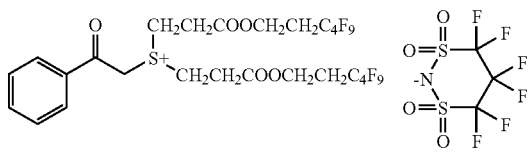 |
| Bb-8 | Bc-1 |
| 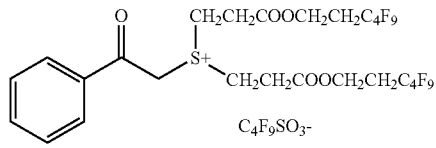 | 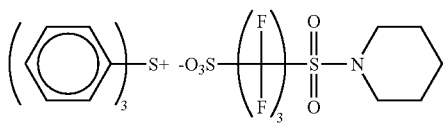 |
| Bc-2 | Bc-3 |
| 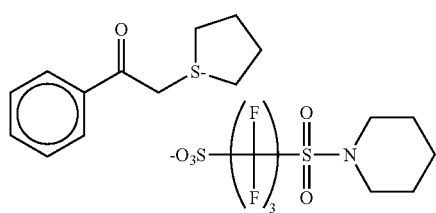 | 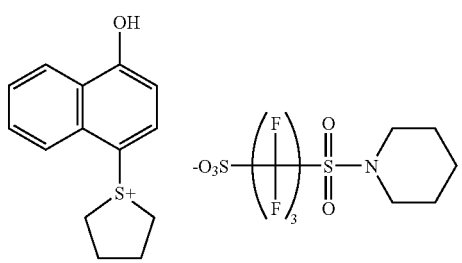 |
| Bc-4 | |
| 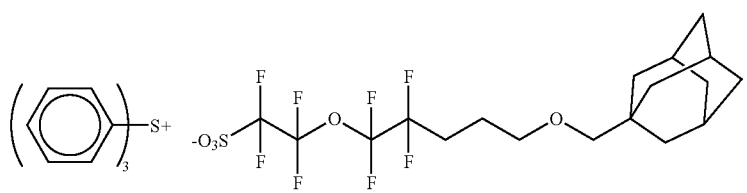 | |

-continued
Bc-5
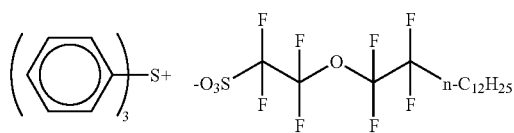
Bc-6
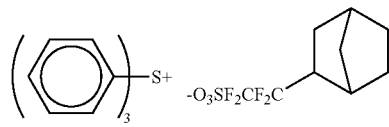
Bc-7
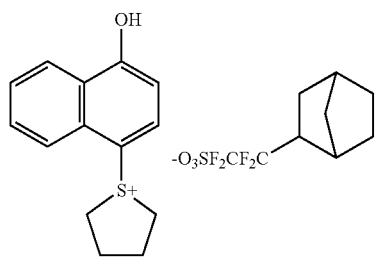
Bc-8
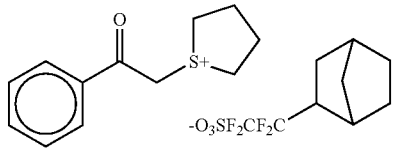
Bc-9
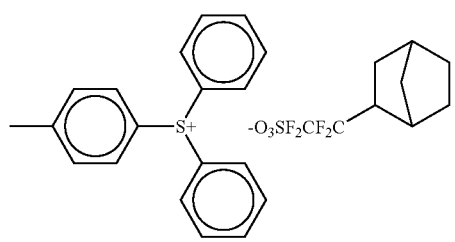
Bc-10
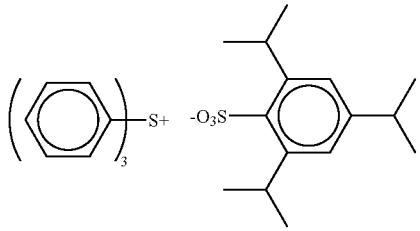
Bc-11
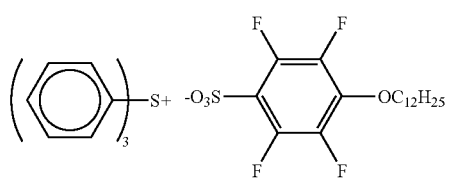
Bc-12
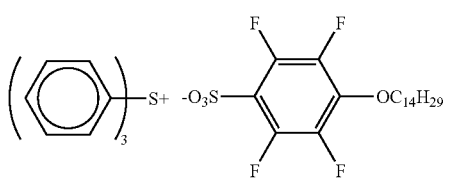
Bc-13
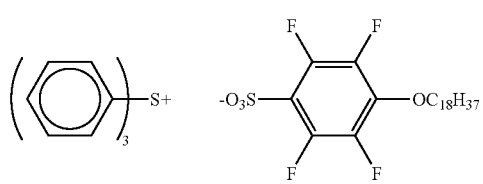
Bc-14
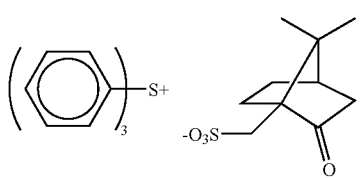
Bc-15
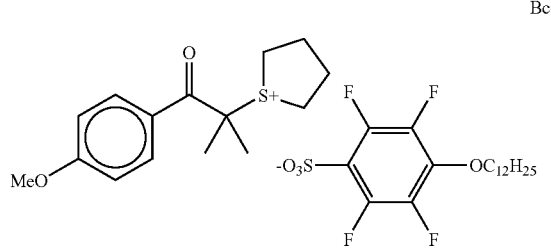
Bc-16
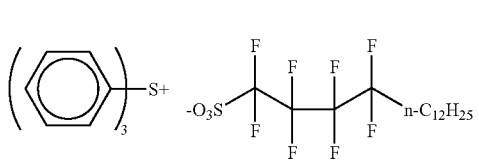
BaBc-1
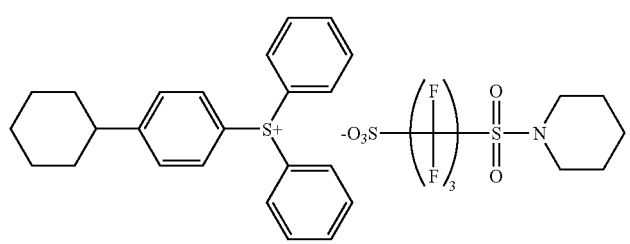

-continued
BaBc-2
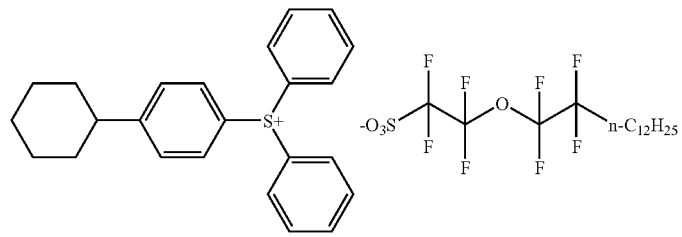
BaBc-3
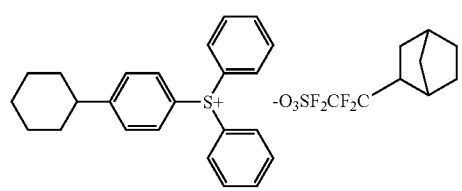
BaBc-4
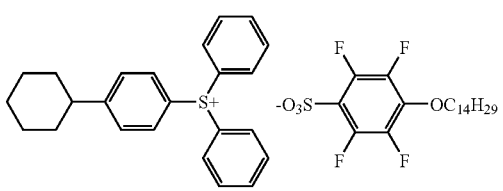
BaBc-5
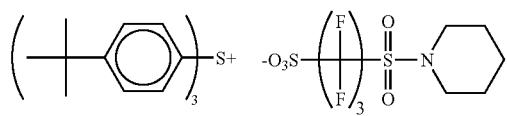
BaBc-6
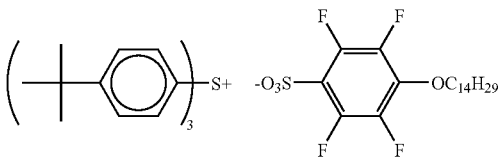
BaBc-7
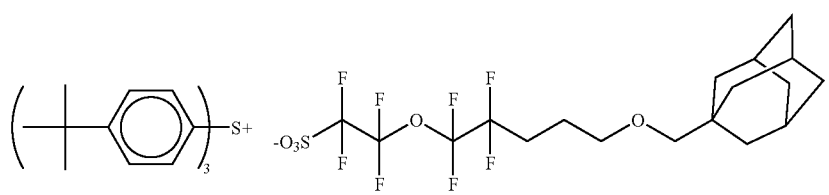
BaBc-8
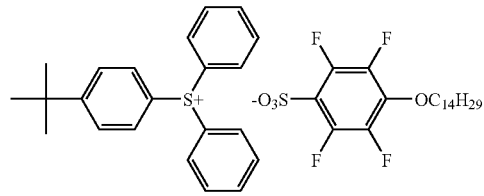
BaBc-9
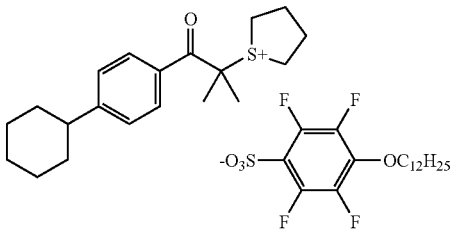
BaBc-10
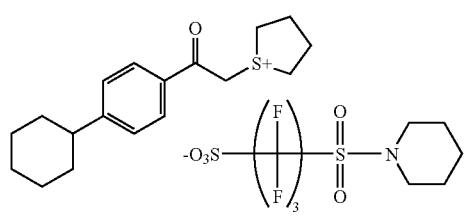
BaBc-11
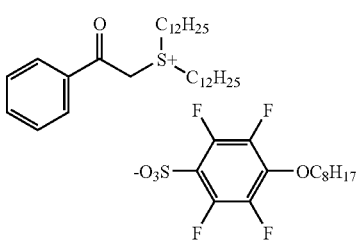
BaBc-12
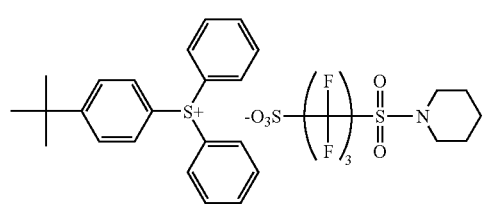
BaBc-13
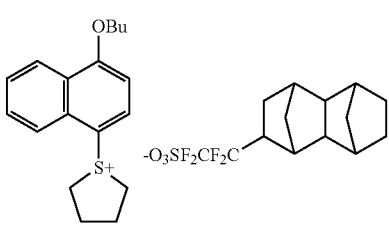

-continued
BbBc-1
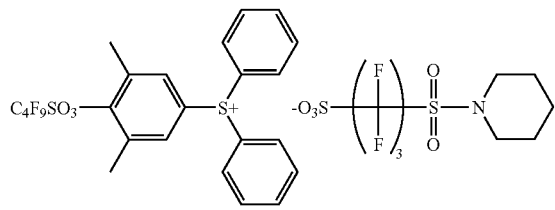
BbBc-2
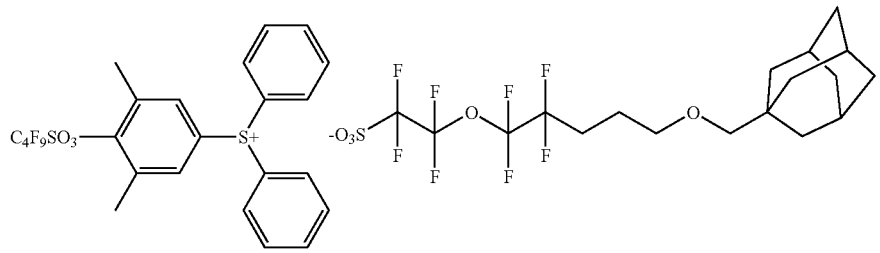
BbBc-3
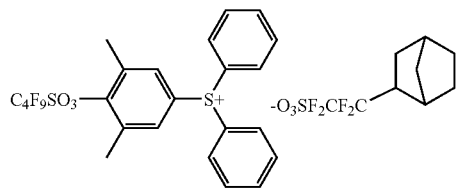
BbBc-4
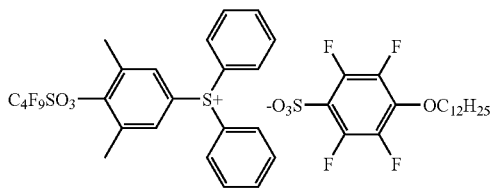
BbBc-5
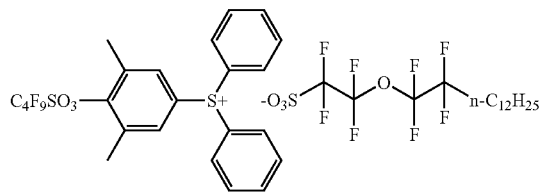
BbBc-6
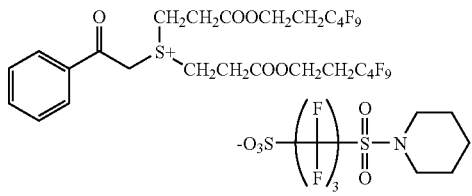
BbBc-7
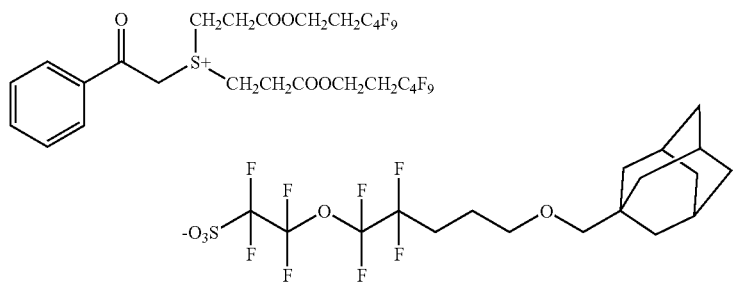
BbBc-8
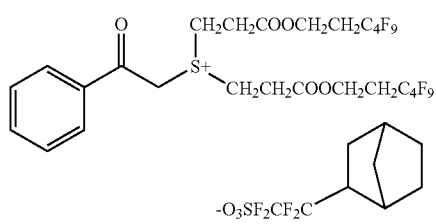
BbBc-9
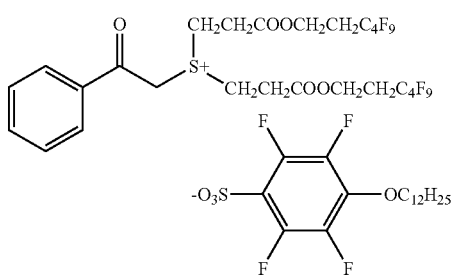

-continued
BbBc-10
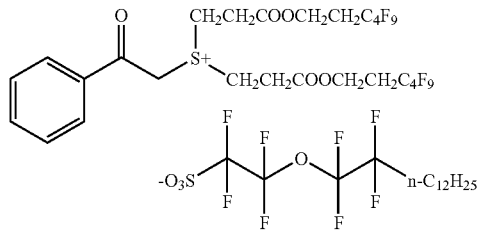
BbBc-11
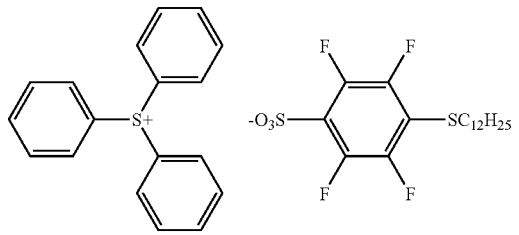
BbBc-12
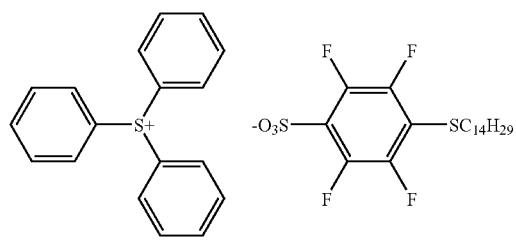
(PAG4-1)
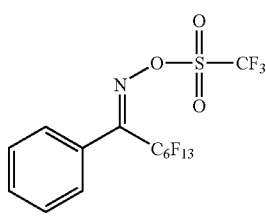
(PAG4-2)
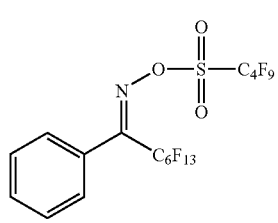
(PAG4-3)
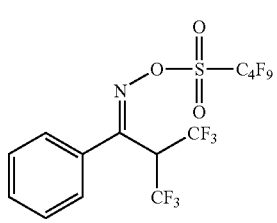
(PAG4-4)
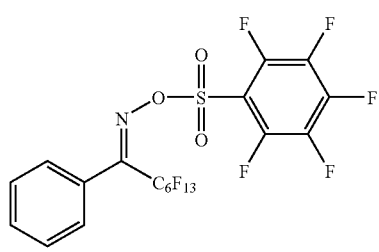
(PAG4-5)
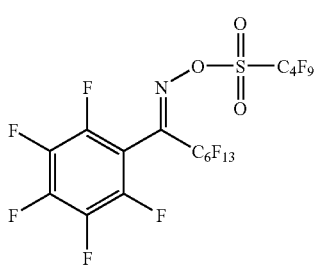
(PAG4-6)
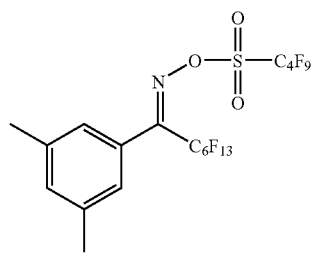
(PAG4-7)
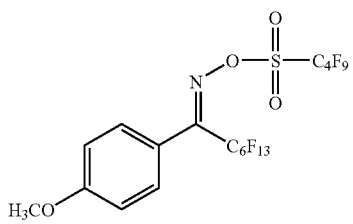
(PAG4-8)
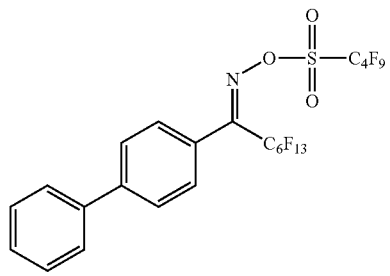
(PAG4-9)
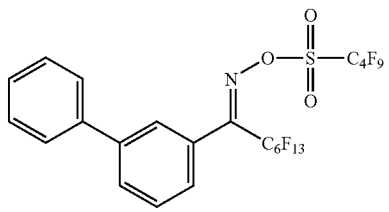

(PAG4-10)
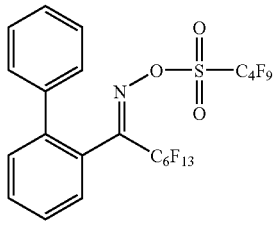
(PAG4-11)
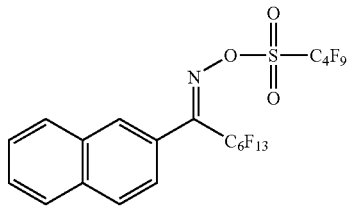
(PAG4-12)
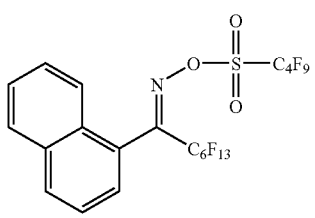
(PAG4-13)
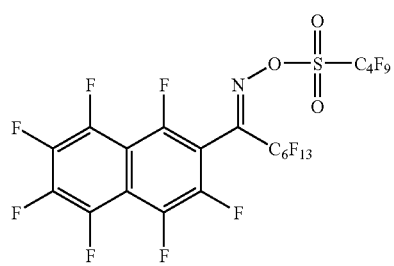
(PAG4-14)
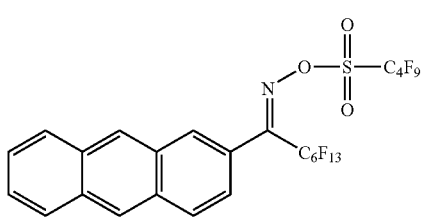
(PAG4-15)
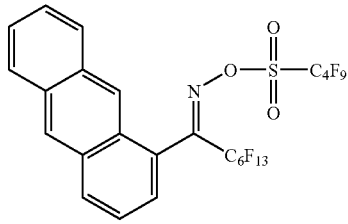
(PAG4-16)
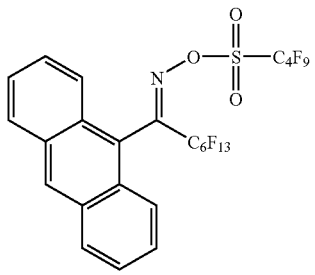
(PAG4-17)
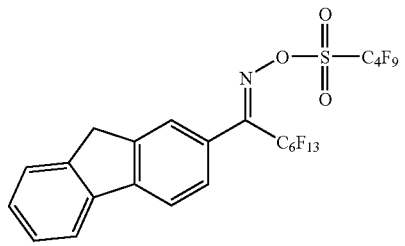
(PAG4-18)
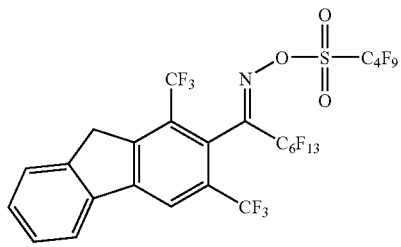
(PAG4-19)
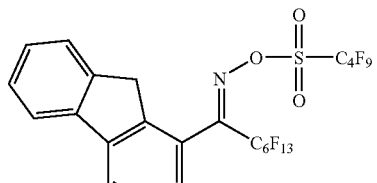
(PAG4-20)
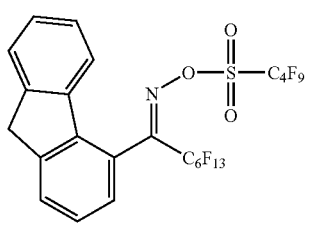

-continued

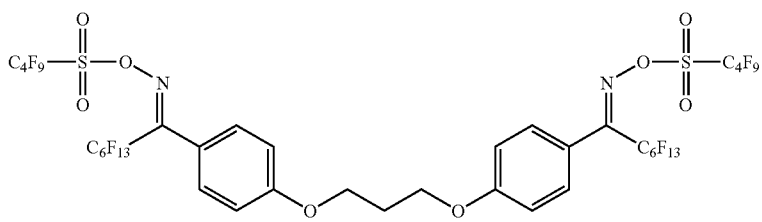
(PAG4-21)

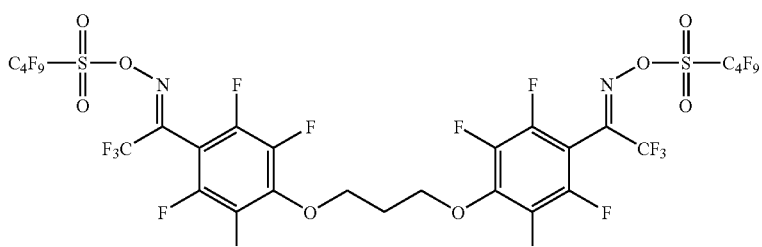
(PAG4-22)

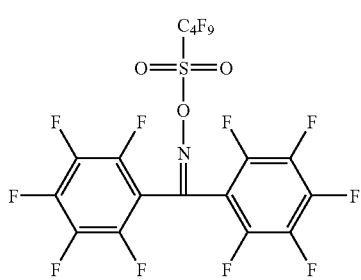
(PAG4-23)

The acid generator can be used alone or as mixtures of two or more thereof.

The content of acid generator in the positive resist composition is preferably from 0.1 to 20 mass %, more preferably from 0.5 to 10 mass %, and further preferably from 1 to 7 mass %, on the basis of the total solid contents of the positive resist composition.

[3] (C) Solvent

The positive resist composition of the present invention is used by dissolving each component in a predetermined solvent.

Examples of the solvent that can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, the solvent may be used alone or as mixtures of two or more thereof, but it is preferable to use a mixed solvent containing at least two solvents having different functional groups. The mixed solvent having different functional groups used is preferably a mixed solvent comprising a solvent having a hydroxyl group in the structure and a solvent that does not have a hydroxyl group, or a mixed solvent comprising a solvent having an ester structure and a solvent having a ketone structure. This enables generation of particles during storage of a resist solution to reduce.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Of those, propylene glycol monoethyl ether and ethyl lactate are more preferable.

Examples of the solvent that does not have a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of those, propylene glycol monomethyl ether acetate, ethyl ethoxypropionate, 2-heptanone, γ-butyrolactone, cyclohexanone and butyl acetate are more preferable, and propylene glycol monomethyl ether acetate, ethyl ethoxypropionate, 2-heptanone and cyclohexanone are particularly preferable.

Mixing ratio (mass) of the solvent having a hydroxyl group to the solvent that does not have a hydroxyl group is generally from 1/99 to 99/1, preferably from 10/90 to 90/10, and more preferably from 20/80 to 60/40. A mixing solvent containing 50 mass % or more of the solvent that not have a hydroxyl group is preferable from the point of coating uniformity.

In the mixed solvent comprising a solvent having an ester structure and a solvent having a ketone structure, examples of the solvent having a ketone structure include cyclohexanone and 2-heptanone, and cyclohexanone is preferable. Examples of the solvent having an ester structure include propylene glycol monomethyl ether acetate, ethyl ethoxypropionate, γ-butyrolactone and butyl acetate, and propylene glycol monomethyl ether acetate is preferable.

Mixing ratio (mass) of the solvent having an ester structure to the solvent having a ketone structure is generally from 1/99 to 99/1, preferably from 10/90 to 90/10, and more preferably from 20/80 to 60/40. A mixing solvent containing 50 mass % or more of the solvent having an ester structure is preferable from the point of coating uniformity.

[4] (D) Basic Compound

The positive resist composition of the present invention preferably contains a basic compound in order to, for example, reduce performance change with time of from exposure to heating.

Preferable examples of the basic compound include the compounds having structures represented by the following formulae (A) to (E).

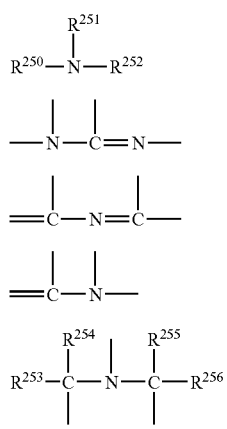

In the above formulae, $R^{250}$, $R^{251}$ and $R^{252}$ each independently represent a hydrogen atom, an alkyl group having from 1 to 20 carbon atoms, a cycloalkyl group having from 3 to 20 carbon atoms or an aryl group having from 6 to 20 carbon atoms. $R^{250}$ and $R^{251}$ may be bonded with each other to form a ring. Those groups may have a substituent. The alkyl group and cycloalkyl group, having a substituent are preferably an aminoalkyl group having from 1 to 20 carbon atoms or an aminocycloalkyl group having from 3 to 20 carbon atoms, and a hydroxyalkyl group having from 1 to 20 carbon atoms or a hydroxycycloalkyl group having from 3 to 20 carbon atoms.

Those may contain an oxygen atom, a sulfur atom or a nitrogen atom in the alkyl chain.

In the above formulae, $R^{253}$, $R^{254}$, $R^{255}$ and $R^{256}$ each independently represent an alkyl group having from 1 to 20 carbon atoms or a cycloalkyl group having from 3 to 20 carbon atoms.

Examples of the preferable compound include guanidine, aminopyrrolidine, pyrazole, pyrazoline, piperazine, aminomorpholine, aminoakylmorpholine and piperidine. Those may have a substituent. Examples of the further preferable compound include a compound having an imidazole structure, diazabicyclo structure, an onium hydroxide structure, an onium carboxylate structure, a trialkylamine structure, an aniline structure or a pyridine structure, an alkylamine derivative having a hydroxyl group and/or an ether structure, and an aniline derivative having a hydroxyl group and/or an ether structure. A compound having the aniline structure is most preferred. By selecting the suitable basic compound, performance difference (iso/dense dependency) between dense pattern and isolated pattern can be minimized, which is preferable.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]nona-5-ene and 1,8-diazabicyclo[5,4,0]undeca-7-ene. Examples of the compound having an onium hydroxide structure triarylsulfonium hydroxide, phenacylsulfonium hydroxide and sulfonium hydroxide having 2-oxoalkyl group, and specifically include triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is a compound having an onium carboxylate structure in which an anion moiety is a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether group include ethanolamine, diethanolamine, triethanolamine and tris(methoxyethoxyethyl)amine. Example of the aniline derivative having a hydroxyl group and/or an ether group includes N,N-bis(hydroxyethyl)aniline.

In the positive resist composition of the present invention, the basic compound is used alone or as mixtures of two or more thereof. The basic compound is used in a total amount of generally from 0.001 to 10 mass %, and preferably from 0.01 to 5 mass %, on the basis of the solid content of the positive resist composition. The amount of 0.001 mass % or more is preferable on obtaining a sufficient addition effect, and the amount of 10 mass % or less is preferable in the point of sensitivity and developability of non-exposed area.

[5] (E) Dissolution-inhibiting Compound Having a Molecular Weight of 3,000 or Less that Decomposes by the Action of an Acid to Increase Solubility in an Alkali Developer (Hereinafter Referred to as "Component (E)" or "Dissolution-inhibiting Compound")

The dissolution-inhibiting compound having a molecular weight of 3,000 or less that decomposes by the action of an acid to increase solubility in an alkali developer is preferably an alicyclic or aliphatic compound containing an acid-decomposable group, such as a cholic acid derivative containing an acid-decomposable group as described in Proceeding of SPIE, 2724, 355 (1996), in order to not decrease permeability of 220 nm or less. The acid-decomposable group and the alicyclic structure are the same as those described in the alicyclic hydrocarbon series acid-decomposable resin.

When the positive resist composition of the present invention is exposed with KrF excimer laser, or irradiated with radiation, the dissolution-inhibiting compound is preferably a compound having a structure that a phenolic hydroxyl group of a phenol compound is substituted with an acid-decomposable group. The phenol compound contains preferably from 1 to 9, and more preferably from 2 to 6, phenol skeletons.

The dissolution-inhibiting compound in the present invention has a molecular weight of 3,000 or less, preferably from 300 to 3,000, and further preferably from 500 to 2,500.

The dissolution-inhibiting compound is added in an amount of preferably from 3 to 50 mass %, and more preferably from 5 to 40 mass %, to the solid content of the positive resist composition.

Specific examples of the dissolution-inhibiting compound are described below, but the invention is not limited to those.

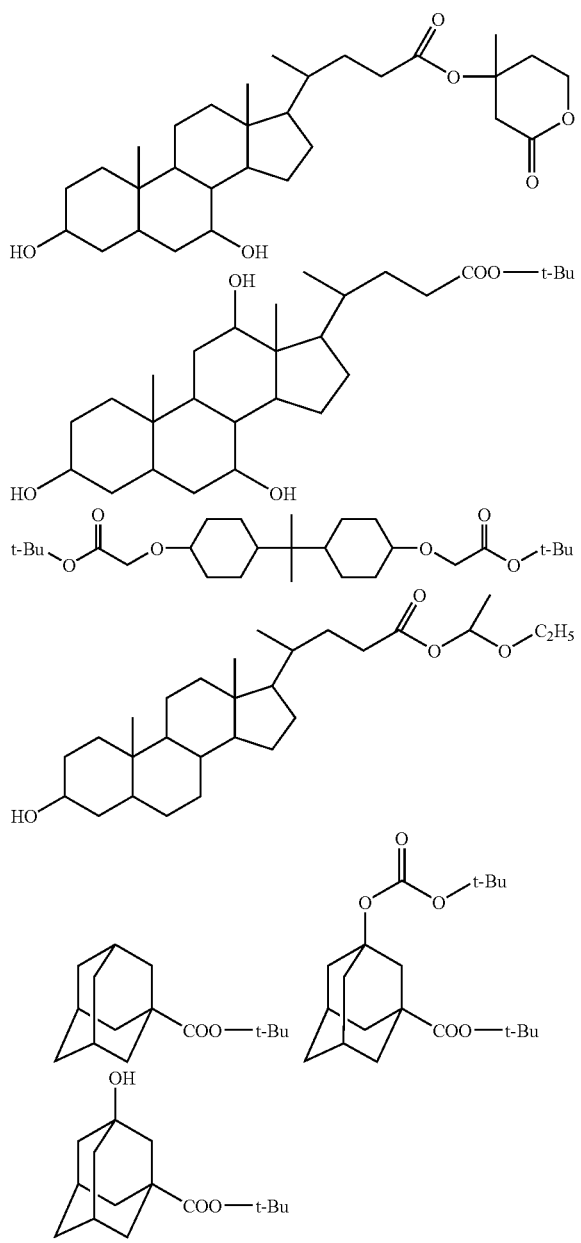

[6] (F) Surfactant

The positive resist composition of the present invention preferably contains a surfactant, and more preferably contains any of fluorine series and/or silicon series surfactants (a fluorine series surfactant, a silicon series surfactant, and a surfactant containing both a fluorine atom and a silicon atom), or two or more of those.

When the positive resist composition of the present invention contains fluorine series and/or silicon series surfactants, it becomes possible to give a resist pattern having adhesion and less development defect with good sensitivity and resolution particularly when using an exposure light source of 250 nm or less, particularly 220 nm or less.

Examples of those fluorine series and/or silicon series surfactants include surfactants described in, for example, JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S Pat. No. 5,405,720, U.S. Pat. No. 5,360,692, U.S. Pat. No. 5,529,881, U.S. Pat. No. 5,296,330, U.S Pat. No. 5,436,098, U.S. Pat. No. 5,576,143, U.S. Pat. No. 5,294,511 and U.S. Pat. No. 5,824,451. The following commercially available surfactants can be used as are.

Examples of the commercial available surfactants that can be used include fluorine surfactants or silicon surfactants, such as EFTOP EF301 and EF303 (products of Shin-Akita Kasei), Fluorad FC430, 431 and 4430 (products of Sumitomo 3M Co.), Megafac F171, F173, F176, F189, F113, F110, F177, F120 and R08 (products of Dainippon Ink and Chemicals, Incorporated), Surfron S-382, SCO101, 102, 103, 104, 105 and 106 (products of Asahi Glass Co.), Troy Sol S-366 (a product of Troy Chemical Industries), GF-300 and GF-150 (products of Toagosei Chemical Co.), Surfron S-393 (a product of Seimi Chemical Co.), EFTOP EF121, EF121A, EF122B, RF122C, EF125M, EF135M, EF351, EF352, EF801, EF802 and EF601 (products of Jemco Inc.), PF636, PF656, PF6320 and PF6520 (products of OMNOVA), and FTX204D, 208G, 218G, 230G, 204D, 208D, 212D, 218 and 222D (products of Neos Co.). Further, a polysiloxane polymer KP-341 (a product of Shin-Etsu Chemical Co.) can be used as a silicon series surfactant.

Other than the above-described conventional surfactants, surfactants using a polymer having a fluoroaliphatic group derived from a fluoroaliphatic compound produced by a telomerization method (called a telomer method) or an oligerization method (called an oligomer method) can be used. The fluoroaliphatic compound can be synthesized by the method described in JP-A-2002-90991.

The polymer having a fluoroaliphatic group is preferably a copolymer of a monomer having a fluoroaliphatic group, and a (poly(oxyalkylene))acrylate and/or a (poly(oxyalkylene)) methacrylate, and may be distributed irregularly or may be block-copolymeriozed. Examples of the poly(oxyalkylene) group include a poly(oxyethylene) group and a poly(oxypropylene) group. It may be a unit having different chain length alkylenes in the same chain length, such as a poly(block-linked body of oxyethylene, oxypropylene and oxyethylene) or a poly(block-linked body of oxyethylene and oxypropylene). Further, the copolymer of a monomer having a fluoroaliphatic group, and a (poly(oxyalkylene))acrylate (or methacrylate) may be not only a bipolymer but a ternary or more copolymer obtained by simultaneously copolymerizing two kinds or more of different (poly(oxyalkylene))acrylates (or methacrylates).

The commercially available surfactants are, for example, Megafac F178, F-470, F-473, F-475, F-476 and F-472 (products of Dainippon Ink and Chemicals, Incorporated). Further examples include a copolymer of an acrylate (or methacrylate) having $C_6F_{13}$ group and a (poly(oxyalkylene))acrylate (or methacrylate), a copolymer of an acrylate (or methacrylate) having $C_6F_{13}$ group and a (poly(oxypropylene))acrylate (or methacrylate), a copolymer of an acrylate (or methacrylate) having $C_8F_{17}$ group and a (poly(oxyalkylene))acrylate (or methacrylate) and a copolymer of an acrylate (or methacrylate) having $C_8F_{17}$ group, a (poly(oxyethylene))acrylate (or methacrylate) and a (poly(oxypropylene))acrylate (or methacrylate).

The present invention can use surfactants other than the fluorine series and/or silicon series surfactants. The other surfactants are, for example, nonionic surfactants, and specific examples thereof include polyoxyethylene alkyl ethers such as a polyoxyethylene lauryl ether, a polyoxyethylene stearyl ether, a polyoxyethylene cetyl ether and a polyoxyethylene oleyl ether; polyoxyethylene alkylallyl ethers such as a polyoxyethylene octylphenol ether and a polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as a polyoxyethylene sorbitan monolaurate, a poloxyethylene sorbitan monopalmitate, a poloxyethylene sorbitan monostearate, a poloxyethylene sorbitan trioleate and a poloxyethylene sorbitan tristearate.

The surfactant may be used alone or as mixtures of two or more thereof.

The surfactant is used in an amount of preferably from 0.0001 to 2 mass %, and more preferably from 0.001 to 1 mass %, to the whole amount (excluding a solvent) of the positive resist composition.

[Other Additives]

The positive resist composition of the present invention can further contain a dye, a light absorber, a plasticizer, a surfactant other than the above component (E), a photosensitizer, a compound that promotes solubility to a developer, and the like, according to need.

The dissolution-promoting compound to a developer that can be used in the present invention is a compound having a molecular weight of 1,000 or less, having at least two phenolic OH groups or at least one carboxyl group. In the case of having a carboxyl group, an alicyclic or aliphatic compound is preferable.

Those dissolution-promoting compounds are added in an amount of preferably from 2 to 50 mass %, and more preferably from 5 to 30 mass %, to the resin of the component (A). The amount of 50 mass % or less is preferable in the points of suppression of development residue and prevention of pattern deformation during developing.

On skilled in the art can easily synthesize such a compound having a molecular weight of 1,000 or less by referring to the methods as described in, for example, JP-A-4-122938, JP-A-2-28531, U.S. Pat. No. 4,916,210 and European Patent 219294.

Specific examples of the alicyclic or aliphatic compound having a carboxyl group include carboxylic acid derivatives having a steroid structure, such as cholic acid, deoxycholic acid and lithocholic acid, adamantane carboxylic acid derivatives, adamantane dicarboxylic acid, cyclohexane carboxylic acid and cyclohexane dicarboxylic acid. However, the invention is not limited to those.

In addition to the commercially available compounds having a molecular weight of 1,000 or less having the effect to decrease a softening point of a film can be used without particular limitation as the plasticizer. From the standpoint of solubility, the molecular weight of 750 or less is preferable, and the molecular weight of 500 or less is more preferable. A compound having a boiling point of 300° C. or higher and a melting point of 20° C. or lower, under ordinary pressure is preferable. Specific examples of the compound include diisobutyl phthalate, tricresyl phosphate, triethylene glycol diphenyl ether, diethylene glycol dibenzoate and triethylene glycol diacetate.

A compound that has absorption in exposure wavelength and does not generate an acid by exposure can be used without particular limitation as the light absorber. When wavelength of the light source is 193 nm, a compound having an aromatic ring is preferable. Specific examples of the compound include benzene derivatives, naphthalene derivatives, anthracene derivatives, furan derivatives, thiophene derivatives and indole derivatives.

In the present invention, surfactants other than the above-described fluorine series and/or silicon series surfactants can be added. Specific examples of the other surfactants include nonionic surfactants such as polyoxyethylene alkyl ethers, polyoxyethylene alkylallyl ethers, polyoxyethylene-polyoxypropylene block copolymers, sorbitan aliphatic acid esters and polyoxyethylene sorbitan aliphatic esters.

Those surfactants may be added alone, or can be added as mixtures of two or more thereof.

Where the resist film comprising the positive resist composition of the invention is exposed through immersion water, it is preferable to further add a surface hydrophobizing resin. By this, sweepback contact angle of the resist film surface with respect to the immersion water can be improved, and immersion water follow-up properties can be enhanced. As a result, development defect can be reduced. The surface hydrophobizing resin can be any material so long as it is a resin that improves the sweepback contact angle of the resist film surface with respect to the immersion water by the addition thereof. A resin having at least one of a fluorine atom and a silicon atom is preferable. The addition amount can appropriately be adjusted such that the sweepback contact angle of the resist film surface with respect to the immersion water is from 60 to 80°, and is preferably from 0.1 to 5 mass %. The sweepback contact angle with respect to the immersion water is a sweepback contact at which the droplet of the immersion water starts to drop by inclining the resist film surface.

(Pattern Formation Method)

The positive resist composition of the present invention is used by dissolving the above-described components in a predetermined solvent, preferably the above-described mixed solvent, and applying the resulting solution to a predetermined support as follows.

For example, the positive resist composition is applied to a substrate (for example, silicon/silicon dioxide coating) as used in production of a precision integrated circuit element by an appropriate coating method of a spinner, coater or the like, and dried to form a resist film.

The resist film is irradiated with actinic ray or radiation through a predetermined mask, preferably baked, and developed. By this, a good pattern can be obtained.

At the time of irradiation with actinic ray or radiation, exposure (liquid immersion exposure) may be conducted by filling a space between the resist film and a lens with a liquid having a refractive index higher than that of air. By this, resolution can be increased.

Example of actinic ray or radiation include infrared light, visible light, ultraviolet light, far ultraviolet light, X ray and electron beam. Far ultraviolet light having a wavelength of 250 nm or less is preferable, and far ultraviolet light having a wavelength of 220 nm or less is more preferable. Specific examples include KrF excimer laser (248 nm), ArF excimer laser (193 nm), $F_2$ excimer laser (157 run), X ray and electron beam. ArF excimer laser, $F_2$ excimer laser, EUV (13 nm) and electron beam are preferable.

In a development step, the alkali developer is used as follows. The alkali developer of the resist composition can use an alkaline aqueous solution of inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyl diethylamine; alcohol amines such as dimethyl ethanol amine and triethanol amine; quaternary ammonium salts such as tetramethyl ammonium hydroxide and tetraethyl ammonium hydroxide; and cyclic amines such as pyrrole and piperidine.

Further, alcohols or surfactants can be added to the alkali developer in an appropriate amount, and such a developer can be used.

The alkali developer has an alkali concentration of generally from 0.1 to 20 mass %.

The alkali developer has pH of generally from 10.0 to 15.0.

EXAMPLE

The present invention is described in detail below by the Examples, but it should be understood that the invention is not construed as being limited thereto.

Synthesis Example 1

Synthesis of Monomer-4

The following compound A described in Monatsh. Chem. 1997 (128), 509-528 was reacted with 1.5 equivalents of methacrylic acid chloride and 2 equivalents of triethylamine in an acetone solvent under the conditions of ice-cooling and a reaction time of 1 hour, and the reaction mixture was purified with a column chromatography (hexane:ethyl acetate=10:1) to obtain the following oily monomer-4 in a yield of 72%.

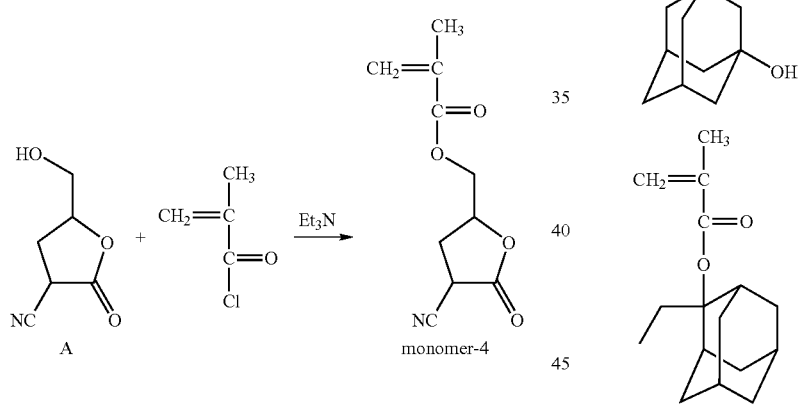

Synthesis Example 2

Synthesis of resin (RA-1)

Monomer-1, monomer-2 and monomer-3 represented by the following structural formulae were charged in proportions (molar ratio) of 40/20/40, and dissolved in PGMEA (propylene glycol monomethyl ether acetate)/PGME (propylene glycol monomethyl ether)=7/3 (mass ratio) to prepare 450 g of a solution having a solid concentration of 15 mass %. A polymerization initiator V-601 (a product of Wako Pure Chemical Industries, Ltd.) was added to this solution in an amount of 1 mol %. The resulting solution was added dropwise to 50 g of a mixed solution of PGMEA (propylene glycol monomethyl ether acetate)/PGME (propylene glycol monomethyl ether)=7/3 (mass ratio) heated to 100° C. over 6 hours under nitrogen atmosphere. After completion of the addition, the reaction liquid was stirred for 2 hours. After completion of the reaction, the reaction liquid was cooled to room temperature, and crystallized in 5 liters of a mixed solvent of hexane/ethyl acetate=9/1. The precipitated white powder was filtered off to recover a resin (RA-1) as the desired product.

Polymer compositional ratio obtained from NMR was 40/20/40. Further, a weight average molecular weight in terms of a standard polystyrene conversion obtained from GPC measurement was 8,300, and the degree of dispersion was 1.95.

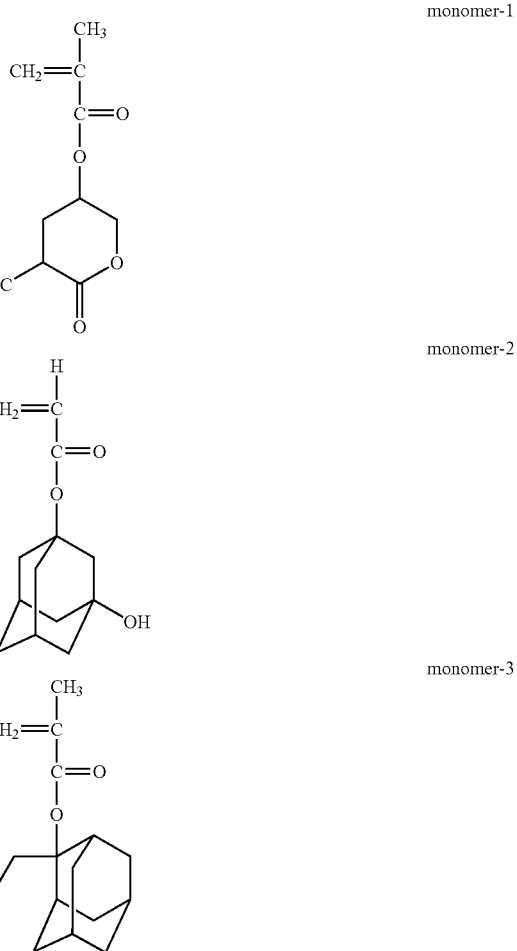

Synthesis Example 3

Synthesis of resin (RA-2)

Monomer-4, monomer-5 and monomer-6 represented by the following structural formulae were charged in proportions (molar ratio) of 50/15/35, and dissolved in cyclohexane to prepare 450 g of a solution having a solid concentration of 15 mass %. A polymerization initiator V-60 (a product of Wako Pure Chemical Industries, Ltd.) was added to this solution in an amount of 1 mol %. The resulting solution was added dropwise to 50 g of cyclohexane heated to 100° C. over 6 hours under nitrogen atmosphere. After completion of the addition, the reaction liquid was stirred for 2 hours. After completion of the reaction, the reaction liquid was cooled to room temperature, and crystallized in 5 liters of methanol. The precipitated white powder was filtered off to recover a resin (RA-2) as the desired product.

Polymer compositional ratio obtained from NMR was 50/15/35. Further, a weight average molecular weight in terms of a standard polystyrene conversion obtained from GPC measurement was 7,900, and the degree of dispersion was 1.85.

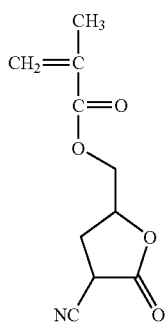

monomer-4

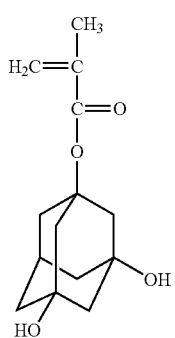

monomer-5

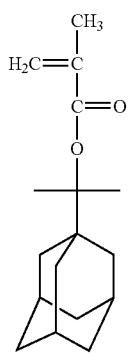

monomer-6

Resins (RA-3) to (RA-39) and resins (RP-1) to (RP-5) were synthesized in the same manners as in Synthesis Examples 2 to 3.

Structure, compositional ratio, weight average molecular weight and degree of dispersion of the resins (RA-1) to (RA-15) and resins (RP-1) to (RP-3) are shown in Table below.

TABLE 1

| Resin | Structure | Compositional ratio (Molar ratio) | Mw | Mw/Mn |
|---|---|---|---|---|
| RA-1 | A-1 | 40/20/40 | 8300 | 1.95 |
| RA-2 | A-2 | 50/15/35 | 7900 | 1.85 |
| RA-3 | A-3 | 50/10/40 | 8600 | 1.96 |
| RA-4 | A-4 | 50/10/30/10 | 9100 | 1.83 |
| RA-5 | A-5 | 30/25/45 | 9100 | 1.90 |
| RA-6 | A-6 | 30/20/40/10 | 9400 | 1.82 |

TABLE 1-continued

| Resin | Structure | Compositional ratio (Molar ratio) | Mw | Mw/Mn |
|---|---|---|---|---|
| RA-7 | A-7 | 50/10/40 | 7400 | 1.87 |
| RA-8 | A-8 | 55/45 | 8400 | 2.01 |
| RA-9 | A-9 | 40/10/50 | 9000 | 1.90 |
| RA-10 | A-10 | 60/30/10 | 8000 | 1.84 |
| RA-11 | A-4 | 30/20/40/10 | 8200 | 1.98 |
| RA-12 | A-3 | 50/10/40 | 7700 | 1.98 |
| RA-13 | A-8 | 50/50 | 8100 | 2.06 |
| RA-14 | A-10 | 55/40/5 | 5600 | 1.79 |
| RA-15 | A-3 | 40/20/40 | 5600 | 1.79 |
| RP-1 | P-1 | 40/20/40 | 8000 | 1.94 |
| RP-2 | P-2 | 30/20/50 | 7910 | 1.91 |
| RP-3 | P-1 | 40/20/40 | 8100 | 2.06 |

Structures (A-1) to (A-10) and (P-1) to (P-2) in Table 1 are shown below.

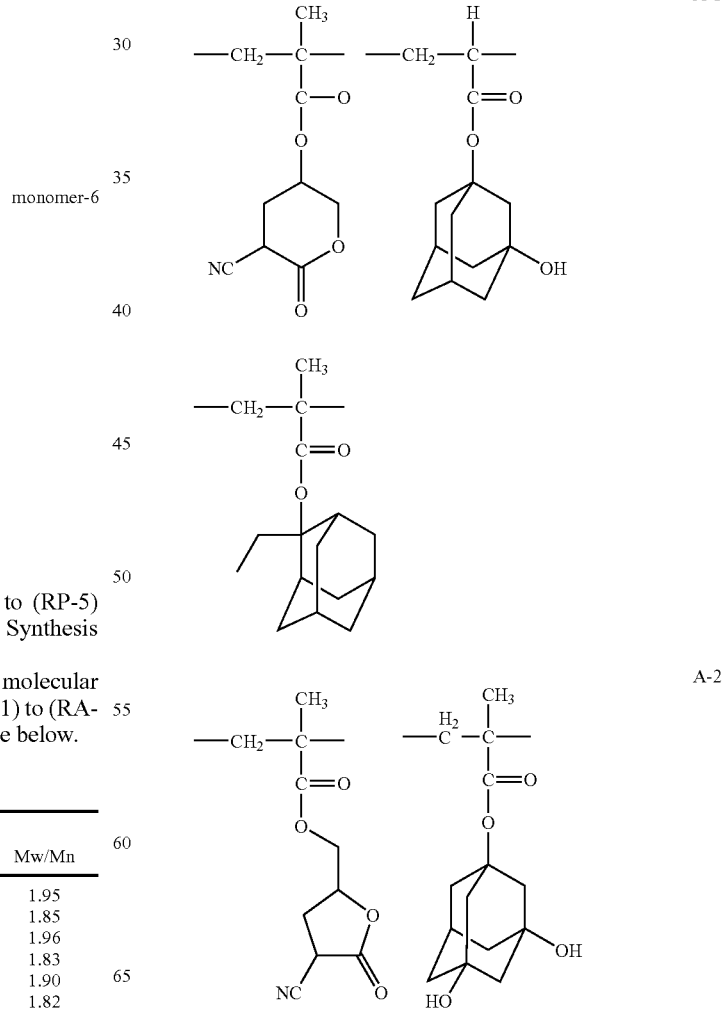

-continued
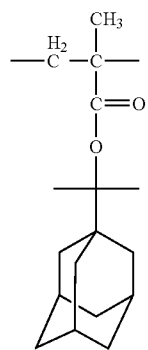
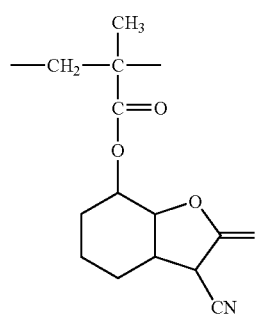
A-3
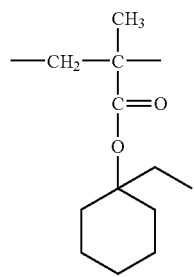
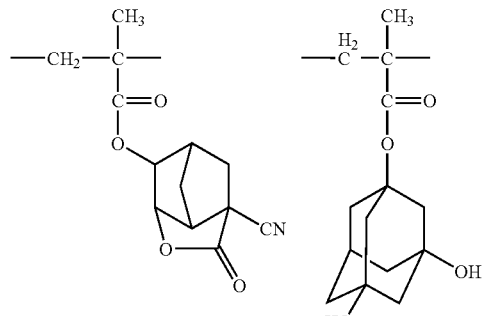
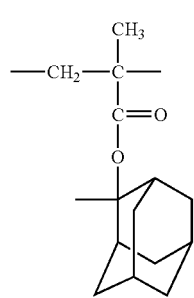
-continued
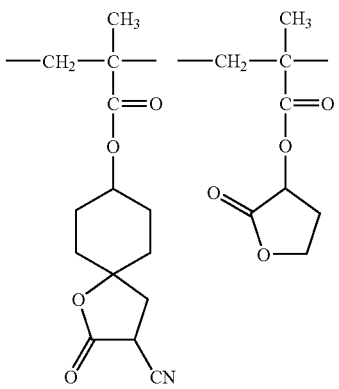
A-5
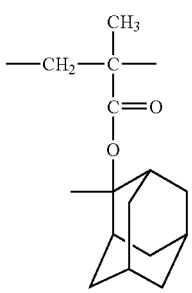
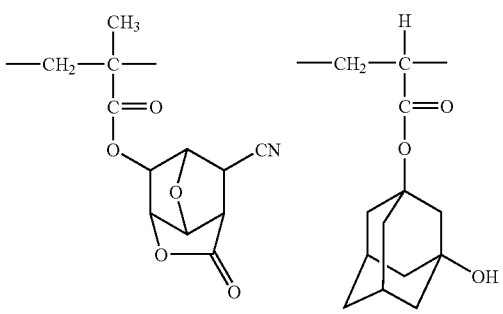
A-6
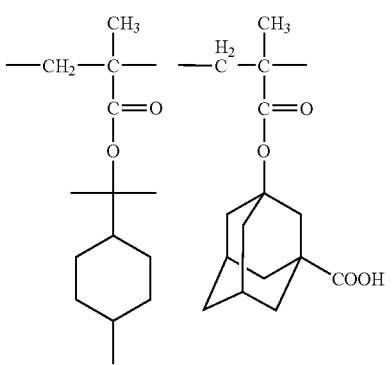

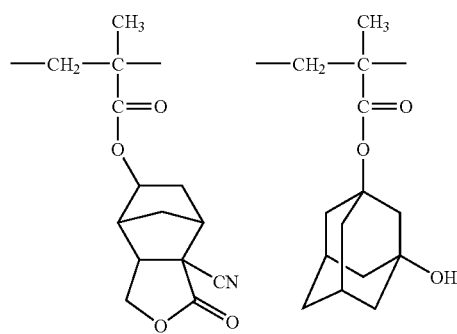
A-7
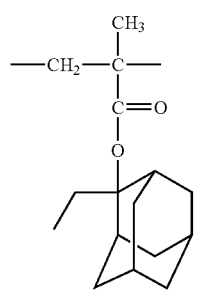
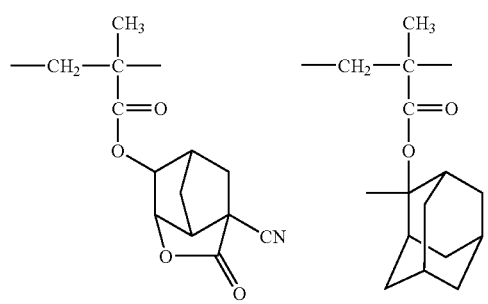
A-8
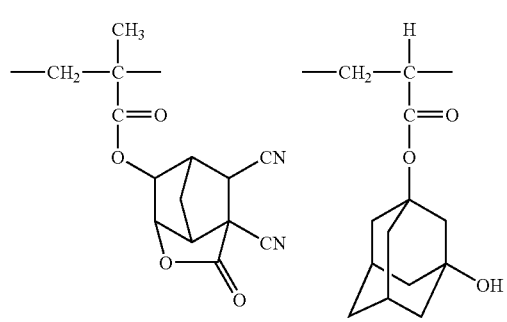
A-9
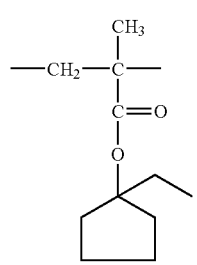
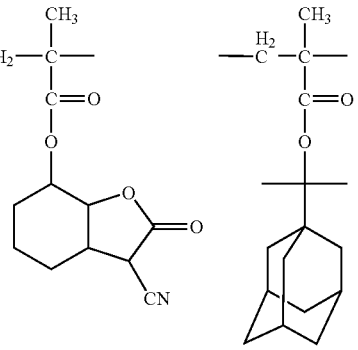
A-10
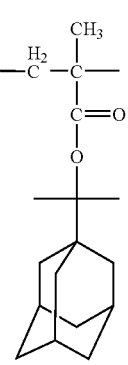
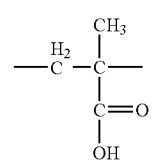
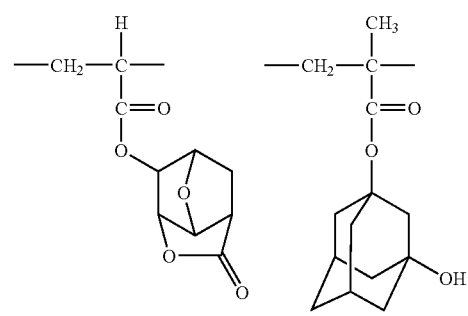
P-1
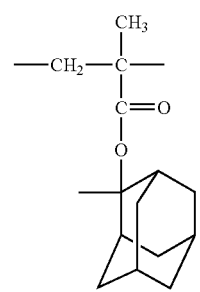
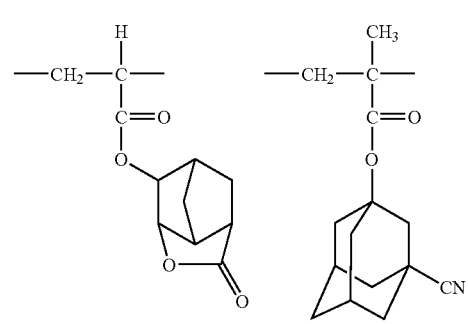
P-2

-continued

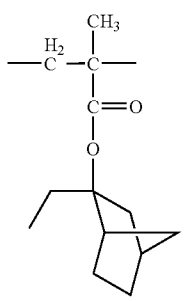

Structure, average molecular weight, degree of dispersion and compositional ratio of the resins (RA-16) to (RA-39) and the resins (RP-4) to (RP-5) are shown in Table 2 below.

TABLE 2

| Resin | Structure | Mw | Mw/Mn | Compositional ratio (Molar ratio) | | |
|---|---|---|---|---|---|---|
| RA-16 | A-11 | 8000 | 1.85 | 40 | 20 | 40 |
| RA-17 | A-12 | 8200 | 1.77 | 50 | 20 | 30 |
| RA-18 | A-13 | 8200 | 1.91 | 40 | 20 | 40 |
| RA-19 | A-14 | 8300 | 1.94 | 40 | 20 | 40 |
| RA-20 | A-15 | 7900 | 1.82 | 45 | 20 | 35 |
| RA-21 | A-16 | 8400 | 1.96 | 50 | 20 | 30 |
| RA-22 | A-17 | 8000 | 1.86 | 40 | 20 | 30 |
| RA-23 | A-18 | 7400 | 1.69 | 50 | 20 | 30 |
| RA-24 | A-19 | 7600 | 1.73 | 50 | 10 | 40 |
| RA-25 | A-20 | 8300 | 1.94 | 45 | 15 | 40 |
| RA-26 | A-21 | 7300 | 1.65 | 55 | 45 | |
| RA-27 | A-22 | 7600 | 1.75 | 40 | 20 | 40 |
| RA-28 | A-12 | 8200 | 1.77 | 50 | 20 | 30 |
| RA-29 | A-12 | 8200 | 1.77 | 50 | 20 | 30 |
| RA-30 | A-12 | 8200 | 1.77 | 50 | 20 | 30 |
| RA-31 | A-12 | 8200 | 1.77 | 50 | 20 | 30 |
| RA-32 | A-12 | 8200 | 1.77 | 50 | 20 | 30 |
| RA-33 | A-12 | 8200 | 1.77 | 50 | 20 | 30 |
| RA-34 | A-12 | 8200 | 1.77 | 50 | 20 | 30 |
| RA-35 | A-12 | 8200 | 1.77 | 50 | 20 | 30 |
| RA-36 | A-12 | 8200 | 1.77 | 50 | 20 | 30 |
| RA-37 | A-12 | 8200 | 1.77 | 50 | 20 | 30 |
| RA-38 | A-12 | 5800 | 1.7 | 50 | 20 | 30 |
| RA-39 | A-12 | 14700 | 2.01 | 50 | 20 | 30 |
| RP-4 | P-3 | 7900 | 1.83 | 50 | 20 | 30 |
| RP-5 | P-4 | 7910 | 1.91 | 40 | 20 | 40 |

The structures (A-11) to (A-22) and (P-3) to (P-4) o the resins in Table 2 are shown below.

A-11

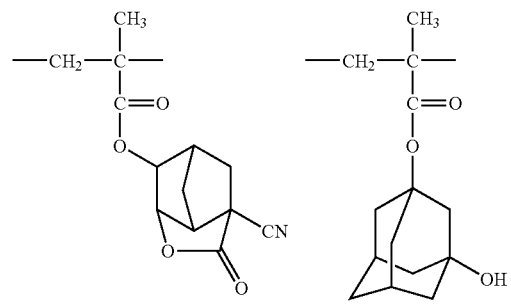

-continued

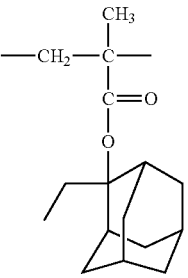

A-12

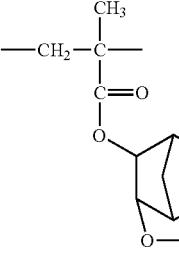

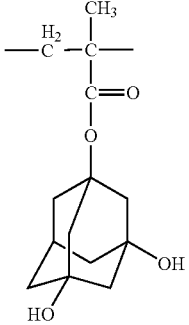

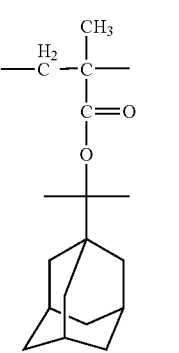

A-13

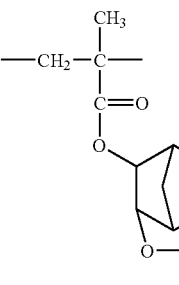

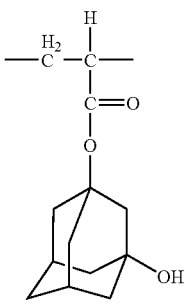

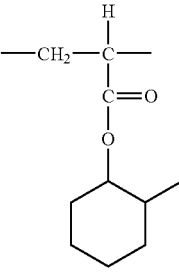

-continued
A-14
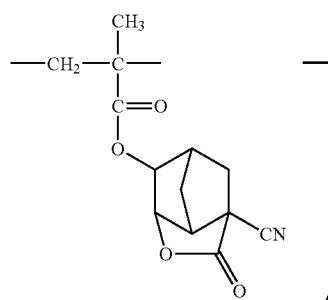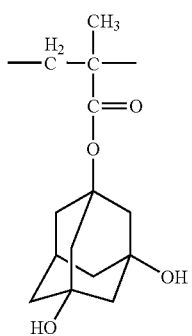
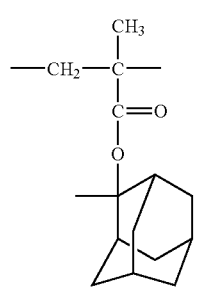
A-15
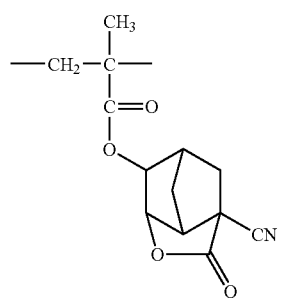
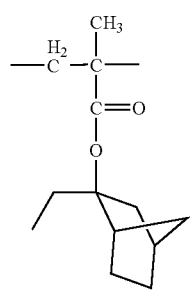
A-16
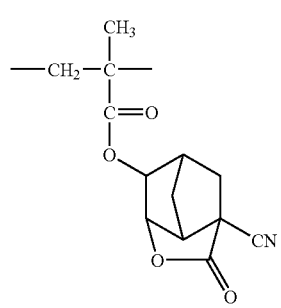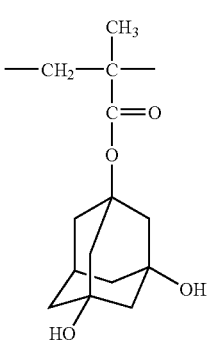
-continued
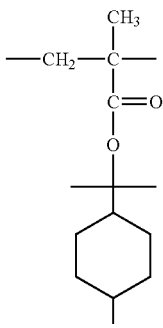
A-17
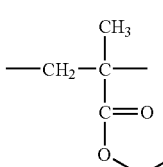
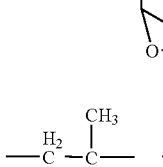
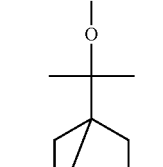
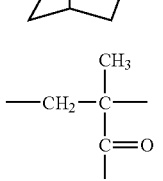
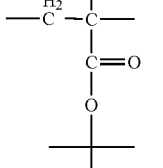
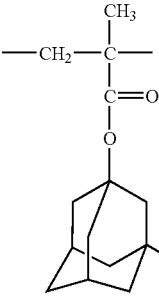
A-18
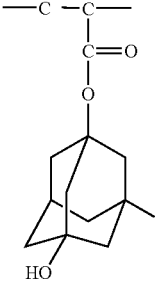

-continued
A-19
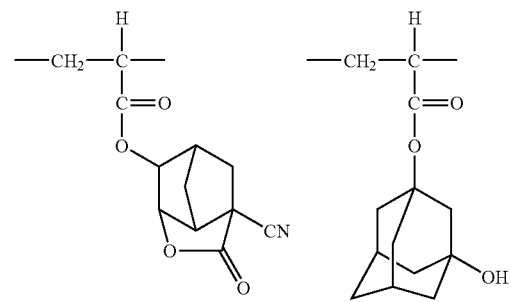
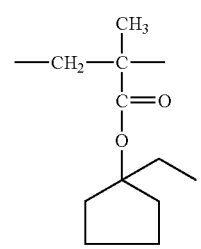
A-20
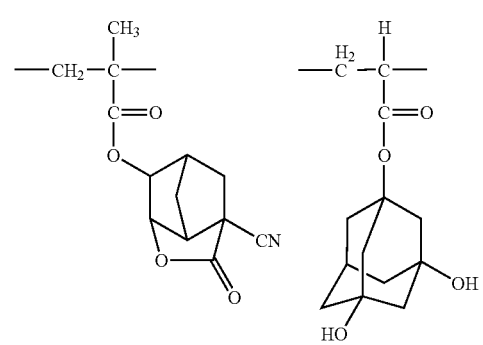
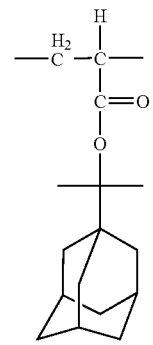
A-21
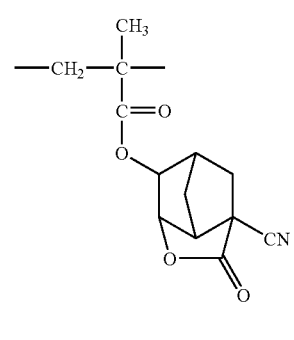
-continued
A-22
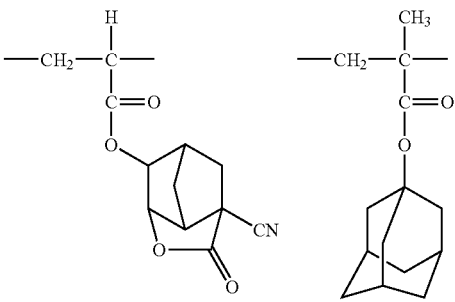
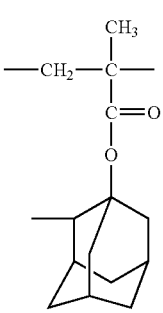
P-3
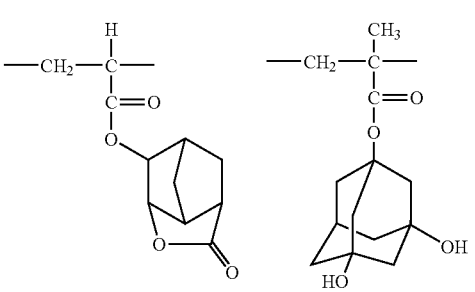
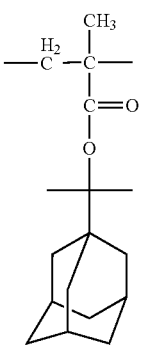
P-4
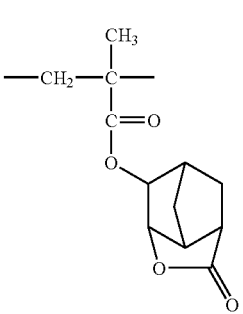

-continued

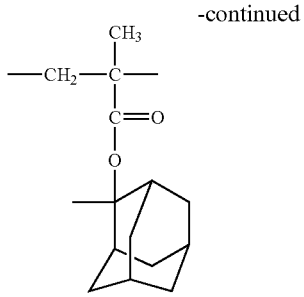

Examples 1 to 12 and Comparative Examples 1 to 2

Resist Preparation

Each solution shown in Table 3 below was prepared, and the solution was filtered with 0.1 μm polytetrafluoroethylene filter or polyethylene filter to prepare a positive resist solution. The positive resist solution prepared was evaluated by the following methods. The results obtained are shown in Table 3.

Resist Evaluation

An organic antireflective film ARC29A (a product of Nissan Chemical Industries, Ltd.) was applied to a silicon wafer, and baked at 205° C. for 60 seconds to form a 78 nm thick antireflective film. The positive resist solution prepared above was applied to the film, and baked at 115° C. for 60 seconds to form a 150 nm thick resist film. The wafer thus obtained was subjected to pattern exposure using ArF excimer laser scanner (a product of ASML Holding, PAS5500/1100, NA 0.75, σo/σi=0.85/0.55). Thereafter, the wafer was heated at 110° C. for 60 seconds, developed with a tetramethylammonium hydroxide aqueous solution (2.38 mass %) for 30 seconds, rinsed with pure water and spin dried to obtain a resist pattern.

Line Edge Roughness (LER):

Regarding a range of edge 5 μm in a longitudinal direction of a line pattern, a distance from a standard line on which an edge should be present was measured at 50 points by using length measurement SEM (a product of Hitachi, Ltd., S-8840), standard deviation was obtained, and 3σ was calculated. The smaller value shows good performance.

Exposure Latitude (EL):

Just after exposure, post-heating was conducted, exposure value that reproduces a mask pattern of line and space having a line width of 80 nm was considered as the optimal exposure value, and exposure value width that a pattern size allows 80 nm±10% when changing the exposure value was obtained. This value was divided by the optimal exposure value to indicate exposure latitude in percentage.

PEB Temperature Dependency:

The exposure value that reproduces line and space 1/1 of a mask size 110 nm when heating at 120° C. for 90 seconds was considered as the optimal exposure value. After conducting exposure with the optimal exposure value, post-heating was conducted at two temperatures of +2° C. and −2° C. (122° C. and 118° C.) to the post-heating temperature. Line and space obtained at each temperature were measured, and their line widths $L_1$ and $L_2$ were obtained. PEB temperature dependency was defined variation of line width per 1° C. of PEB temperature change, and was calculated by the following equation.

PEB Temperature Dependency (nm/° C.)=$|L_1-L_2|/4$

The small value shows that performance change to temperature change is small, which is good.

Pattern Collapse:

Exposure value that reproduces a mask pattern of 110 nm line and space 1:1 was considered as the optimal exposure value, and regarding dense patterns of line and space 1:1, line width that pattern does not collapse in finer mask size when exposing with the optimal exposure value and resolves was considered as the limit pattern collapse line width. The smaller value shows that finer pattern does not fall, and resolves, and that the pattern collapse is difficult to occur.

TABLE 3

| | Composition | | | | | | Evaluation | | | |
|---|---|---|---|---|---|---|---|---|---|---|
| | Resin (mass %) | Acid generator (mass %) | Basic compound (mass %) | Additive (mass %) | Surfactant (mass %) | Solvent (mass %) | LER (nm) | EL (%) | PBR temperature dependency nm/° C. | Pattern collapse (nm) |
| Example 1 | RA-1 (95.8) | PAG-1 (3.0) PAG-3 (0.5) | N-1 (0.25) | | W-1 (0.05) | SL-1 (1140) SL-6 (760) | 4.8 | 19.1 | 3.2 | 57.3 |
| Example 2 | RA-2 (96.2) | PAG-2 (2.5) | N-2 (0.30) | AD-1 (0.5) | W-2 (0.05) | SL-1 (1354) SL-5 (531) SL-8 (15) | 4.8 | 19.5 | 3.1 | 54.5 |
| Example 3 | RA-3 (94.8) | PAG-7 (4.0) | N-5 (0.25) | AD-1 (0.5) | W-2 (0.05) | SL-1 (1354) SL-5 (531) SL-8 (15) | 4.7 | 20.1 | 2.8 | 53.0 |
| Example 4 | RA-4 (94.9) | PAG-3 (2.3) PAG-7 (1.5) | N-3 (0.30) | AD-3 (0.5) | W-2 (0.05) | SL-1 (1369) SL-4 (531) | 4.6 | 20.1 | 2.7 | 51.5 |
| Example 5 | RA-5 (65.0) RP-3 (30.0) | PAG-3 (2.5) PAG-8 (1.5) | N-5 (0.30) | AD-1 (0.2) | W-2 (0.05) | SL-1 (1389) SL-4 (531) | 4.7 | 20.4 | 2.8 | 54.0 |
| Example 6 | RA-6 (94.8) | PAG-4 (4.7) | | | W-1 (0.05) | SL-1 (1656) SL-6 (244) | 5.2 | 19.5 | 3.0 | 55.1 |
| Example 7 | RA-7 (64.3) RA-13 (30.0) | PAG-1 (3.5) PAG-5 (0.2) | N-2 (0.40) N-1 (0.10) | | W-1 (0.05) | SL-1 (1641) SL-6 (244) SL-8 (15) | 4.8 | 20.4 | 2.7 | 52.5 |
| Example 8 | RA-8 (94.2) | PAG-5 (4.5) | N-7 (0.15) | AD-2 (0.7) | W-4 (0.05) | SL-1 (1438) SL-6 (442) SL-7 (20) | 4.8 | 19.0 | 3.4 | 55.2 |
| Example 9 | RA-9 (95.5) | PAG-2 (2.5) PAG-5 (0.1) | N-6 (0.25) N-3 (0.15) | AD-1 (0.1) | W-2 (0.05) | SL-1 (1369) SL-4 (531) | 4.6 | 22.7 | 2.9 | 52.0 |

TABLE 3-continued

| | Composition | | | | | | Evaluation | | | |
|---|---|---|---|---|---|---|---|---|---|---|
| | Resin (mass %) | Acid generator (mass %) | Basic compound (mass %) | Additive (mass %) | Surfactant (mass %) | Solvent (mass %) | LER (nm) | EL (%) | PBR temperature dependency nm/° C. | Pattern collapse (nm) |
| Example 10 | RA-10 (42.4) RA-14 (50.0) | PAG-6 (6.0) | N-3 (0.50) N-1 (0.15) | | W-4 (1.00) | SL-1 (1369) SL-6 (531) | 4.6 | 21.5 | 2.7 | 51.2 |
| Example 11 | RA-11 (70.4) RA-15 (25.0) | PAG 2 (2.0) | N-1 (0.10) | AD-1 (1.5) | W-2 (1.00) | SL-2 (1369) SL-6 (531) | 4.6 | 21.5 | 2.7 | 51.8 |
| Example 12 | RA-12 (92.9) | PAG-2 (3.5) PAG-6 (2.0) | N-3 (0.40) N-6 (0.25) | | W-4 (1.00) | SL-3 (1765) SL-7 (135) | 4.7 | 21.7 | 2.8 | 52.8 |
| Comparative Example 1 | RP-1 (94.5) | PAG-1 (4.5) | N-8 (0.40) | | W-2 (0.05) | SL-1 (1420) SL-4 (480) | 5.3 | 18.4 | 4.5 | 65.2 |
| Comparative Example 2 | RP-2 (90.5) | PAG-1 (5.0) PAG-2 (0.5) | N-3 (0.40) N-1 (0.10) | AD-1 (3.0) | W-2 (0.05) | SL-1 (1550) SL-5 (350) | 5.3 | 19.0 | 4.1 | 59.1 |

The abbreviations in Table 3 are shown below.

[Acid Generator]

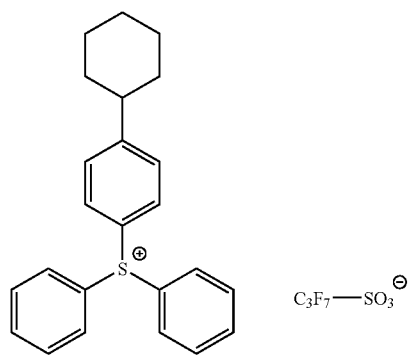

PAG-1

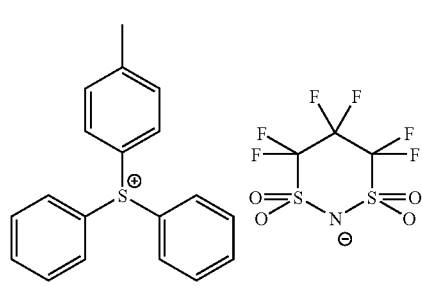

PAG-2

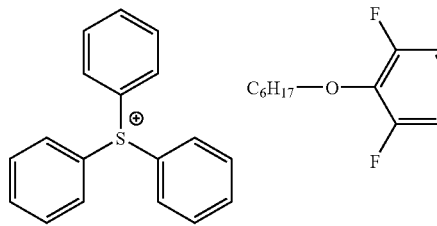

PAG-3

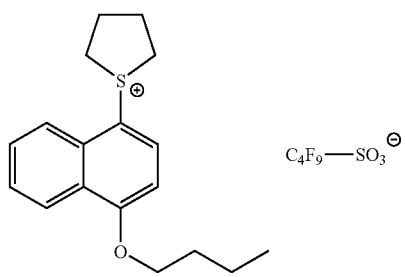

PAG-4

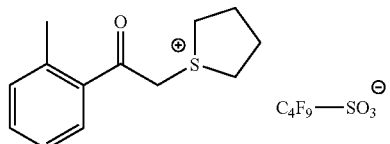

PAG-5

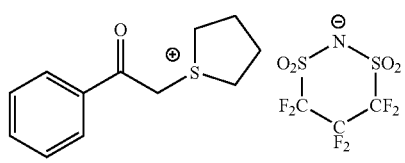

PAG-6

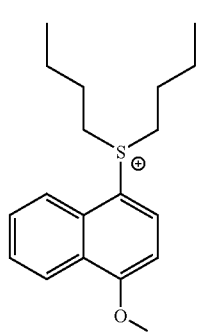

PAG-7

PAG-8

-continued

PAG-9
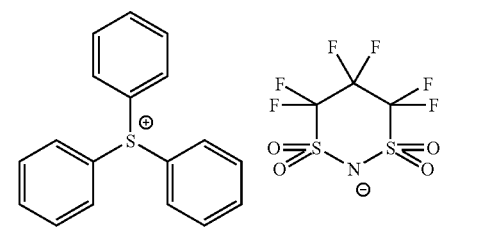

PAG-10
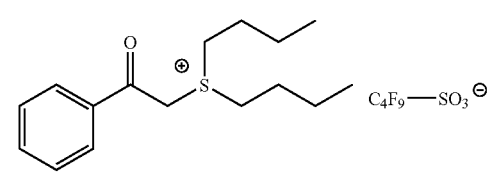

PAG-11
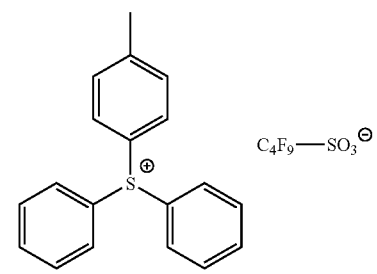

PAG-12
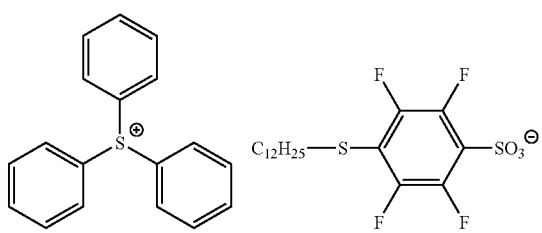

PAG-13
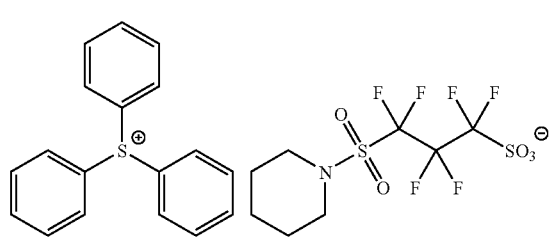

[Basic Compound]
  N-1: N,N-Dibutylaniline
  N-2: Trioctylamine
  N-3: N,N-Dihydroethylaniline
  N-4: 2,4,5-Triphenylimidazole
  N-5: 2,6-Diisopropylaniline
  N-6: Hydroxyantipyrine
  N-7: Trismethoxymethoxyethylamine
  N-8: Triethanolamine
  N-9: 2-Phenylbenzimidazole

[Additive]

AD-1
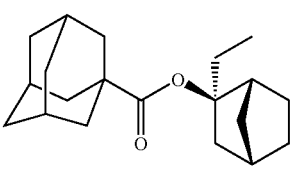

AD-2
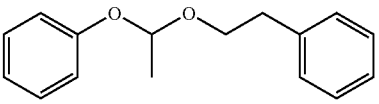

AD-3
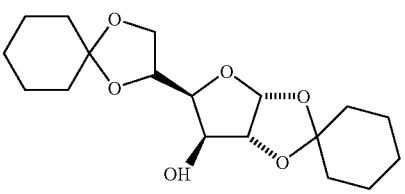

AD-4
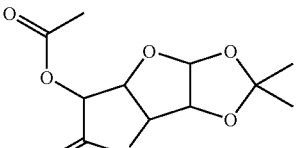

AD-5
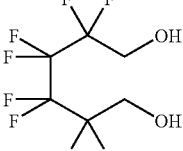

AD-6
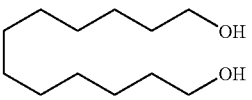

[Surfactant]
  W-1: Megafac F176 (a product of Dainippon Ink and Chemicals, Incorporated) (fluorine series)
  W-2: Megafac R08 (a product of Dainippon Ink and Chemicals, Incorporated) (fluorine and silicon series)
  W-3: Polysiloxane polymer KP-341 (a product of Shin-Etsu Chemical Co.) (silicon series)
  W-4: Troy Sol S-366 (a product of Troy Chemical Industries)
  W-5: KH-20 (a product of Asahi Kasei Corporation)
  W-6: PF6320 (a product of OMNOVA)

[Solvent]
  SL-1: Propylene glycol monomethyl ether acetate
  SL-2: Propylene glycol monomethyl ether propionate
  SL-3: 2-Heptanone
  SL-4: Ethyl lactate
  SL-5: Propylene glycol monomethyl ether
  SL-6: Cyclohexanone
  SL-7: γ-Butyrolactone
  SL-8: Propylene carbonate It is apparent from Table 3 that the positive resist composition of the present invention is good in line edge roughness (LER), exposure latitude (EL), PEB temperature dependency and pattern collapse.

Examples 13 to 36 and Comparative Examples 3 to 4

Resist Preparation

Each solution shown in Table 4 below was prepared, and the solution was filtered with 0.1 μm polyethylene filter to prepare a positive resist solution. The solution thus prepared was evaluated by the following method. The results obtained are shown in Table 4 below.

Resist Evaluation

An organic antireflective film ARC29A (a product of Nissan Chemical Industries, Ltd.) was applied to a silicon wafer, and baked at 205° C. for 60 seconds to form a 78 nm thick antireflective film. The positive resist solution prepared above was applied to the film, and baked at 120° C. for 60 seconds to form a 200 nm thick resist film. The wafer thus obtained was subjected to pattern exposure using ArF excimer laser scanner (a product of ASML Holding, PAS5500/1100, NA 0.75, σo/σi=0.85/0.55). Thereafter, the wafer was heated at 120° C. for 60 seconds, developed with a tetramethylammonium hydroxide aqueous solution (2.38 mass %) for 30 seconds, rinsed with pure water and spin dried to form a resist pattern. Line edge roughness (LER), exposure latitude (EL), PEB temperature dependency and pattern collapse were evaluated in the same manners as in Example 1.

TABLE 4

| | Resin | | Acid generator 1 | | Acid generator 2 | | Basic compound 1 | | Basic compound 2 | | Additive | |
|---|---|---|---|---|---|---|---|---|---|---|---|---|
| | Resin No. | Mass part | Compound No. | Mass part | Compound No. | Mass part | Compound No | Mass part | Compound No | Mass part | Compound No | Mass part |
| Example 13 | RA-16 | 95.4 | PAG-11 | 4 | | | N-5 | 0.2 | N-3 | 0.2 | | |
| Example 14 | RA-17 | 95.2 | PAG-11 | 4 | | | N-5 | 0.2 | N-3 | 0.2 | | |
| Example 15 | RA-18 | 95.3 | PAG-11 | 2 | PAG-10 | 2 | N-5 | 0.2 | N-3 | 0.2 | | |
| Example 16 | RA-19 | 95.2 | PAG-11 | 2 | PAG-12 | 2 | N-5 | 0.2 | N-3 | 0.2 | | |
| Example 17 | RA-20 | 95.2 | PAG-11 | 2 | PAG-13 | 2 | N-5 | 0.2 | N-3 | 0.2 | | |
| Example 18 | RA-21 | 95.2 | PAG-11 | 4 | | | N-5 | 0.2 | N-3 | 0.2 | | |
| Example 19 | RA-22 | 95.2 | PAG-11 | 4 | | | N-5 | 0.2 | N-3 | 0.2 | | |
| Example 20 | RA-23 | 95.5 | PAG-11 | 4 | | | N-5 | 0.2 | N-3 | 0.2 | | |
| Example 21 | RA-24 | 95.5 | PAG-11 | 4 | | | N-5 | 0.2 | N-3 | 0.2 | | |
| Example 22 | RA-25 | 95.5 | PAG-11 | 4 | | | N-5 | 0.2 | N-3 | 0.2 | | |
| Example 23 | RA-26 | 95.3 | PAG-11 | 4 | | | N-5 | 0.2 | N-3 | 0.2 | | |
| Example 24 | RA-27 | 95.3 | PAG-11 | 4 | | | N-5 | 0.2 | N-3 | 0.2 | | |
| Example 25 | RA-28 | 95.2 | PAG-9 | 4 | | | N-5 | 0.2 | N-3 | 0.2 | | |
| Example 26 | RA-29 | 95.2 | PAG-9 | 4 | | | N-5 | 0.2 | N-3 | 0.2 | | |
| Example 27 | RA-30 | 94.9 | PAG-9 | 1 | PAG-10 | 3.5 | N-5 | 0.1 | N-3 | 0.1 | | |
| Example 28 | RA-31 | 94.2 | PAG-9 | 3 | PAG-11 | 1 | N-5 | 0.2 | N-3 | 0.2 | AD-5 | 1 |
| Example 29 | RA-32 | 94.2 | PAG-9 | 3 | PAG-12 | 1 | N-5 | 0.2 | N-3 | 0.2 | AD-6 | 1 |
| Example 30 | RA-33 | 95.2 | PAG-9 | 3 | PAG-13 | 1 | N-5 | 0.2 | N-3 | 0.2 | | |
| Example 31 | RA-34 | 95.1 | PAG-9 | 3 | PAG-11 | 1 | N-8 | 0.45 | | | | |
| Example 32 | RA-35 | 94.1 | PAG-9 | 4 | | | N-8 | 0.45 | | | AD-4 | 1 |
| Example 33 | RA-36 | 95.1 | PAG-9 | 2 | PAG-10 | 2 | N-9 | 0.45 | | | | |
| Example 34 | RA-37 | 95.2 | PAG-9 | 3 | PAG-11 | 1 | N-9 | 0.4 | | | | |
| Example 35 | RA-38 | 95.2 | PAG-11 | 4 | | | N-9 | 0.4 | | | | |
| Example 36 | RA-39 | 95.2 | PAG-11 | 4 | | | N-9 | 0.4 | | | | |
| Comparative Example 3 | RP-4 | 95.5 | PAG-11 | 4 | | | N-5 | 0.2 | N-3 | 0.2 | | |
| Comparative Example 4 | RP-5 | 95.5 | PAG-11 | 4 | | | N-5 | 0.2 | N-3 | 0.2 | | |

| | Surfactant | | Solvent | | | | Evaluation | | | |
|---|---|---|---|---|---|---|---|---|---|---|
| | | | | | | | LER | EL | PEB temperature dependency | Pattern collapse |
| | Compound No. | Mass part | Solvent 1 | Mass part | Solvent 2 | Mass part | (nm) | (%) | nm/° C. | nm |
| Example 13 | W-6 | 0.15 | SL-1 | 863 | SL-5 | 575 | 4.8 | 20 | 3 | 50 |
| Example 14 | W-6 | 0.45 | SL-1 | 863 | SL-5 | 575 | 4.8 | 19.5 | 3.1 | 47 |
| Example 15 | W-6 | 0.3 | SL-1 | 863 | SL-5 | 575 | 4.7 | 18.2 | 3.3 | 53 |
| Example 16 | W-6 | 0.45 | SL-1 | 863 | SL-5 | 575 | 5.4 | 21.1 | 3 | 50 |
| Example 17 | W-6 | 0.45 | SL-1 | 863 | SL-5 | 575 | 4.5 | 19.1 | 2.8 | 54 |
| Example 18 | W-6 | 0.45 | SL-1 | 863 | SL-5 | 575 | 4.4 | 22 | 3.2 | 50 |
| Example 19 | W-6 | 0.45 | SL-1 | 863 | SL-5 | 575 | 4.4 | 20.4 | 2.2 | 52.5 |
| Example 20 | W-6 | 0.15 | SL-1 | 863 | SL-5 | 575 | 4.9 | 18.5 | 3.1 | 48 |
| Example 21 | W-6 | 0.15 | SL-1 | 863 | SL-5 | 575 | 4.4 | 18.1 | 3.4 | 52 |
| Example 22 | W-6 | 0.15 | SL-1 | 863 | SL-5 | 575 | 4.7 | 19.2 | 3.1 | 51.2 |
| Example 23 | W-6 | 0.3 | SL-2 | 863 | SL-5 | 575 | 5.1 | 16.4 | 3.7 | 55.2 |
| Example 24 | W-6 | 0.3 | SL-3 | 863 | SL-5 | 575 | 5.1 | 16.9 | 3.6 | 56.7 |
| Example 25 | W-6 | 0.45 | SL-1 | 863 | SL-5 | 575 | 5.1 | 23 | 2.9 | 50 |
| Example 26 | W-4 | 0.45 | SL-1 | 863 | SL-5 | 575 | 5.2 | 23 | 2.9 | 50.5 |
| Example 27 | W-4 | 0.45 | SL-1 | 863 | SL-5 | 575 | 4.7 | 21.5 | 3 | 52.5 |
| Example 28 | W-4 | 0.45 | SL-1 | 863 | SL-5 | 575 | 4.9 | 21.5 | 3 | 47 |
| Example 29 | W-4 | 0.45 | SL-1 | 863 | SL-5 | 575 | 5.1 | 20.5 | 3.5 | 45 |
| Example 30 | W-4 | 0.45 | SL-1 | 863 | SL-5 | 575 | 5 | 23 | 3 | 50.5 |
| Example 31 | W-4 | 0.45 | SL-1 | 863 | SL-5 | 575 | 4.8 | 23.5 | 2.9 | 50 |
| Example 32 | W-4 | 0.45 | SL-1 | 863 | SL-5 | 575 | 5 | 22 | 3 | 49 |

TABLE 4-continued

| | | | | | | | | | | |
|---|---|---|---|---|---|---|---|---|---|---|
| Example 33 | W-4 | 0.45 | SL-1 | 863 | SL-5 | 575 | 4.9 | 21.5 | 3 | 49 |
| Example 34 | W-4 | 0.45 | SL-1 | 863 | SL-5 | 575 | 4.7 | 22.5 | 2.8 | 48.5 |
| Example 35 | W-4 | 0.45 | SL-1 | 863 | SL-5 | 575 | 4.8 | 17.8 | 3.4 | 50 |
| Example 36 | W-4 | 0.45 | SL-1 | 863 | SL-5 | 575 | 5.4 | 21.1 | 3 | 49 |
| Comparative Example 3 | W-6 | 0.15 | SL-1 | 863 | SL-5 | 575 | 7.8 | 14.5 | 4.5 | 60.1 |
| Comparative Example 4 | W-6 | 0.15 | SL-1 | 863 | SL-5 | 575 | 8.1 | 16 | 4.1 | 65.2 |

It is apparent from Table 4 that the positive resist composition of the present invention are good in line edge roughness (LER), exposure latitude (EL), PEB temperature dependency and pattern collapse.

[Liquid Immersion Exposure Evaluation]

Resist Preparation

The respective components of Examples 1 to 36 shown in Tables 3 to 4 were dissolved in a solvent to prepare each solution. The solution was filtered with a 0.1 µm polyethylene filter to prepare a positive resist solution. The positive resist solution thus prepared was evaluation by the following method.

Resolution Evaluation

An organic antireflective film ARC29A (a product of Nissan Chemical Industries, Ltd.) was applied to a silicon wafer, and baked at 205° C. for 60 seconds to form a 78 nm antireflective film. The positive resist solution prepared above was applied to the antireflective film, and baked at 120° C. for 60 seconds to form a 150 nm resist film. The wafer thus obtained was subjected to two-beam interference exposure (wet exposure) using pure water as an immersion liquid. In the two-beam interference exposure (wet), a laser 1, an aperture 2, a shutter 3, three reflection mirrors 4, 5 and 6, and a condenser lens 7 were used as shown in FIG. 1, and a wafer 10 having an antireflective film and a resist film was exposed through an immersion liquid (pure water) 1. The laser 1 used had a wavelength of 193 nm, and a prism that forms 65 nm line and space pattern 8 was used. Just after exposure, the wafer was heated at 120° C. for 60 seconds, developed with a tetramethylammonium hydroxide aqueous solution (2.38 mass %) for 60 seconds, rinsed with pure water, and spin dried to obtain a resist pattern. The resist pattern thus obtained was observed using a scanning electron microscope (S-9260, a product of Hitachi, Ltd.). As a result, 65 nm line and space pattern was resolved.

The compositions of Examples 1 to 36 had good image formability even in an exposure method through an immersion liquid.

Further, an organic antireflective film ARC29A (a product of Nissan Chemical Industries, Ltd.) was applied to a silicon wafer, and baked at 205° C. for 60 seconds to form a 78 nm antireflective film. The positive resist solution prepared above was applied to the antireflective film, and baked at 120° C. for 90 seconds to form a 250 nm resist film. The wafer thus obtained was subjected to pattern exposure using ArF excimer laser liquid immersion scanner (NA 0.85). Ultrapure water having impurity of 5 ppb or less was used as an immersion liquid. Thereafter, the wafer was heated at 120° C. for 60 seconds, developed with a tetramethylammonium hydroxide aqueous solution (2.38 mass %) for 30 seconds, rinsed with pure water, and spin dried to obtain a resist pattern.

The positive resist composition of the present invention could obtain good results similar to the general exposure even in a liquid immersion exposure.

By the present invention, there can be provided a positive resist composition that enables line edge roughness (LER), exposure latitude (EL), PEB temperature dependency and pattern collapse to achieve together in high dimension, and a pattern formation method using the positive resist composition.

The entire disclosure of each and every foreign patent application from which the benefit of foreign priority has been claimed in the present application is incorporated herein by reference, as if fully set forth.

What is claimed is:

1. A positive resist composition comprising:
   (A) a resin that contains a repeating unit (A1) having a lactone structure and a cyano group directly attached to the lactone structure, and increases its solubility to an alkali developer by action of an acid;
   (B) a compound that generates an acid by irradiation with actinic ray or radiation; and
   (C) a solvent,
   wherein the repeating unit (A1) is a repeating unit having a structure represented by general formula (A2) in any of a main chain and a side chain of the repeating unit (A1),

(A2)

wherein $R_1$ to $R_6$ each independently represents a hydrogen atom or a substituent, provided that at least one of $R_1$ to $R_6$ represents a cyano group, and at least two of $R_1$ to $R_6$ may be bonded with each other to form a ring structure, the structure represented by general formula (A2) being in any of a main chain and a side chain of the repeating unit (A1) using at least one of the positions that can be a hydrogen atom as $R_1$ to $R_6$ or a hydrogen atom in the substituents as $R_1$ to $R_6$ as a bond; and wherein resin (A), (1) contains a repeating unit having an alicyclic hydrocarbon structure substituted with a polar group, (2) does not contain a silicon atom, and (3) does not contain an aromatic group.

2. A pattern formation method comprising:
   forming a resist film by the positive resist composition as claimed in claim 1; and
   exposing and developing the resist film.

3. The positive resist composition as claimed in claim 1, wherein the resin further comprises an acid decomposable repeating unit having a mono- or polyalicyclic hydrocarbon structure.

4. The positive resist composition as claimed in claim 1, wherein the solvent is a mixed solvent comprising two or more solvents having different functional groups.

5. A positive resist composition comprising:
(A) a resin that contains a repeating unit (A1) having a lactone structure and a cyano group directly attached to the lactone structure, and increases its solubility to an alkali developer by action of an acid;
(B) a compound that generates an acid by irradiation with actinic ray or radiation; and
(C) a solvent,
wherein the repeating unit (A1) is a repeating unit having a structure represented by general formula (A6) in any of a main chain and a side chain of the repeating unit (A1),

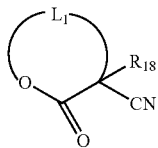

(A6)

wherein $R_{18}$ represents a hydrogen atom or a substituent, $L_1$ represents a linking group that connects a carbon atom at a 2-position of the lactone ring and an oxygen atom of the lactone ring to form a lactone ring structure, and $R_{18}$ and $L_1$ may be bonded with each other to form a ring structure, the structure represented by general formula (A6) being in any of a main chain and a side chain of the repeating unit (A1) using at least one of the positions that can be a hydrogen atom as $R_{18}$ or a hydrogen atom in the substituents as $L_1$ as a bond; and wherein resin (A), (1) contains a repeating unit having an alicyclic hydrocarbon structure substituted with a polar group, (2) does not contain a silicon atom, and (3) does not contain an aromatic group.

6. A pattern formation method comprising:
forming a resist film by the positive resist composition as claimed in claim 5; and
exposing and developing the resist film.

7. The positive resist composition as claimed in claim 5, wherein the resin further comprises an acid decomposable repeating unit having a mono- or polyalicyclic hydrocarbon structure.

8. The positive resist composition as claimed in claim 5, wherein the solvent is a mixed solvent comprising two or more solvents having different functional groups.

9. A positive resist composition comprising:
(A) a resin that contains a repeating unit (A1) having a lactone structure and a cyano group directly attached to the lactone structure, and increases its solubility to an alkali developer by action of an acid;
(B) a compound that generates an acid by irradiation with actinic ray or radiation; and
(C) a solvent,
wherein the repeating unit (A1) is a repeating unit having a structure represented by general formula (A3) in any of a main chain and a side chain of the repeating unit (A1),

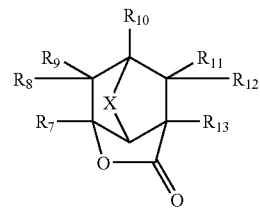

(A3)

wherein $R_7$ to $R_{13}$ each independently represents a hydrogen atom or a substituent and at least two of $R_7$ to $R_{13}$ may be bonded to each other to form a ring structure; X represents —O—, —S—, —N($R^N$)$_2$, or —(CH$_2$)—, wherein $R^N$ represents a hydrogen atom or a substituent; and at least one of $R_7$ to $R_{13}$ represents a cyano group, the structure represented by general formula (A3) being in any of a main chain and a side chain of the repeating unit (A1) using at least one of the positions that can be a hydrogen atom as $R_7$ to $R_{13}$ or a hydrogen atom in the substituents as X as a bond; and wherein resin (A), (1) contains a repeating unit having an alicyclic hydrocarbon structure substituted with a polar group, (2) does not contain a silicon atom, and (3) does not contain an aromatic group.

10. A pattern formation method comprising:
forming a resist film by the positive resist composition as claimed in claim 9; and
exposing and developing the resist film.

11. The positive resist composition as claimed in claim 9, wherein the resin further comprises an acid decomposable repeating unit having a mono- or polyalicyclic hydrocarbon structure.

12. The positive resist composition as claimed in claim 9, wherein the solvent is a mixed solvent comprising two or more solvents having different functional groups.

* * * * *